(12) United States Patent
Peng et al.

(10) Patent No.: US 12,067,341 B2
(45) Date of Patent: Aug. 20, 2024

(54) SEMICONDUCTOR STRUCTURE, DEVICE, AND METHOD

(71) Applicant: TAIWAN SEMICONDUCTOR MANUFACTURING COMPANY, LTD., Hsinchu (TW)

(72) Inventors: Shih-Wei Peng, Hsinchu (TW); Jiann-Tyng Tzeng, Hsinchu (TW); Wei-Cheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/358,223

(22) Filed: Jul. 25, 2023

(65) Prior Publication Data

US 2023/0367950 A1     Nov. 16, 2023

Related U.S. Application Data

(63) Continuation of application No. 17/227,780, filed on Apr. 12, 2021, now Pat. No. 11,720,737, which is a
(Continued)

(51) Int. Cl.
*G06F 7/50* (2006.01)
*G03F 1/36* (2012.01)
(Continued)

(52) U.S. Cl.
CPC .............. *G06F 30/398* (2020.01); *G03F 1/36* (2013.01); *G03F 1/70* (2013.01); *G09G 3/3208* (2013.01);
(Continued)

(58) Field of Classification Search
USPC .......................................... 716/110, 118, 119
See application file for complete search history.

(56) References Cited

U.S. PATENT DOCUMENTS 7,260,442 B2   8/2007   Hwang et al.
9,256,709 B2   2/2016   Yu et al.
(Continued)

FOREIGN PATENT DOCUMENTS

KR   20160022881 A   3/2016
KR   20160102777 A   8/2016
KR   20180081262 A   7/2018

OTHER PUBLICATIONS

Notice of Allowance dated Aug. 29, 2020 from corresponding application No. KR 10-2019-0120093, pp. 1-6.

*Primary Examiner* — Brian Ngo
(74) *Attorney, Agent, or Firm* — Hauptman Ham, LLP

(57) ABSTRACT

A complementary field effect transistor (CFET) structure includes a vertical stack of first and second transistors, wherein the first transistor includes a first channel extending in a first direction from a first source/drain (S/D) region to a second S/D region through a gate extending in a second direction perpendicular to the first direction and the second transistor includes a second channel extending in the first direction from a third S/D region to a fourth S/D region through the gate. A first conductive trace extends in the first direction over the gate, a first via extends from the first S/D region to the first conductive trace and is aligned with the third S/D region along the second direction, a second via extends from the fourth S/D region to the first conductive trace, and the first via has a first height greater than a second height of the second via.

20 Claims, 66 Drawing Sheets

Related U.S. Application Data continuation of application No. 16/571,809, filed on Sep. 16, 2019, now Pat. No. 10,977,417.

(60) Provisional application No. 62/738,973, filed on Sep. 28, 2018.

(51) Int. Cl.

| | | |
|---|---|---|
| *G03F 1/70* | (2012.01) | |
| *G06F 30/398* | (2020.01) | |
| *G09G 3/3208* | (2016.01) | |
| *H10K 59/131* | (2023.01) | |
| *H10K 59/35* | (2023.01) | |
| *H01L 27/118* | (2006.01) | |
| *H01L 27/12* | (2006.01) | |

(52) U.S. Cl.
CPC ......... *H10K 59/131* (2023.02); *H10K 59/353* (2023.02); *H01L 2027/11881* (2013.01); *H01L 27/1248* (2013.01)

(56) References Cited

U.S. PATENT DOCUMENTS

| | | | |
|---|---|---|---|
| 2006/0289945 A1* | 12/2006 | Nii | G11C 11/412 257/E27.099 |
| 2011/0157965 A1* | 6/2011 | Nii | G11C 11/4125 365/156 |
| 2012/0262978 A1* | 10/2012 | Takahashi | H10B 12/50 365/72 |
| 2013/0135921 A1* | 5/2013 | Owada | G11C 11/21 365/148 |
| 2014/0040838 A1 | 2/2014 | Liu et al. | |
| 2015/0278429 A1 | 10/2015 | Chang | |
| 2016/0086947 A1 | 3/2016 | Park et al. | |
| 2016/0117431 A1 | 4/2016 | Kim et al. | |
| 2016/0293608 A1 | 10/2016 | Yoon | |
| 2017/0194331 A1 | 7/2017 | Liaw | |
| 2017/0256298 A1 | 9/2017 | Sato | |
| 2019/0198529 A1 | 6/2019 | Yadoguchi et al. | |
| 2020/0020700 A1 | 1/2020 | Lin et al. | |
| 2020/0143876 A1 | 5/2020 | Nakamura et al. | |
| 2020/0328201 A1 | 10/2020 | Li et al. | |
| 2020/0328210 A1 | 10/2020 | Wu et al. | |

* cited by examiner

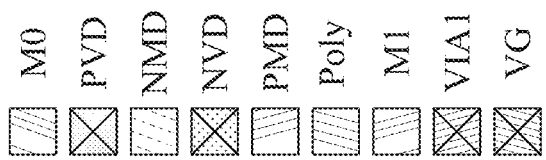
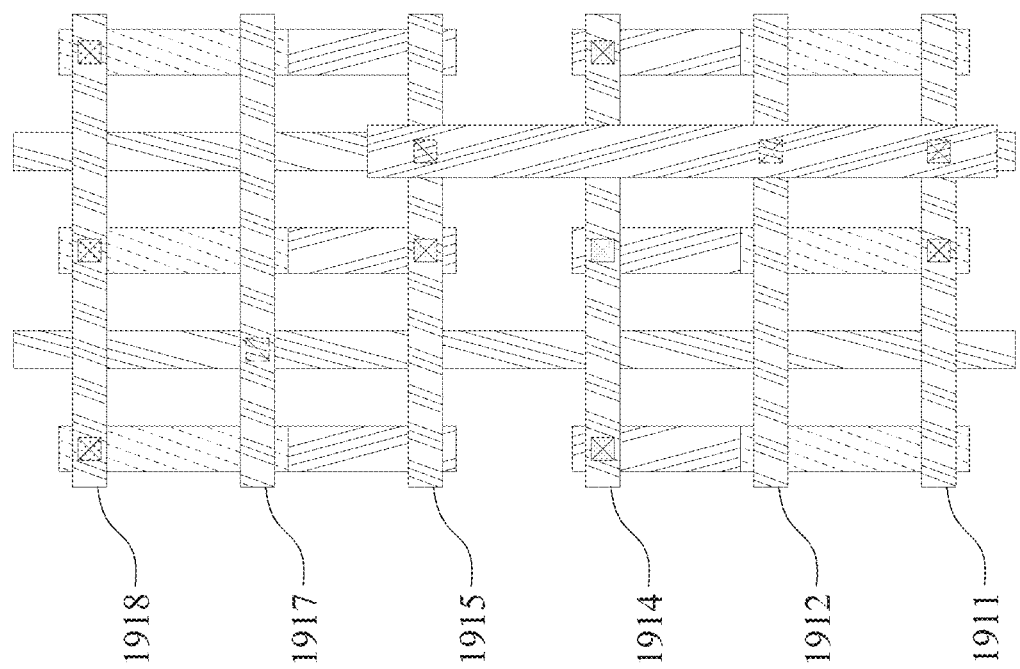
Fig. 19B

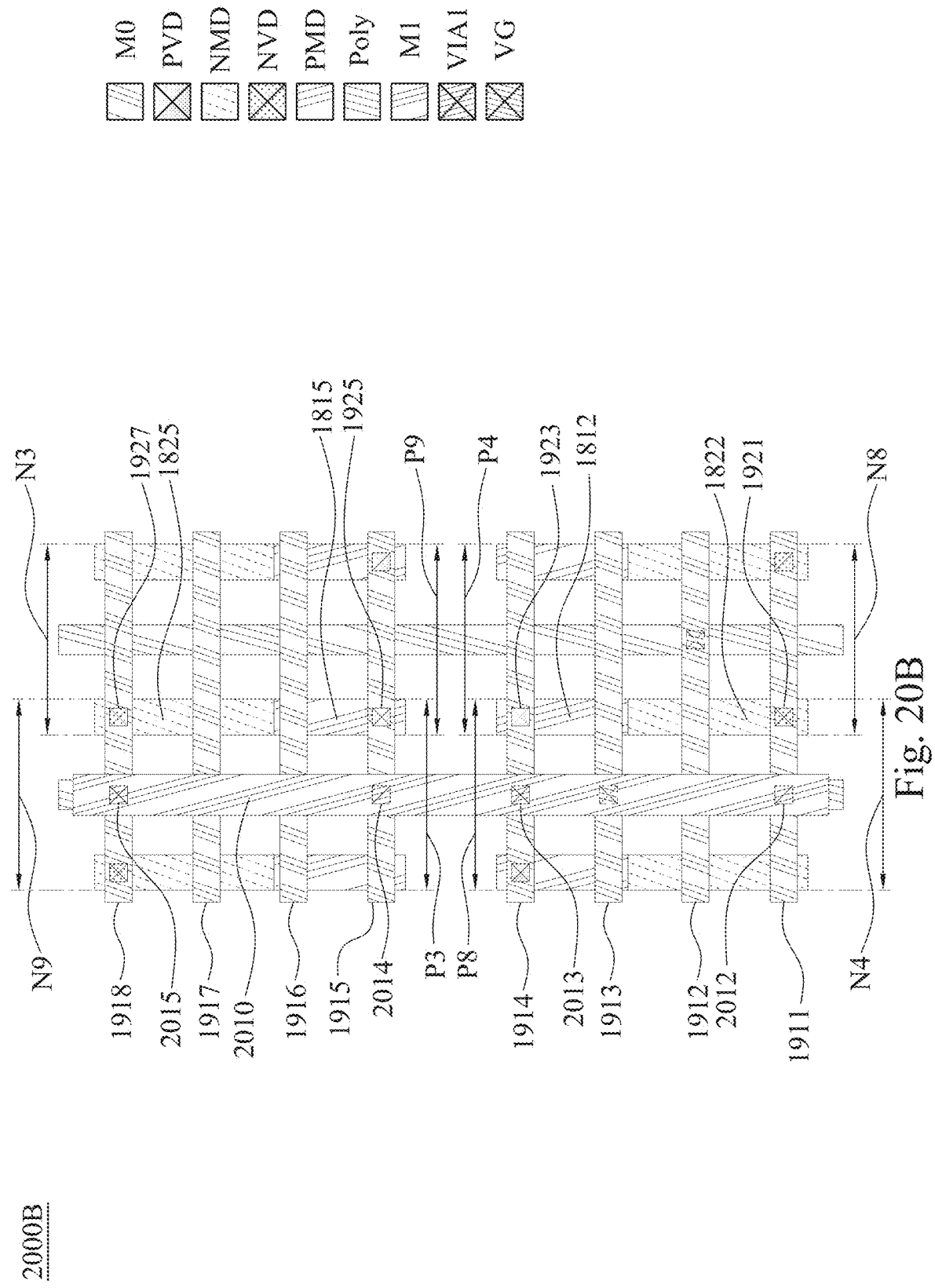

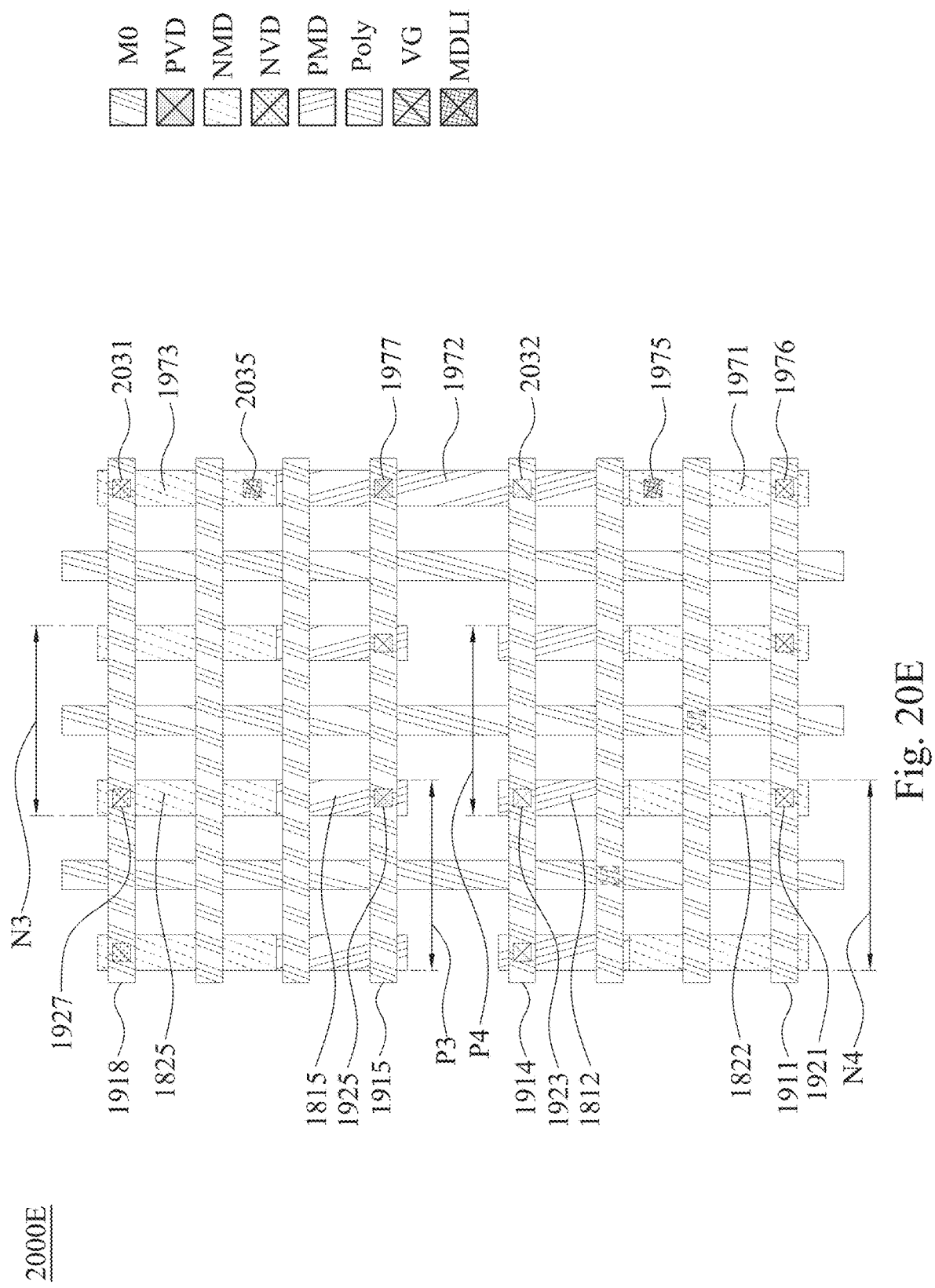

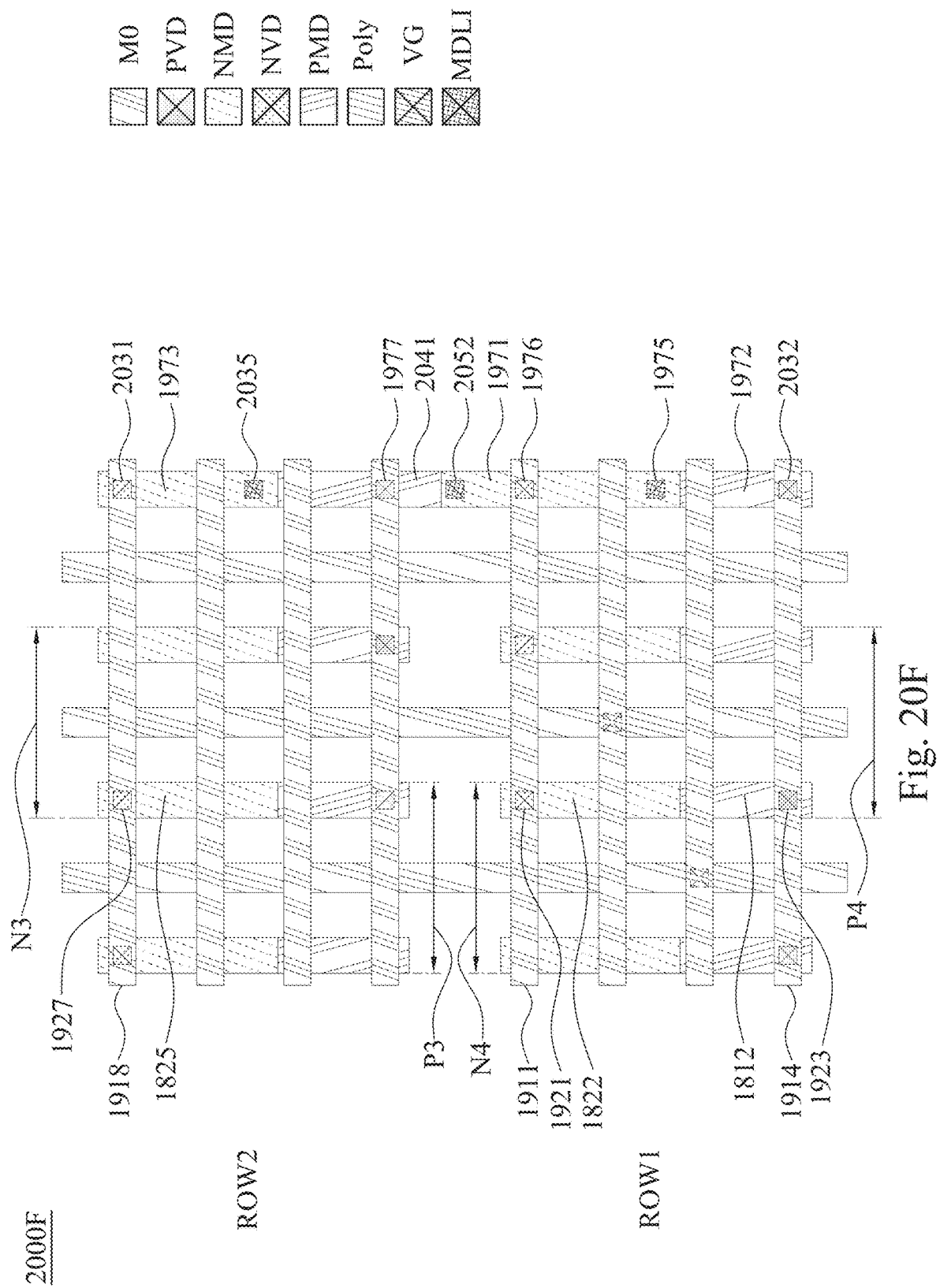

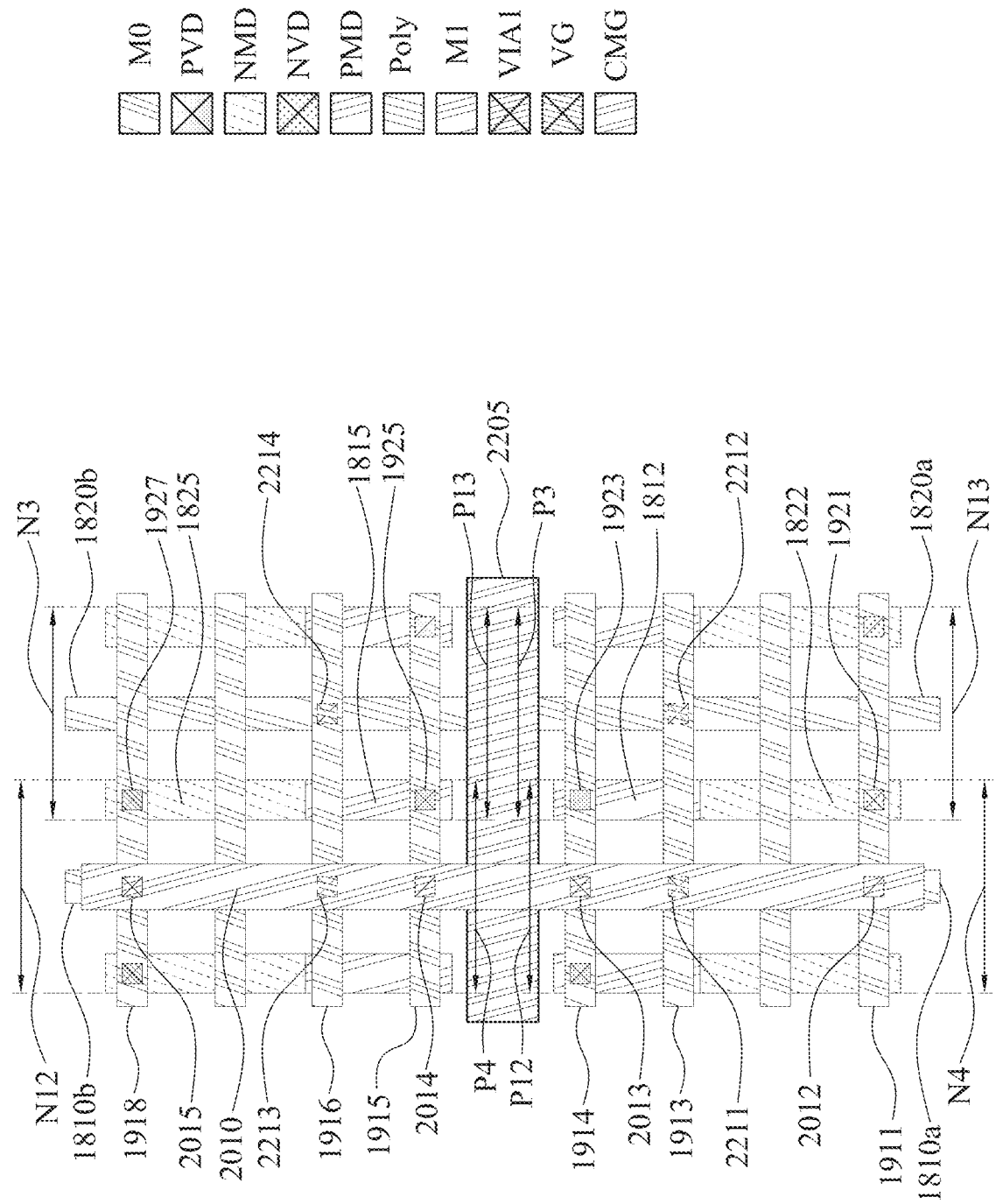

```
2600
```

| 2610 | Arrange conductive portions of a first conductive layer on first and second sides of a gate |

| 2620 | Arrange conductive portions of a second conductive layer on the first and second sides of the gate, the second conductive layer overlying the first conductive layer |

| 2630 | Arrange a conductive feature as part of a conductive path between a conductive portion of the first conductive layer and a conductive portion of the second conductive layer |

| 2640 | Generate an IC layout diagram including some or all of the conductive portions |

| 2650 | Fabricate a semiconductor mask or component based on the IC layout diagram |

| 2660 | Perform one or more manufacturing operations based on the IC layout diagram |

SEMICONDUCTOR STRUCTURE, DEVICE, AND METHOD

RELATED APPLICATIONS

This application is a continuation of U.S. application Ser. No. 17/227,780, filed Apr. 12, 2021, which is a continuation of U.S. application Ser. No. 16/571,809, filed Sep. 16, 2019, now U.S. Pat. No. 10,977,417, issued Apr. 13, 2021, which claims priority to U.S. Provisional Application No. 62/738,973, filed Sep. 28, 2018, each of which is incorporated herein by reference in its entirety.

BACKGROUND

Integrated circuits (ICs) are often designed to implement various devices, including, for example, transistors, resistors, capacitors, or the like. These devices are often designed using connections of conductive traces to form circuits. Increasingly dense ICs result in benefits in terms of speed, functionality and cost, but cause increasingly difficult design and fabrication issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19A-19E depict layout diagrams corresponding to the IC of FIG. 18A and the layout design of FIG. 18B, in accordance with some embodiments of the present disclosure.

FIGS. 20B-20F depict layout diagrams corresponding to the IC of FIG. 20A, in accordance with some embodiments of the present disclosure.

FIG. 22B depicts a layout diagram corresponding to the IC of FIG. 21A, in accordance with some embodiments of the present disclosure.

FIG. 26 is a flowchart of a method of generating an IC layout diagram, in accordance with some embodiments of the present disclosure.

DETAILED DESCRIPTION

Figure 1:
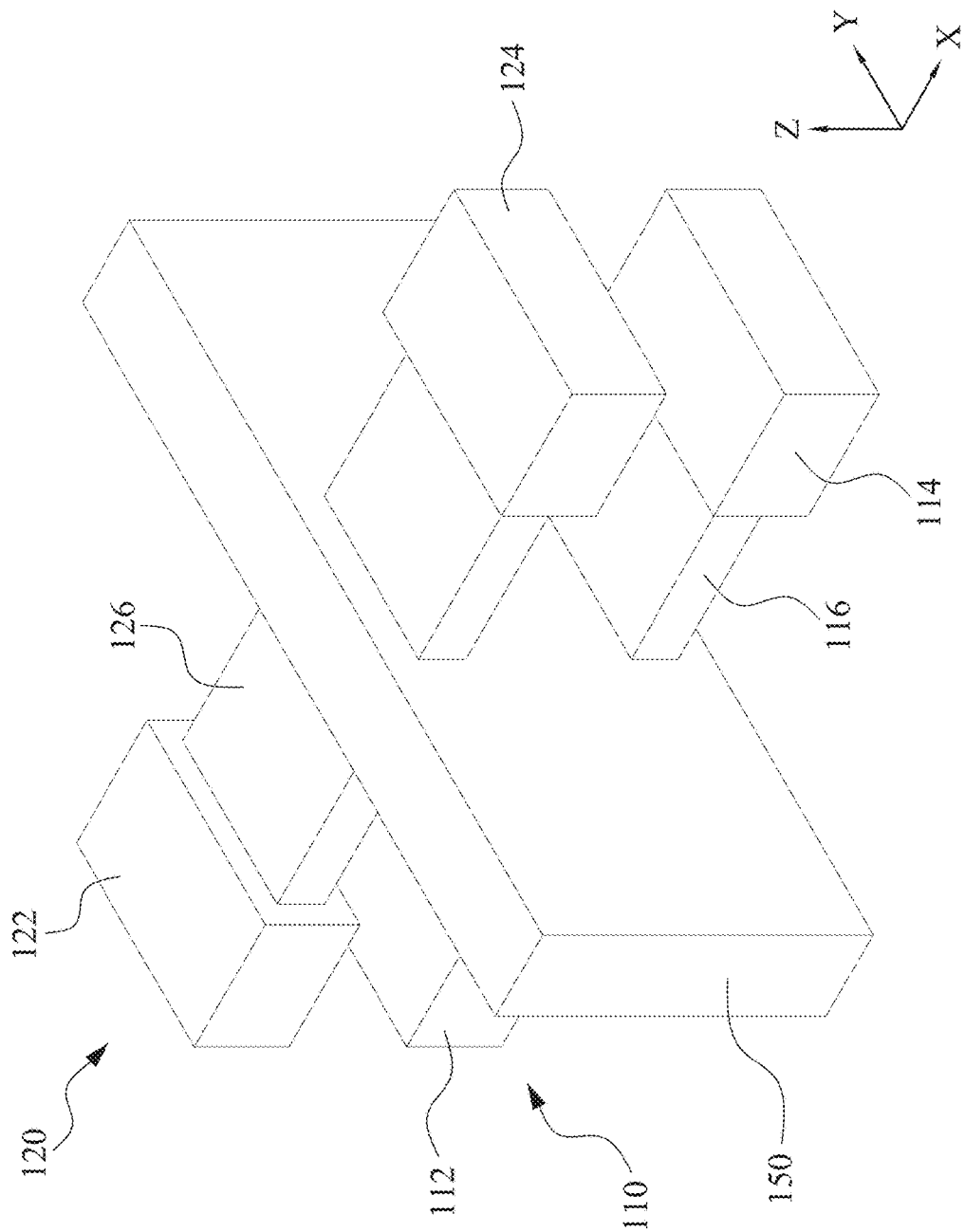
FIG. 1 is a schematic diagram of a perspective view of a layout structure corresponding to a field effect transistor (FET) device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," or the like, may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

Over time, increasingly dense ICs are manufactured with progressively smaller physical dimensions, which results in difficulties of IC design and fabrication. The IC fabrication process is often considered to include a front-end-of-line (FEOL) portion, a middle-end-of-line (MEOL) portion, also referred to as a middle-of-the-line (MOL) portion, and a back-end-of-line (BEOL) portion. A FEOL process is a first portion of the IC fabrication process, in which individual active devices are patterned on a semiconductor wafer. FEOL processes include, for example, selecting a type of semiconductor wafer to be used, chemical-mechanical planarization and cleaning of the wafer, shallow trench isolation (STI) formation, well formation, gate module formation, and source and drain creation. MEOL processes are performed after FEOL processes and include, for example, gate contact formation, under bump metallization (UBM) processes, or the like.

A BEOL process is the final portion of the IC fabrication process in which the individual devices, such as transistors, capacitors, resistors, or the like, are interconnected with vias and conductive traces including, for example, metal lines. The BEOL process generally begins when the first layer of metal is deposited and includes, for example, contacts, insulating layers (or dielectric layers), and bonding sites for chip-to-package connections. In some embodiments, several metal layers are added during the BEOL process.

In some embodiments, improved IC design and fabrication include a system and method of layout design for ICs, which increase packing efficiency of conductive traces, including, for example, metal lines in metal layers created during the BEOL processes. In some embodiments, all metal lines are routed in one direction on each one of the metal layers, which enables greater packing density of the device through a more efficient packing of the conductive traces compared to approaches in which metal lines are routed in more than one direction. Routing all metal lines in one direction on each one of the metal layers also enables relaxation of pitch requirements between the conductive traces, as set forth by one or more design rules, because metal structures having metal lines routed in one direction have a regular pattern that reduces the risk of manufacturing or process errors.

In the various embodiments of the present disclosure, a vertical stack of at least two FETs with fully independent source and drain contacts and a common gate extending along a gate direction is provided, in which each one of the FETs has one or more physical channels from a first source/drain to a second source/drain. The independent source and drain contacts are enabled by each source/drain of an upper transistor being offset, along the gate direction, from the corresponding source/drain of an underlying transistor. Compared to approaches in which source/drains are not offset along a gate direction, the stacked structures including offset source/drains allow increased access to the source/drains, thereby increasing routing flexibility, as illustrated by the non-limiting examples provided below.

A vertical stack of at least two channels that are oriented in a plane, for example, parallel to a surface of a substrate underlying the vertical stack, is provided. With the structures as discussed above, when the two FETs are p-type FET and n-type FET, a complementary FET (CFET) device including the p-type FET and n-type FET is able to be designed and manufactured easily and flexibly. In some embodiments, the term "p-type FET" as discussed above is referred to as a FET including a p-type dopant, e.g., boron, in, for example, doped source and drain regions of the p-type FET, and the term "n-type FET" as discussed above is referred to as a FET including an n-type dopant, e.g., phosphorous or arsenic, in, for example, doped source and drain regions of the n-type FET. Moreover, a standard cell representing the CFET device, used in an IC (or "chip") design, is able to be scaled down because of the vertical stacking structure as discussed above. In some embodiments, the term "standard cell" as discussed above is referred to as an electrical component configured to provide logic-based functionality, storage functionality, or the like.

Devices including FETs and cell structures therein are provided in accordance with various embodiments hereinafter. Some variations of some embodiments are discussed. Throughout various views and illustrative embodiments, like elements are designated with like reference numbers for ease of understanding.

FIG. 1 is a schematic diagram of a perspective view of a layout structure corresponding to a FET device 100, in accordance with some embodiments of the present disclosure. In addition to the FET device 100, FIG. 1 depicts X-axis, Y-axis, and Z-axis directions. FIG. 1 depicts a simplified version of the FET device 100 for the purpose of illustrating the general spatial relationships between the various features; the specific spatial relationships of the various embodiments are discussed below with respect to FIGS. 2A-2D.

As illustratively shown in FIG. 1, the FET device 100 includes a vertical stack of two FETs 110 and 120 with fully independent sources and drains. FETs 110 and 120 are considered to be vertically stacked based on FET 120 overlying FET 110. In various embodiments, FET 120 overlying FET 110 includes at least a portion of FET 120 directly contacting at least a portion of FET 110 and/or FET device 100 including one or more layers (not shown) between FET 120 and FET 110.

In some embodiments, the FETs 110 and 120 are vertically stacked on each other on a substrate (not shown) underlying the stacking structure. The FETs 110 and 120 are formed at two nanosheets or stacks of two more nanosheets (not shown) that are separate from each other along a vertical direction (e.g., along the Z-axis direction). In some embodiments, the FET 110 is a p-type FET and the FET 120 is an n-type FET, or vice versa, and thus the FET device 100 is a CFET device. The substrate underlying the stacking structure is any substrate suitable for epitaxial growth and/or is formed of any suitable crystalline material including, for example, silicon, silicon-germanium (SiGe), or the like.

The term "nanosheet" refers to a substantially two-dimensional material that is a single monolayer thick or several monolayers thick, thereby having a thickness ranging from 1 nanometer (nm) to 100 nm in some embodiments, and has lateral dimensions from, for example, hundreds of nanometers to tens of microns. In some embodiments, a nanosheet or nanosheet stack defines a metal-like defined (MD) segment.

In various embodiments, an MD segment includes a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more of silicon (Si), SiGe, silicon-carbide (SiC)., boron (B), phosphorous (P), arsenic (As), gallium (Ga), a metal as discussed above, or another material suitable for providing the low resistance level. In some embodiments, an MD segment includes a dopant having a doping concentration of about 1*1016 per cubic centimeter (cm-3) or greater.

In FIG. 1, the FET 110, which is, for illustration, a lower FET below FET 120, includes a first source/drain 112, a gate 150, and a second source/drain 114 that are arranged along a horizontal direction (e.g., along the X-axis direction). The gate 150 is arranged between the first source/drain 112 and the second source/drain 114 of the FET 110 and extends in a predetermined direction. The gate 150 is configured to control a channel 116 between the first source/drain 112 and the second source/drain 114 of the FET 110. The channel 116 as well as the first source/drain 112 and the second source/drain 114 are implemented by an active area formed with dopants in some embodiments.

The FET 120, which is, for illustration, a higher FET above FET 110, includes a first source/drain 122, the gate 150, and a second source/drain 124 that are arranged along a horizontal direction (e.g., along the X-axis direction). Alternatively stated, the gate 150 is arranged as a common gate corresponding to the FETs 110 and 120, and the FETs 110 and 120 share the gate 150. Similarly, the gate 150 is arranged between the first source/drain 122 and the second source/drain 124 of the FET 120. The gate 150 is configured to control a channel 126 between the first source/drain 122 and the second source/drain 124 of the FET 120. The channel 126 as well as the first source/drain 122 and the second source/drain 124 are implemented by an active area formed with dopants in some embodiments.

With the structures of the FET device 100 as discussed above, electrical contacts to the gate 150 are able to be formed using sides of the stacking structure shown in FIG. 1. This simplifies access to the FET device 100. Moreover, a standard cell which implements the FET device 100 is able to be scaled down because of the stacking structure shown in FIG. 1.

In some embodiments, the term "source/drain" is referred to as a region that may be a source region or a drain region. Accordingly, for illustration in FIG. 1, when the first source/drain 112 of the FET 110 is a source region, the second source/drain 114 of the FET 110 is a drain region, and vice versa. Correspondingly, when the first source/drain 122 of the FET 120 is a source region, the second source/drain 124 of the FET 120 is a drain region, and vice versa.

The structures of the FET device 100 as discussed above are given for illustrative purposes. Various structures of the FET device 100 are within the contemplated scope of the present disclosure. For example, in various embodiments, the structures of the FET device 100 are extended to include additional gates that are in parallel, in series, or in parallel and series combination, to the gate 150 as discussed above. In some embodiments, the FET 110 is stacked above the FET 120.

In some embodiments, as illustrated in FIG. 1, the FET 120 is stacked directly above the FET 110 along the Z-axis direction. For illustration, the first source/drain 122, the channel 126, and the second source/drain 124 of the FET 120 are disposed directly above the first source/drain 112, the channel 116, and the second source/drain 114 of the FET 110, respectively, along the Z-axis direction. This structure as discussed above is given for illustrative purposes. Various structures are within the contemplated scope of the present disclosure. For example, in various embodiments, the first source/drain 112, the second source/drain 114, and/or the channel 116 of the FET 110 are partially overlapped with the first source/drain 122, the second source/drain 124, and/or the channel 126 of the FET 120, respectively, in a top view of the FET device 100.

FIGS. 2A-2D are schematic diagrams of various perspective views of layout structures for the field effect transistor device 100 in FIG. 1, in accordance with various embodiments of the present disclosure. According to the various embodiments of FIGS. 2A-2D, the first source/drain 112 and the second source/drain 114 of the FET 110 are aligned with each other along the X-axis direction, or are offset along the Y-axis direction on the plane where they are located. In the various embodiments, the first source/drain 122 and the second source/drain 124 of the FET 120 are aligned with each other along the X-axis direction, or are offset along the Y-axis direction on the plane where they are located. In each of the embodiments depicted in FIGS. 2A-2D, the first source/drain 122 of the FET 120 partially overlies the first source/drain 112 of the FET 110, and the second source/drain 124 of the FET 120 partially overlies the second source/drain 114 of the FET 110, as discussed below.

Figure 2A:
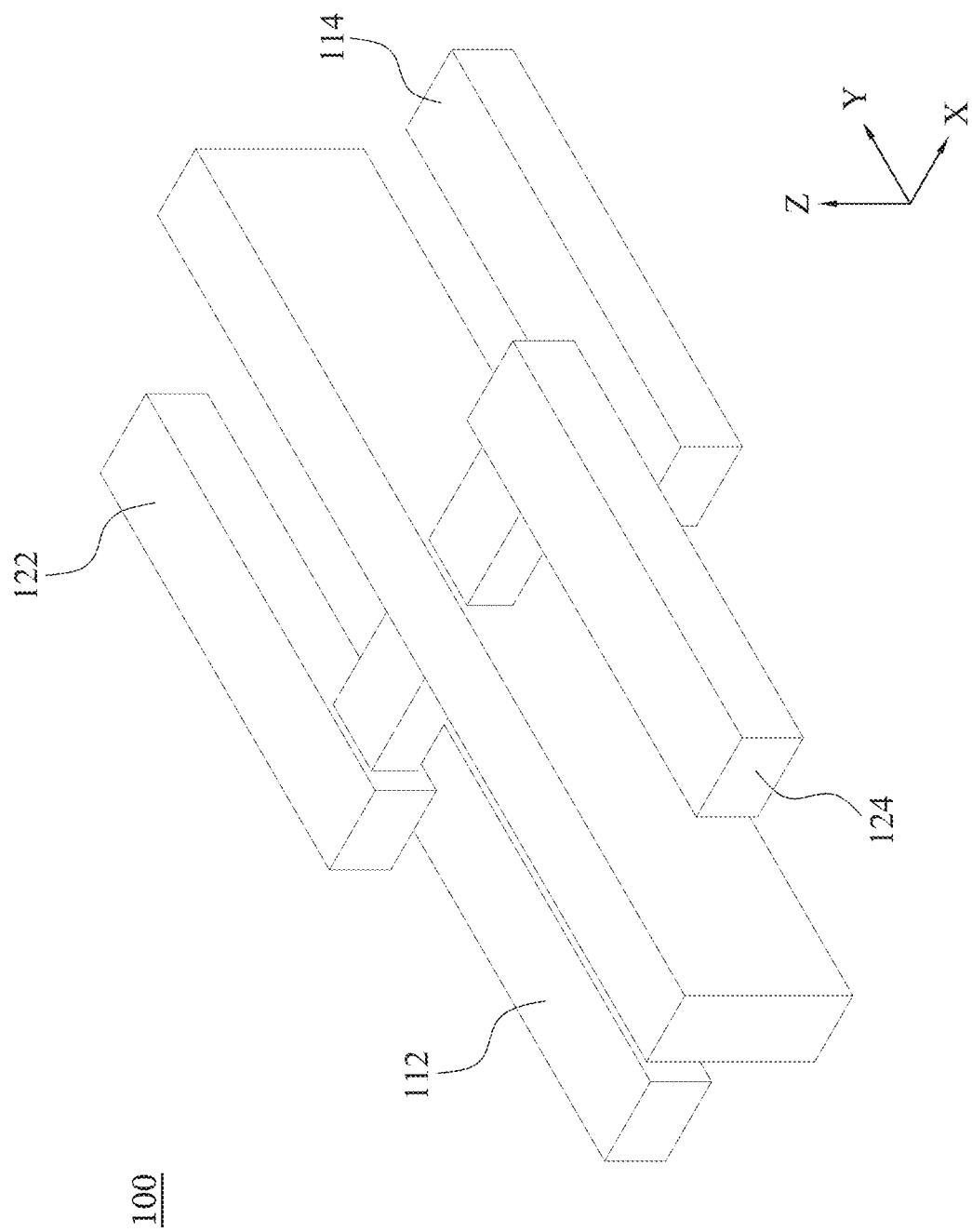
FIGS. 2A-2D are schematic diagrams of various perspective views of layout structures corresponding to the FET device of FIG. 1, in accordance with various embodiments of the present disclosure.

In the illustration of FIG. 2A, the first source/drain 112 and the second source/drain 114 of the FET 110 are offset along the Y-axis direction as viewed along the X-axis direction, and the first source/drain 122 and the second source/drain 124 of the FET 120 are also offset along the Y-axis direction as viewed along the X-axis direction. Furthermore, in a top view, the first source/drain 112 of the FET 110 is partially overlapped with the first source/drain 122 of the FET 120, and the second source/drain 114 of the FET 110 is partially overlapped with the second source/drain 124 of the FET 120. As viewed along both the X-axis and Z-axis directions, the first source/drain 112 of the FET 110 is offset from the first source/drain 122 of the FET 120 in the negative Y-axis direction and the second source/drain 114 of the FET 110 is offset from the second source/drain 124 of the FET 120 in the positive Y-axis direction. Accordingly, the first source/drain 112 and the second source/drain 114 extend away from a center of the FET 110 in opposite directions consistent with a counterclockwise direction in a top view, and the first source/drain 122 and the second source/drain 124 extend away from a center of the FET 120 in opposite directions consistent with a clockwise direction in a top view.

Figure 2B:
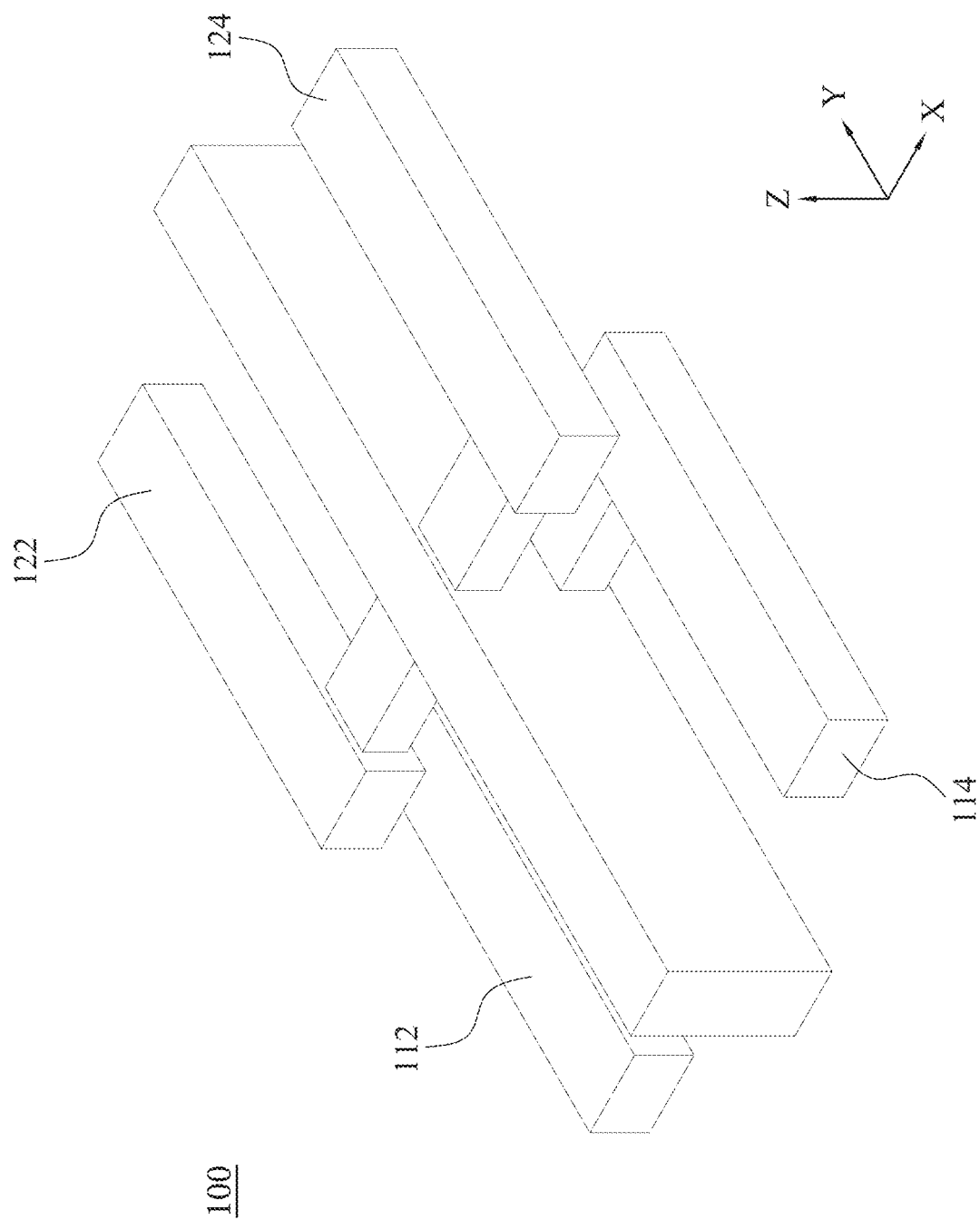

In the illustration of FIG. 2B, the first source/drain 112 and the second source/drain 114 of the FET 110 are aligned with each other along the X-axis direction, and the first source/drain 122 and the second source/drain 124 of the FET 120 are also aligned with each other along the X-axis direction. Furthermore, in a top view, the first source/drain 112 of the FET 110 is partially overlapped by the first source/drain 122 of the FET 120, and the second source/drain 114 of the FET 110 is partially overlapped by the second source/drain 124 of the FET 120. As viewed along both the X-axis and Z-axis directions, the first source/drain 112 of the FET 110 is offset from the first source/drain 122 of the FET 120 in the negative Y-axis direction, and the second source/drain 114 of the FET 110 is offset from the second source/drain 124 of the FET 120 in the negative Y-axis direction.

Figure 2C:
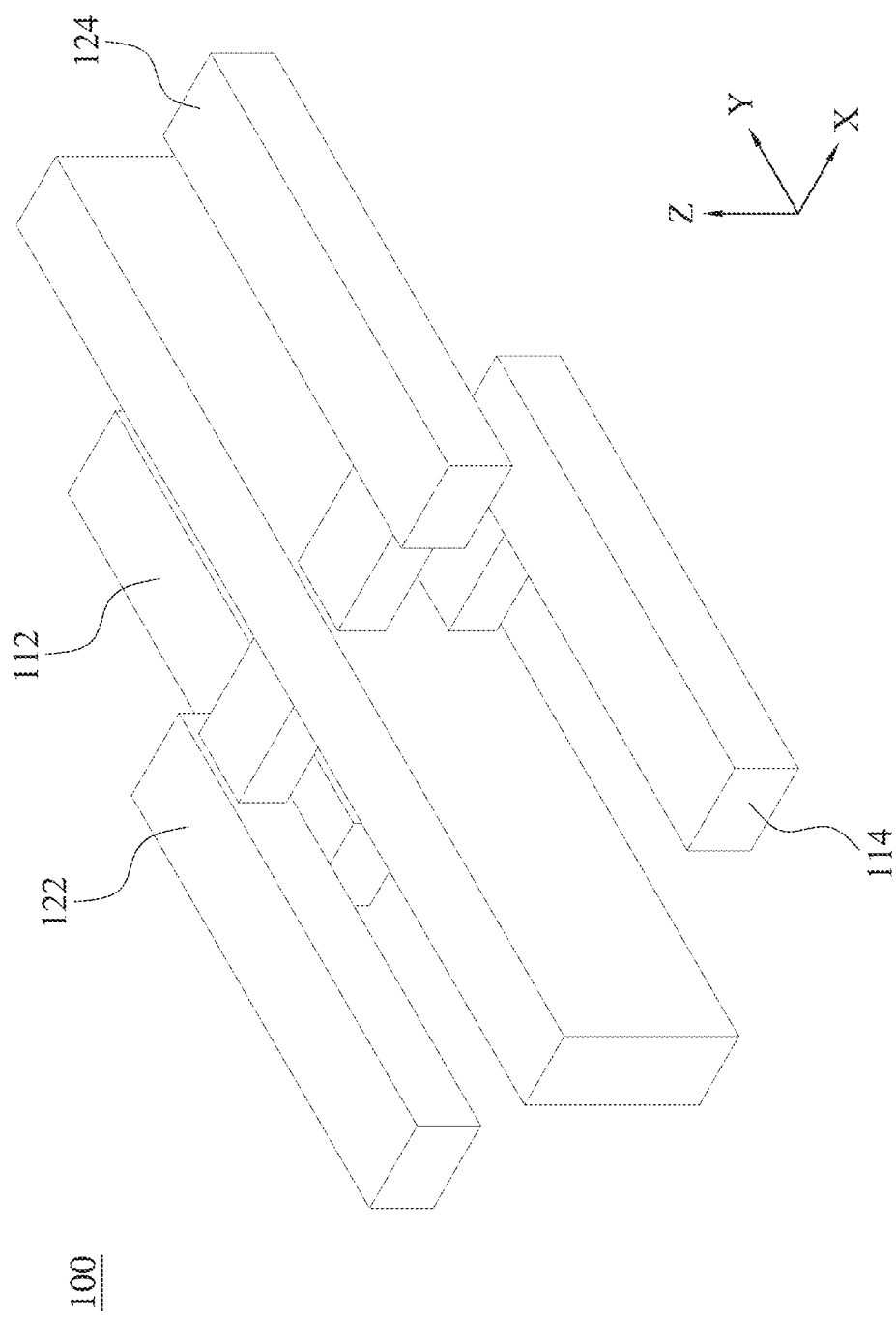

In the illustration of FIG. 2C, as in the embodiment of FIG. 2A, the first source/drain 112 and the second source/drain 114 of the FET 110 are offset along the Y-axis direction as viewed along the X-axis direction, and the first source/drain 122 and the second source/drain 124 of the FET 120 are also offset along the Y-axis direction as viewed along the X-axis direction. Furthermore, as in the embodiment of FIG. 2A, in a top view, the first source/drain 112 of the FET 110 is partially overlapped with the first source/drain 122 of the FET 120, and the second source/drain 114 of the FET 110 is partially overlapped with the second source/drain 124 of the FET 120. In contrast to the embodiment of FIG. 2A, as viewed along both the X-axis and Z-axis directions, the first source/drain 112 of the FET 110 is offset from the first source/drain 122 of the FET 120 in the positive Y-axis direction, and the second source/drain 114 of the FET 110 is offset from the second source/drain 124 of the FET 120 in the negative Y-axis direction. Accordingly, the first source/drain 112 and the second source/drain 114 extend away from the center of the FET 110 in opposite directions consistent with a clockwise direction in a top view, and the first source/drain 122 and the second source/drain 124 extend away from the center of the FET 120 in opposite directions consistent with a counterclockwise direction in a top view.

Figure 2D:
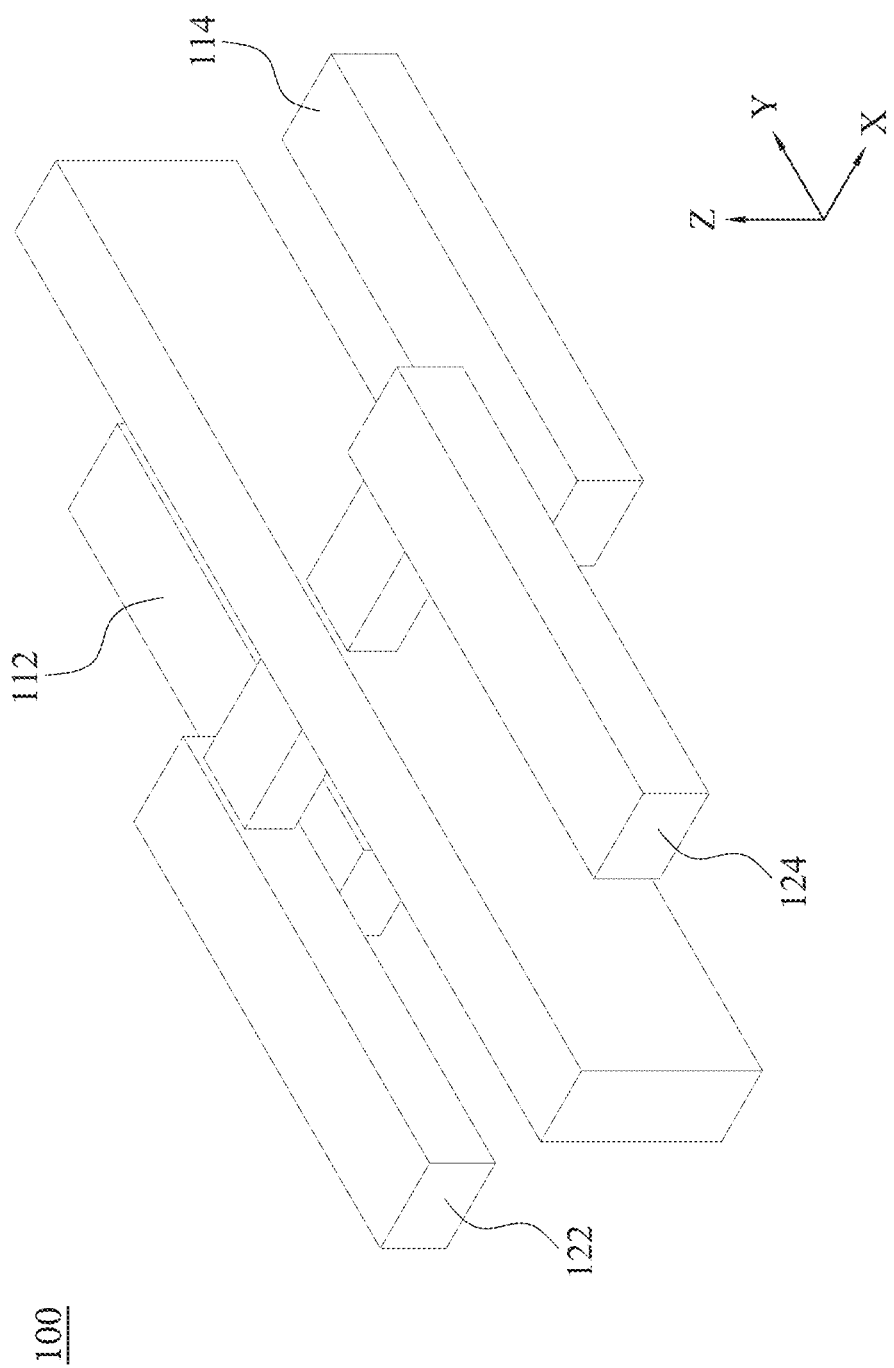

In the illustration of FIG. 2D, the embodiment of FIG. 2B is represented rotated 180 degrees such that, as viewed along both the X-axis and Z-axis directions, the first source/drain 112 of the FET 110 is offset from the first source/drain 122 of the FET 120 in the positive Y-axis direction, and the second source/drain 114 of the FET 110 is offset from the second source/drain 124 of the FET 120 in the positive Y-axis direction.

To implement various devices, the structures as discussed above with respect to FIGS. 1 and 2A-2D are used or modified to be used, as illustrated by the non-limiting examples discussed below with respect to FIGS. 3A-25. In the various embodiments discussed below, FET device 100 is implemented through the use of layout diagrams depicted in FIGS. 3B, 4B, 4C, 5B-5D, 6B-6D, 7B-7D, 8B-8D, 9B, 11B, 12B, 13B, 14B, 15B, 16B, 17B, 18B, 19A-19E, 20A-20F, 21B, 22B, and 25 that correspond to circuit diagrams depicted in FIGS. 4A, 10, 11A, 18A, 20A, 21A, 22A, 23, and 24, as indicated. The layout diagrams are usable to define, at least in part, features formed through one or more manufacturing processes so as to correspond to the indicated layout structures depicted in FIGS. 3A, 5A, 6A, 7A, 8A, 9A, 12A, 13A, 14A, 15A, 16A, and 17A, each of the layout structures thereby including one or more implementations of the FET device 100. To indicate correspondence between a given layout diagram feature and a layout structure feature formed based on the given layout diagram feature, a same reference designator is used in each of the layout diagram and structure depictions, as discussed below.

Figure 3A:
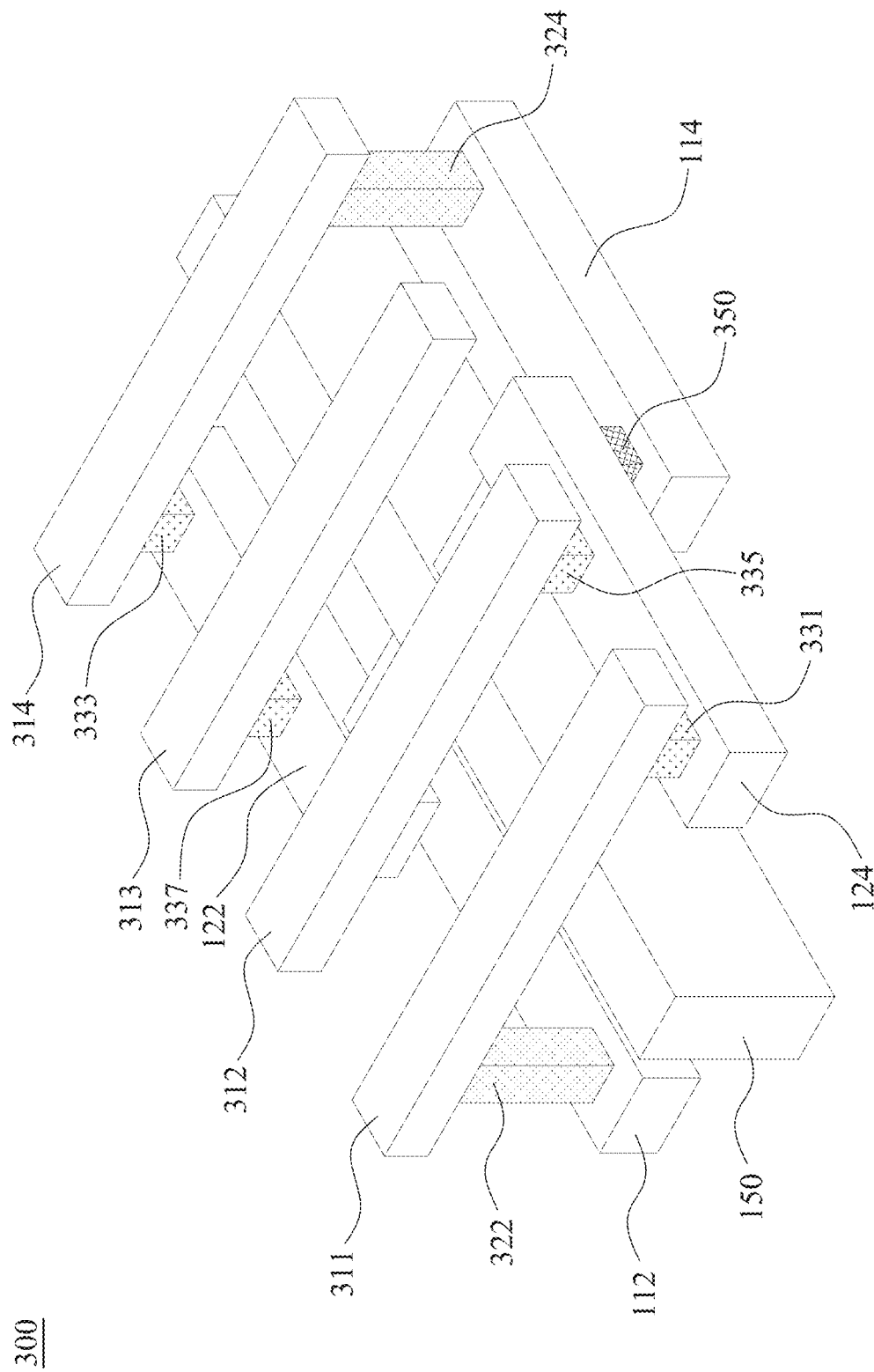
FIG. 3A is a schematic diagram of a perspective view of a layout structure corresponding to a device including the embodiments of FIG. 2A, in accordance with some embodiments of the present disclosure.

FIG. 3A is a schematic diagram of a perspective view of a layout structure corresponding to a device 300 including the embodiment of FIG. 2A, in accordance with some embodiments of the present disclosure. In the embodiment of FIG. 3A, compared to the embodiment of FIG. 2A, the device 300 further includes conductive traces 311-314. The conductive traces 311-314 are arranged above the gate 150 and the first source/drain 122 and the second source/drain 124 of the FET 120. The conductive traces 311-314 extend along a first predetermined direction (not labeled) that is, for illustration, perpendicular to a second predetermined direction (not labeled) along which the gate 150 extends. The device 300 further includes vias 322, 324, 331, 333, 335, and 337, positioned to couple the corresponding conductive traces to the corresponding source/drains. For illustration, the conductive trace 311 is coupled through the via 322 to the first source/drain 112 of the FET 110, and is coupled through the via 331 to the second source/drain 124 of the FET 120. The conductive trace 312 is coupled through the via 335 to the second source/drain 124 of the FET 120. The conductive trace 313 is coupled through the via 337 to the first source/drain 122 of the FET 120. The conductive trace 314 is coupled through the via 324 to the second source/drain 114 of the FET 110, and is coupled through the via 333 to the first source/drain 122 of the FET 120.

The device 300 further includes at least one conductive local interconnect 350, as illustrated in FIG. 3A, that is arranged between the corresponding source/drain of the FET 110 and the corresponding source/drain of the FET 120 and couples the corresponding source/drain of the FET 110 to the corresponding source/drain of the FET 120. For illustration in FIG. 3A, the conductive local interconnect 350 couples the second source/drain 114 of the FET 110 to the second source/drain 124 of the FET 120.

The numbers of the conductive traces, the vias, and the conductive local interconnect, as discussed above, are given for illustrative purposes. Various numbers of the conductive traces, the vias, and the conductive local interconnect are within the contemplated scope of the present disclosure. For example, in various embodiments, the number of the conductive traces 311-314 shown in FIG. 3A is decreased to be three or increased to be five.

Figure 3B:
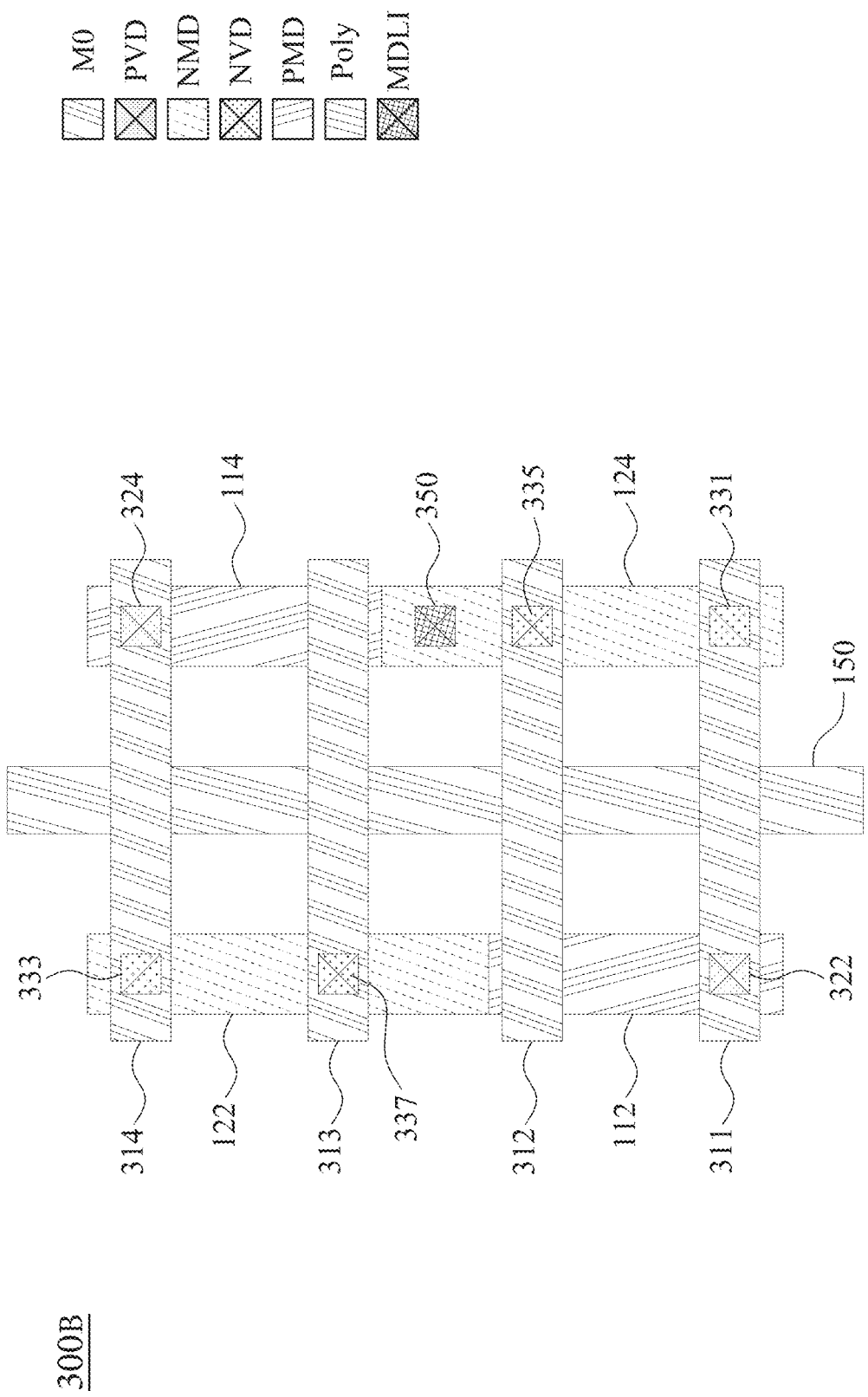
FIG. 3B depicts a layout diagram corresponding to the device illustrated in FIG. 3A, in accordance with some embodiments of the present disclosure.

FIG. 3B depicts a layout diagram 300B corresponding to the device 300 illustrated in FIG. 3A, in accordance with some embodiments of the present disclosure. The layout diagram 300B depicted in FIG. 3B is discussed below with reference to FIG. 3A. If the FET 110 is a p-type FET, the first source/drain 112 and the second source/drain 114 of the FET 110 are also referred to as MD segments, conductive segments, or conductive portions for the p-type FET (which are labeled as "PMD" and hereinafter referred to as PMD portions), in some embodiments. If the FET 120 is an n-type FET, the first source/drain 122 and the second source/drain 124 of the FET 120 are also referred to as MD segments, conductive segments, or conductive portions for the n-type FET (which are labeled as "NMD" and hereinafter referred to as NMD portions), in some embodiments. The gate 150 is made of polysilicon in some embodiments, and accordingly, the gate 150 is also referred to as a Poly portion in some embodiments. The gate 150 is made of other material including, for example, metal, alloy, or the like, in some embodiments, and thus the above material for the gate 150 is given for illustrative purposes only. The conductive traces 311-314 are disposed in a metal zero (M0) layer in some embodiments, and accordingly, the conductive traces 311-314 are also referred to as M0 portions in some embodiments. In some embodiments, the M0 portions are positioned in one direction by double patterning with a first mask pattern and a second mask pattern.

The vias 322 and 324 couple the PMD portions as discussed above to the corresponding conductive traces 311 and 314, respectively, and accordingly, the vias 322 and 324 are also referred to as via portions for the p-type FET (which are labeled as "PVD" and hereinafter referred to as PVD portions) in some embodiments. The vias 331 and 333 couple the NMD portions as discussed above to the corresponding conductive traces 311 and 314, respectively, and accordingly, the vias 331 and 333 are also referred to as via portions for the n-type FET (which are labeled as "NVD" and hereinafter referred to as NVD portions) in some embodiments. The conductive local interconnect 350 is also referred to as MD local interconnect (MDLI) in some embodiments, to couple the corresponding PMD portions to the corresponding NMD portions.

As illustrated in FIGS. 3A and 3B, features that overlap in a layout diagram, e.g., layout diagram 300B, correspond to features that have an overlying spatial relationship in the corresponding structure, e.g., device 300. For example, MDLI 350 overlapping PMD portion 114 in layout diagram 300B corresponds to conductive local interconnect 350 overlying conductive segment 114 in device 300, and NMD portion 124 overlapping MDLI 350 and PMD portion 114 in layout diagram 300B corresponds to conductive segment 124 overlying conductive local interconnect 350 and conductive segment 114 in device 300.

Figure 4A:
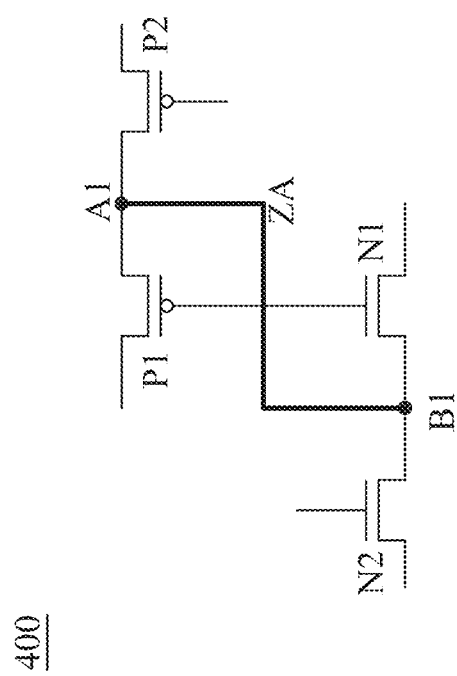
FIG. 4A is a circuit diagram of an IC in accordance with some embodiments of the present disclosure.

FIG. 4A is a circuit diagram of an IC 400 in accordance with some embodiments of the present disclosure. For illustration of the IC 400, a gate terminal of a p-type metal oxide semiconductor (PMOS) transistor P1 is coupled to a gate terminal of an n-type metal oxide semiconductor (NMOS) transistor N1. A source/drain terminal of the PMOS transistor P1 is coupled to a source/drain terminal of a PMOS transistor P2 at a node A1. A source/drain terminal of the NMOS transistor N1 is coupled to a source/drain terminal of an NMOS transistor N2 at a node B1. The node A1 is further coupled to the node B1 as indicated by connection ZA shown in FIG. 4A. To implement the IC 400 including the connection ZA between the nodes A1 and B1 in the embodiments of the present disclosure, embodiments of layout designs and/or structures are provided and discussed below as illustrated with reference to FIGS. 4B-9B.

In some embodiments, the IC 400 is used as a unit cell or unit circuit, in which the unit cell or unit circuit is capable of being used as a basic unit or as part of a device or circuit, in order to implement various devices or circuits. Alternatively stated, in some embodiments, the IC 400 is implemented in various devices or circuits, including, for example, an inverter, a NAND gate, an AND-OR-invert (AOI) logic gate, a flip-flop, or the like. In some embodiments, a contacted poly pitch (CPP) is referred to as a distance between two contacted (poly) gates. For the above embodiments, the inverter requires two times of CPP, the NAND gate requires three times of CPP, the AND-OR-invert (AOI) logic gate requires five times of CPP, and the flip-flop requires twenty-two times of CPP, in some embodiments.

Figure 4B:
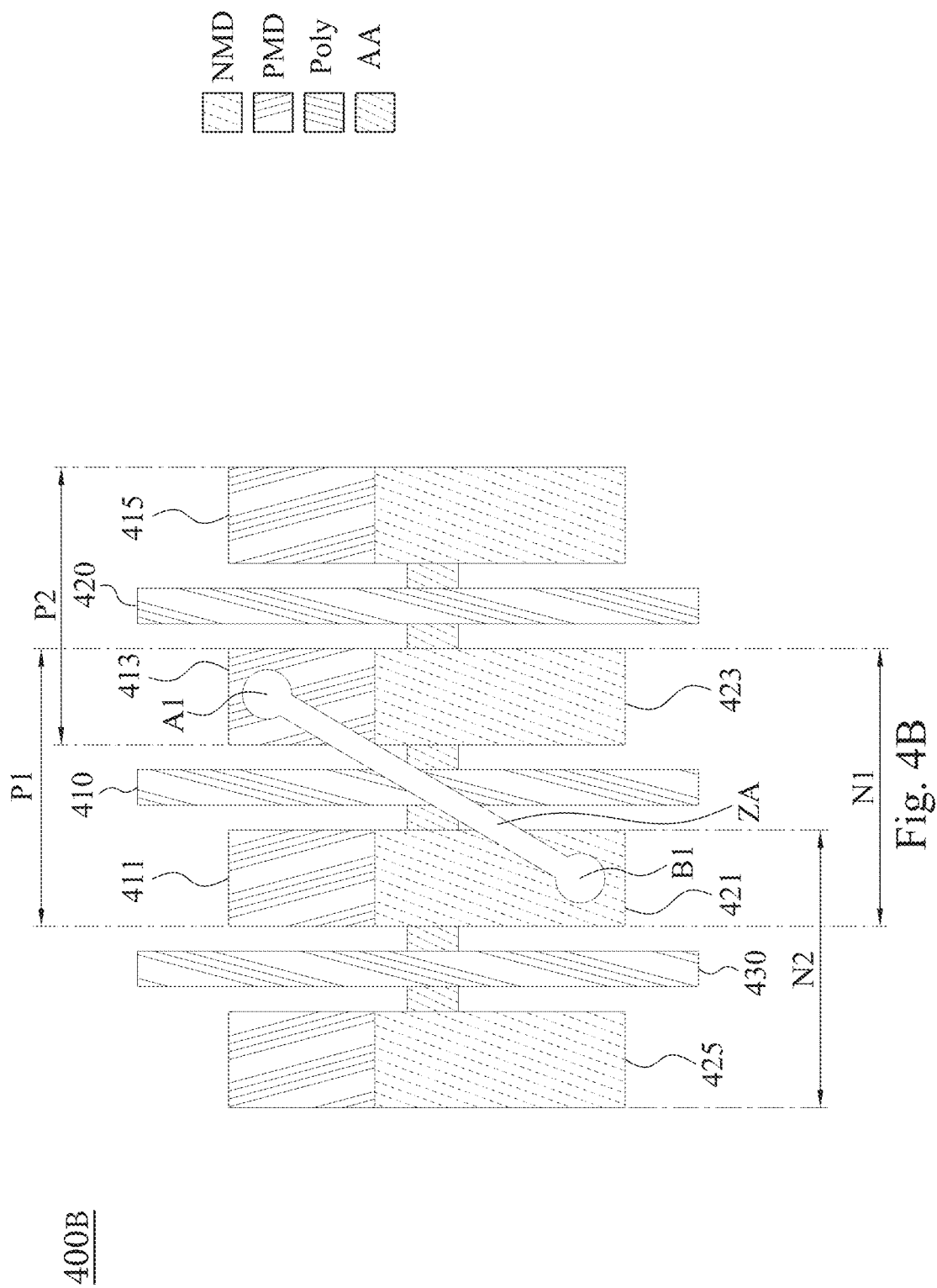
FIG. 4B depicts a layout diagram corresponding to the IC of FIG. 4A, in accordance with some embodiments of the present disclosure.

FIG. 4B depicts a layout diagram 400B corresponding to the IC 400 of FIG. 4A, in accordance with some embodiments of the present disclosure. In the embodiment of FIG. 4B, the NMOS transistors N1 and N2 of FIG. 4A are configured to be stacked on the PMOS transistors P1 and P2 of FIG. 4A. For illustration, with the NMD portions being disposed above and partially overlapped with the PMD portions, the NMOS transistors N1 and N2 are stacked on the PMOS transistors P1 and P2.

In the illustration of FIG. 4B, gates 410, 420, 430 are arranged to extend in a predetermined direction (not labeled). Conductive segments 411, 413, and 415 are arranged, in a first conductive layer, as sources/drains of the PMOS transistors P1 and P2. The gate 410 and the conductive segments 411 and 413 together correspond to the PMOS transistor P1. The gate 420 and the conductive segments 413 and 415 together correspond to the PMOS transistor P2. In such embodiments, the PMOS transistors P1 and P2 share the conductive segment 413, which corresponds to the PMOS transistors P1 and P2 being coupled at the node A1 as discussed above with respect to FIG. 4A.

As further illustrated in FIG. 4B, conductive segments 421, 423, 425 are arranged, in a second conductive layer stacked over the first layer in which the conductive segments 411, 413, and 415 are arranged, as sources/drains of the NMOS transistors N1 and N2. The gate 410 and the conductive segments 421 and 423 together correspond to the NMOS transistor N1. The gate 430 and the conductive segments 421 and 425 together correspond to the NMOS transistor N2. In such embodiments, the NMOS transistors N1 and N2 share the conductive segment 421, which corresponds to the NMOS transistors N1 and N2 being coupled at the node B1 as discussed above with respect to FIG. 4A.

In the embodiment of FIG. 4B, the PMOS transistor P1 and the NMOS transistor N1 share the gate 410, which corresponds to the connection of the gate terminal of the PMOS transistor P1 and the gate terminal of the NMOS transistor N1, as discussed above with respect to FIG. 4A. The conductive segment 413 is coupled to the conductive segment 421, which corresponds to the connection of the nodes A1 and B1, i.e., the connection ZA, as discussed above with respect to FIG. 4A. Correspondingly, part of the embodiment of FIG. 4B, including the connection ZA between the nodes A1 and B1, is implemented by various embodiments of layout diagrams and structures which are discussed in more detail below.

Figure 4C:
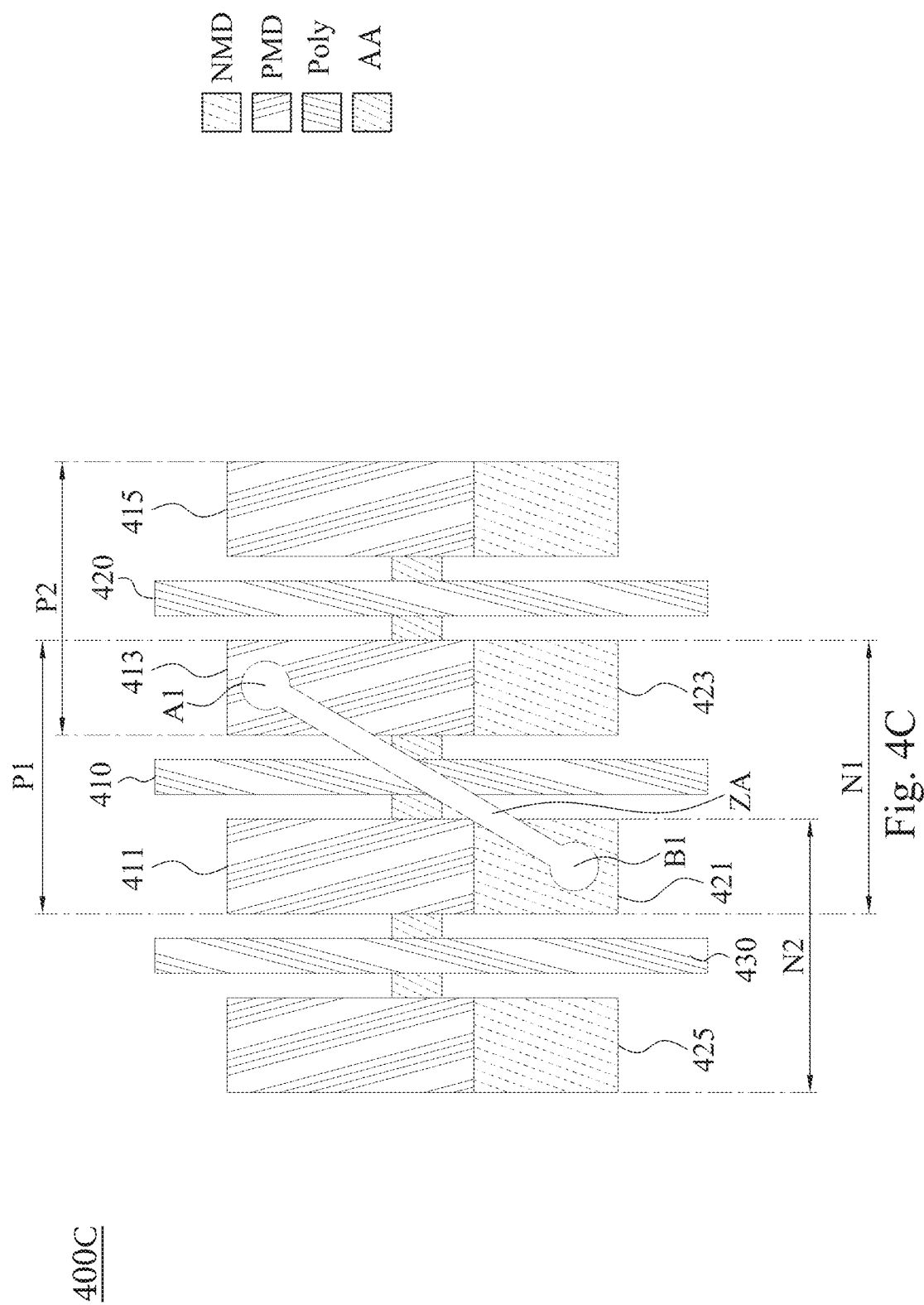
FIG. 4C depicts a layout diagram corresponding to the IC of FIG. 4A, in accordance with various embodiments of the present disclosure.

FIG. 4C depicts a layout diagram 400C corresponding to the IC 400 of FIG. 4A, in accordance with various embodiments of the present disclosure. In the embodiment of FIG. 4C, compared to FIG. 4B, the PMOS transistors P1 and P2 are configured to be stacked on the NMOS transistors N1 and N2. For illustration, as discussed above, the PMD portions are disposed above and partially overlapped with the NMD portions, the PMOS transistors P1 and P2 are accordingly stacked on the NMOS transistors N1 and N2. Otherwise, the configurations and arrangements illustrated in FIG. 4C are similar to those illustrated in FIG. 4B, and thus they are not further detailed herein. Correspondingly, part of the embodiment of FIG. 4C, including the connection ZA between the nodes A1 and B1, is implemented by various embodiments of layout structures which are discussed in more detail below.

Each of the layout diagrams 400B and 400C further includes active area (AA) portions, also referred to as oxide definition (OD) portions in some embodiments. As illustrated in FIGS. 4B and 4C, respective layout diagrams 400B and 400C implement the active areas corresponding to the channels 116 and/or 126 as discussed above, which for convenience of illustration are not labeled.

To realize the concepts as discussed above with respect to FIGS. 4B and/or 4C, layout structures for the IC 400 are illustrated in FIGS. 5A, 6A, 7A, and 8A. Layout diagrams corresponding to these layout structures are illustrated in corresponding FIGS. 5B-5D, 6B-6D, 7B-7D, and 8B-8D, each discussed below.

Figure 5A:
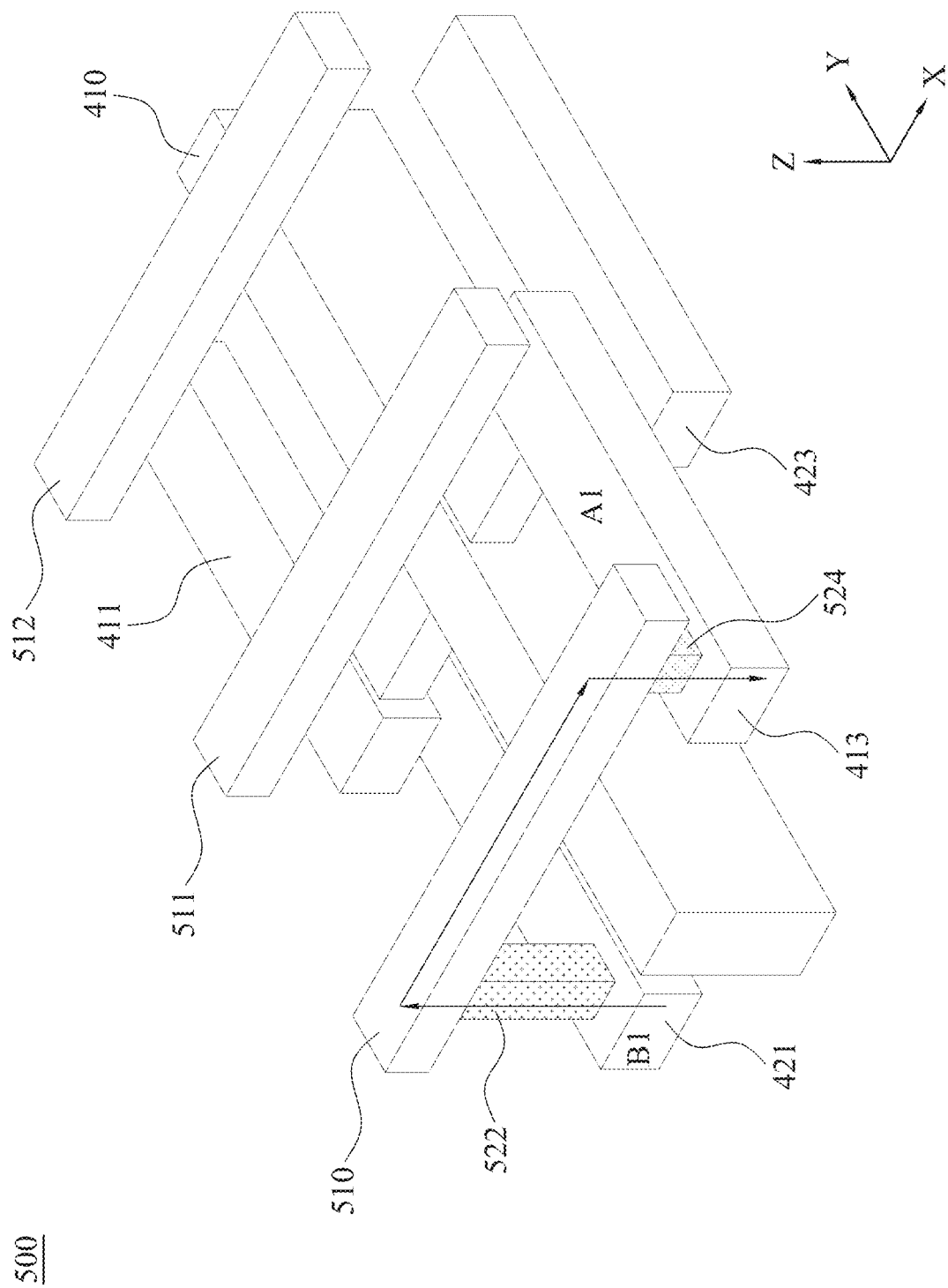
FIG. 5A is a schematic diagram of a perspective view of a layout structure corresponding to a portion of the IC of FIG. 4A, in accordance with some embodiments of the present disclosure.

FIG. 5A is a schematic diagram of a perspective view of a layout structure 500 corresponding to a portion of the IC 400 in FIG. 4A, in accordance with some embodiments of the present disclosure. The layout structure 500 corresponds to the PMOS transistor P1 and the NMOS transistor N1 illustrated in FIG. 4C, with the arrangements similar to those in FIG. 2A. For illustration, the conductive segments 411 and 413 are offset along the Y-axis direction as viewed along the X-axis direction, and the conductive segments 421 and 423 are also offset along the Y-axis direction as viewed along the X-axis direction. Accordingly, some corresponding portions of the layout structure 500 are not further detailed herein.

In the illustration of FIG. 5A, the layout structure 500 further includes a conductive trace 510 and vias 522 and 524, compared to the PMOS transistor P1 and the NMOS transistor N1 illustrated in FIG. 4C. The configuration of the conductive trace 510 is similar to those of the conductive traces 311-314 as discussed above, and thus it is not further detailed herein. The via 522 couples the conductive segment 421 to the conductive trace 510. The via 524 couples the conductive segment 413 to the conductive trace 510. In some embodiments, a height of the via 522 is greater than a height of the via 524, because the conductive segments 421 and 413 are disposed in different layers as discussed above.

By the layout structure 500 discussed above, the conductive segment 421 corresponding to one source/drain of the NMOS transistor N1 is coupled to the conductive segment 413 corresponding to one source/drain of the PMOS transistor P1, for illustration, using only one conductive trace 510. Alternatively stated, to implement the connection ZA of the PMOS transistor P1 and the NMOS transistor N1 in FIG. 4A, the node A1 is coupled to the node B1 by the conductive trace 510 in FIG. 5A, which is disposed in the M0 layer that is, for illustration, a closest metal layer on the gate 410 and the conductive segment 413. Accordingly, compared to some approaches using elements in several stacked layers to implement a part of the connections in the IC 400 of FIG. 4A, the layout structure 500 is more easily implemented in fabrication of the IC 400, and the IC 400 including the layout structure 500 is able to be scaled down.

Figure 5B:
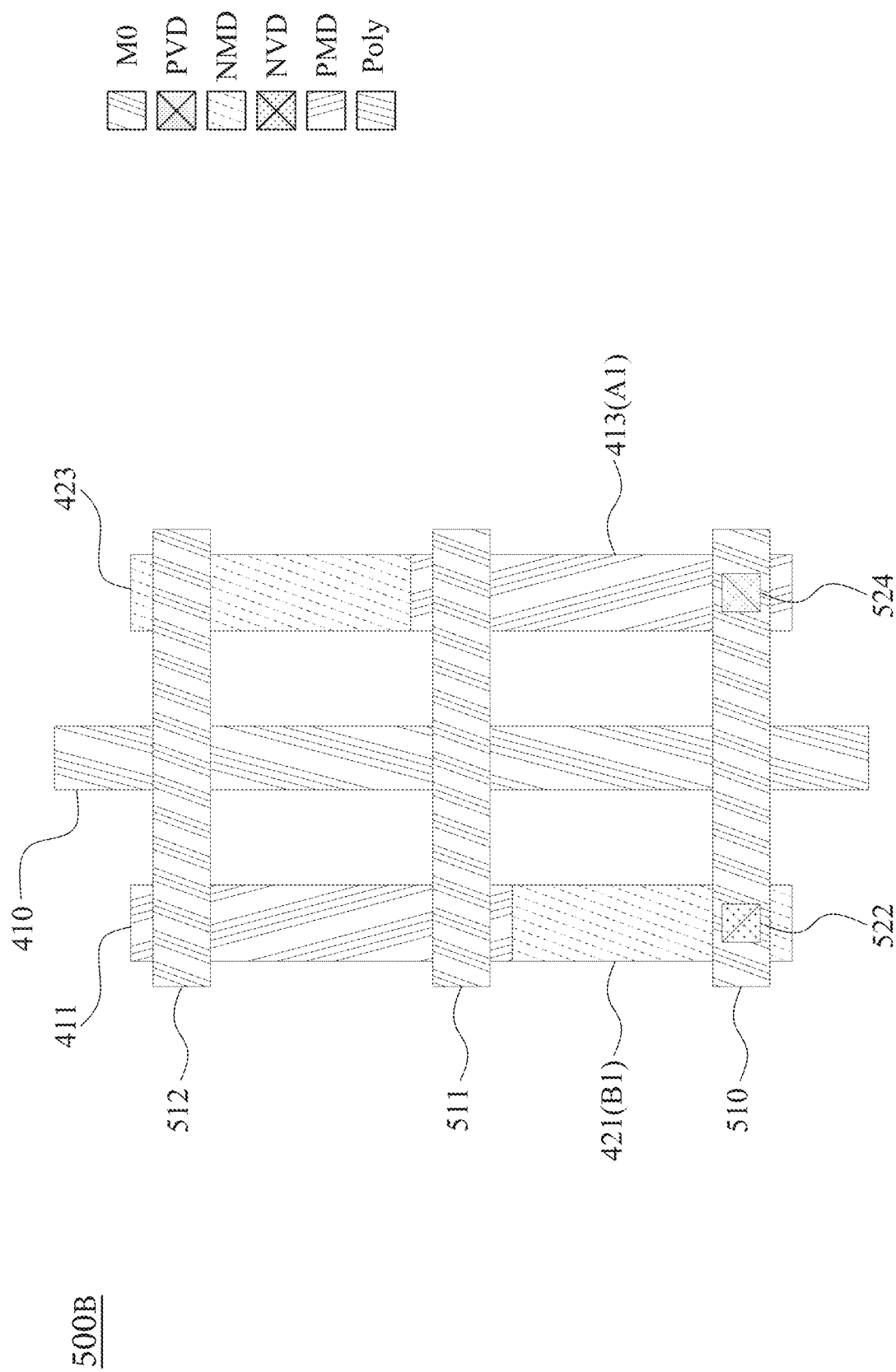
FIGS. 5B-5D depict layout diagrams corresponding to the layout structure illustrated in FIG. 5A, in accordance with some embodiments of the present disclosure.

FIG. 5B depicts a layout diagram 500B corresponding to the layout structure 500 illustrated in FIG. 5A, in accordance with some embodiments of the present disclosure. As illustrated in FIG. 5B, in a top view of the layout diagram 500B, the gate 410 corresponds to the Poly portion, the conductive trace 510 corresponds to the M0 portion, the vias 522 and 524 correspond to the NVD and PVD portions, respectively, and the conductive segments 421 and 413 correspond to the NMD and PMD portions, respectively. In the illustration of FIG. 5B, the PMD portion 413 indicating the node A1 is coupled, through the PVD 524 portion, the M0 portion 510, and the NVD portion 522, to the NMD portion 421 indicating the node B1.

The layout diagram 500B depicted in FIG. 5B includes three M0 portions extending across and above the Poly portion, in which one of the three M0 portions couples the NMD portion indicating the node B1 to the PMD portion indicating the node A1, as discussed above. The number of the M0 portions illustrated in FIG. 5B is given for illustrative purposes. Various numbers of the M0 portions illustrated in FIG. 5B are within the contemplated scope of the present disclosure. For example, various embodiments are discussed below with reference to FIGS. 5C and 5D.

Figure 5C:
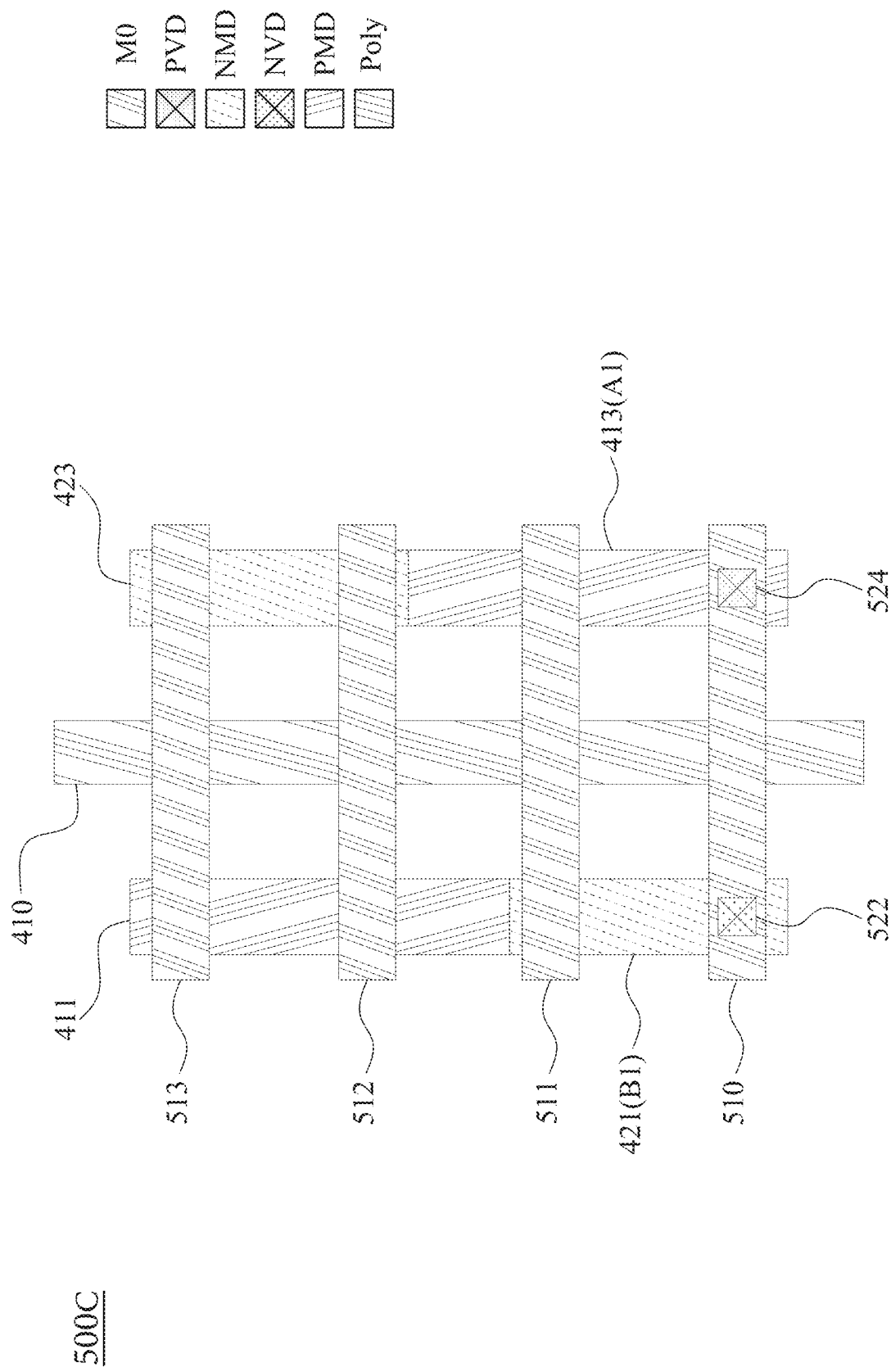
Figure 5D:
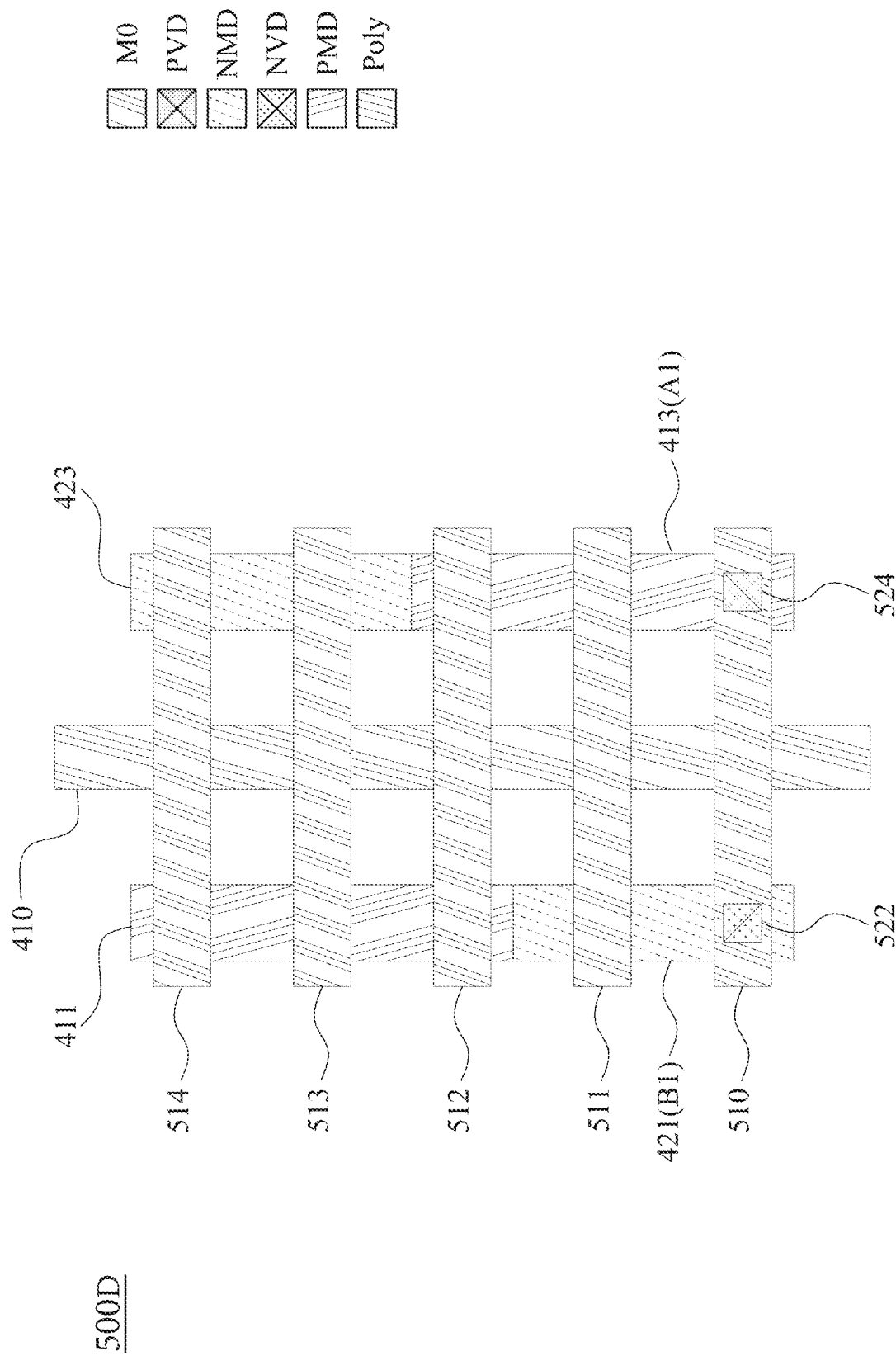

FIGS. 5C and 5D depict respective layout diagrams 500C and 500D corresponding to the layout structure 500 illustrated in FIG. 5A, in accordance with various embodiments of the present disclosure. In various embodiments, compared to the embodiments of FIG. 5B, the layout diagram 500C depicted in FIG. 5C includes four M0 portions 510-513 extending across and above the Poly portion, in which M0 portion 510 couples the NMD portion indicating the node B1 to the PMD portion indicating the node A1, as discussed above. In some embodiments, compared to the embodiments of FIG. 5B, the layout diagram 500D depicted in FIG. 5D includes five M0 portions 510-514 extending across and above the Poly portion, in which the M0 portion 510 couples the NMD portion 421 indicating the node B1 to the PMD portion 413 indicating the node A1, as discussed above.

Figure 6A:
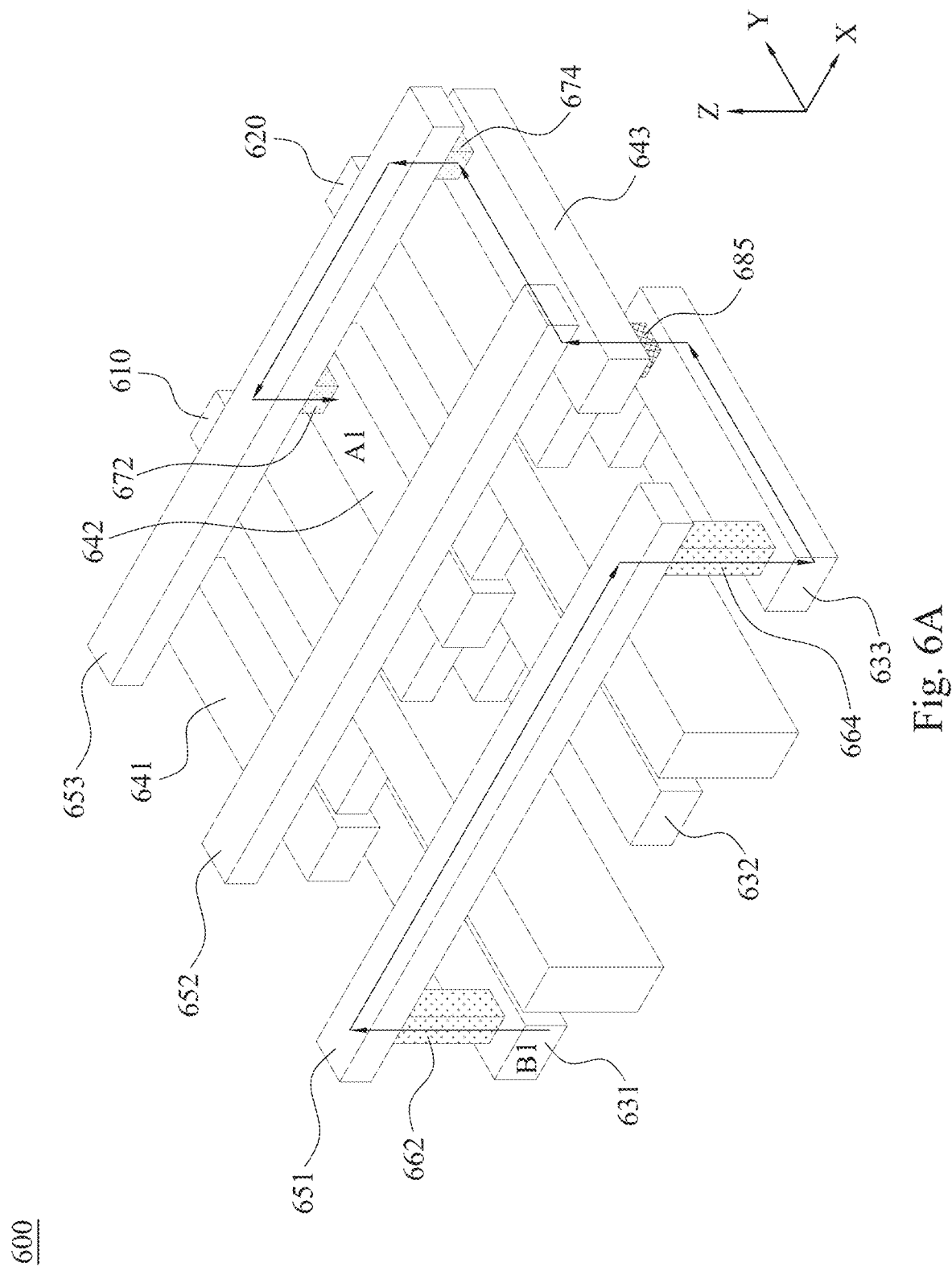
FIG. 6A is a schematic diagram of a perspective view of a layout structure corresponding to a portion of the IC of FIG. 4A, in accordance with some embodiments of the present disclosure.

FIG. 6A is a schematic diagram of a perspective view of a layout structure 600 corresponding to a portion of the IC 400 in FIG. 4A, in accordance with some embodiments of the present disclosure. The layout structure 600 corresponds to the PMOS transistor P1 and the NMOS transistor N1 illustrated in FIG. 4C, with the arrangements similar to those in FIG. 2B, and thus some corresponding portions of the layout structure 600 are not further detailed herein.

In the illustration of FIG. 6A with reference to FIG. 4A, the layout structure 600 includes gates 610 and 620, conductive segments 631-633 and 641-643, and conductive traces 651-653. The gates 610 and 620 are arranged to extend along, for illustration, the Y-axis direction. The conductive traces 651-653 are arranged to extend along, for illustration, the X-axis direction, above the gates 610 and 620. The conductive segments 631-633 are disposed in a first conductive layer, in which the conductive segments 631 and 632 are arranged as sources/drains of the NMOS transistor N1. The conductive segments 641-643 are disposed in a second conductive layer stacked on the first layer, in which the conductive segments 641 and 642 are arranged as sources/drains of the PMOS transistor P1. In some embodiments, the gate 620 is referred to as a dummy gate, in which in some embodiments, the "dummy" gate is referred to as being not electrically connected as the gate for MOS devices, having no function in the circuit.

The conductive segments 641-643 are disposed above and partially overlapped with the conductive segments 631-633, respectively. The gate 610 and the conductive segments 641 and 642 together correspond to the PMOS transistor P1. The gate 610 and the conductive segments 631 and 632 together correspond to the NMOS transistor N1. The conductive segment 642 also corresponds to the node A1 as discussed above with respect to FIG. 4A, and the conductive segment 631 also corresponds to the node B1 as discussed above with respect to FIG. 4A.

Compared to the layout structure 500 illustrated in FIG. 5A, in the illustration of FIG. 6A, the conductive segments 641 and 642 are arranged opposite to each other with respect to the gate 610. The conductive segments 631 and 632 are also arranged opposite to each other with respect to the gate 610. Moreover, the conductive segments 642 and 643 are arranged opposite to each other with respect to the gate 620, and the conductive segments 632 and 633 are arranged opposite to each other with respect to the gate 620.

As further illustrated in FIG. 6A, the layout structure 600 further includes vias 662, 664, 672, and 674, and a conductive local interconnect 685. The via 662 couples the conductive segment 631 to the conductive trace 651. The via 664 couples the conductive segment 633 to the conductive trace 651. The via 672 couples the conductive segment 642 to the conductive trace 653. The via 674 couples the conductive segment 643 to the conductive trace 653. The conductive local interconnect 685 couples the conductive segment 633 to the conductive segment 643. In some embodiments, heights of the vias 662 and 664 are greater than heights of the vias 672 and 674, for the conductive segments in different layers being coupled to the conductive traces in the same M0 layer, as discussed above. In some embodiments, a height of the conductive local interconnect 685 is different from the heights of the vias 662 and 664 and/or the vias 672 and 674.

To implement the connection ZA of the PMOS transistor P1 and the NMOS transistor N1 in FIG. 4A, as illustratively indicated by arrows in FIG. 6A, the conductive segment 631 corresponding to one source/drain of the NMOS transistor N1 is coupled, through the via 662, the conductive trace 651, the via 664, the conductive segment 633, the conductive local interconnect 685, the conductive segment 643, the via 674, the conductive trace 653, the via 672, to the conductive segment 642 corresponding to one source/drain of the PMOS transistor P1. Accordingly, the node A1 is coupled to the node B1 by the conductive traces 651 and 653, which are disposed in the M0 layer that is, for illustration, a closest metal layer on the gates 610 and 620 and the conductive segments 641-643.

Figure 6B:
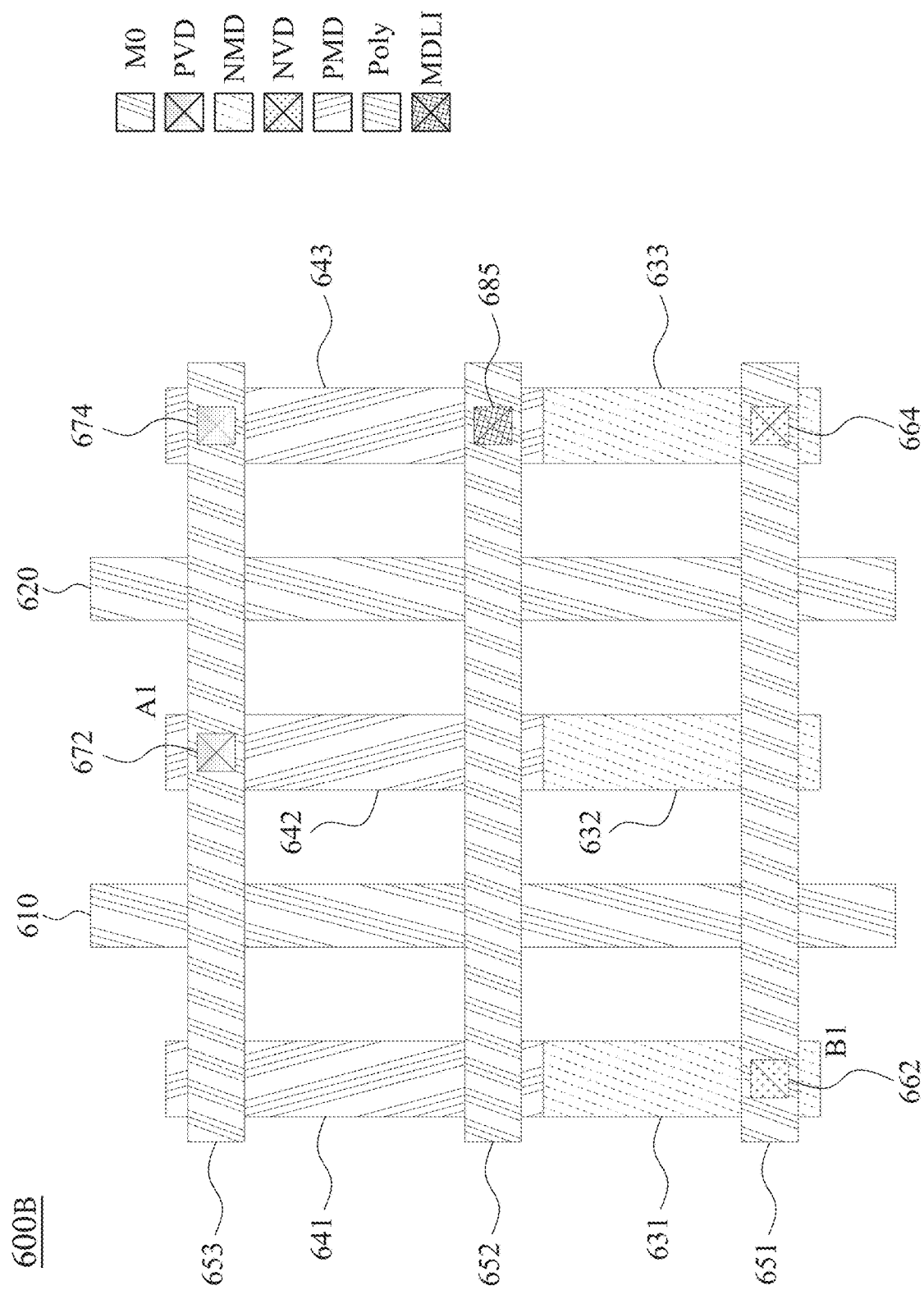
FIGS. 6B-6D depict layout diagrams corresponding to the layout structure illustrated in FIG. 6A, in accordance with some embodiments of the present disclosure.

FIG. 6B depicts a layout diagram 600B corresponding to the layout structure 600 illustrated in FIG. 6A, in accordance with some embodiments of the present disclosure. As illustrated in FIG. 6B, in a top view of the layout diagram 600B, the gates 610 and 620 correspond to different Poly portions, the conductive traces 651-653 correspond to different M0 portions, the vias 662 and 664 correspond to different NVD portions, the vias 672 and 674 correspond to different PVD portions, the conductive segments 631-633 correspond to different NMD portions, the conductive segments 641-643 correspond to different PMD portions, and the conductive local interconnect 685 corresponds to the MDLI portion. In the layout design of FIG. 6B, the first NMD portion (e.g., conductive segment 631) indicating the node B1 is coupled, sequentially through the first NVD portion (e.g., via 662), the first M0 portion (e.g., conductive trace 651), the second NVD portion (e.g., via 664), the second NMD portion (e.g., conductive segment 633), the MDLI portion (e.g., conductive local interconnect 685), the first PMD portion (e.g., conductive segment 643), the first PVD portion (e.g., via 674), the second M0 portion (e.g., conductive trace 653), the second PVD portion (e.g., via 672), to the second PMD portion (e.g., conductive segment 642) indicating the node A1.

The layout diagram 600B depicted in FIG. 6B includes three M0 portions extending across and above the Poly portions, in which two of the three M0 portions are coupled together to couple the NMD portion indicating the node B1 to the PMD portion indicating the node A1, as discussed above. The number of the M0 portions illustrated in FIG. 6B is given for illustrative purposes. Various numbers of the M0 portions illustrated in FIG. 6B are within the contemplated scope of the present disclosure. For example, various embodiments are discussed below with reference to FIGS. 6C and 6D.

Figure 6C:
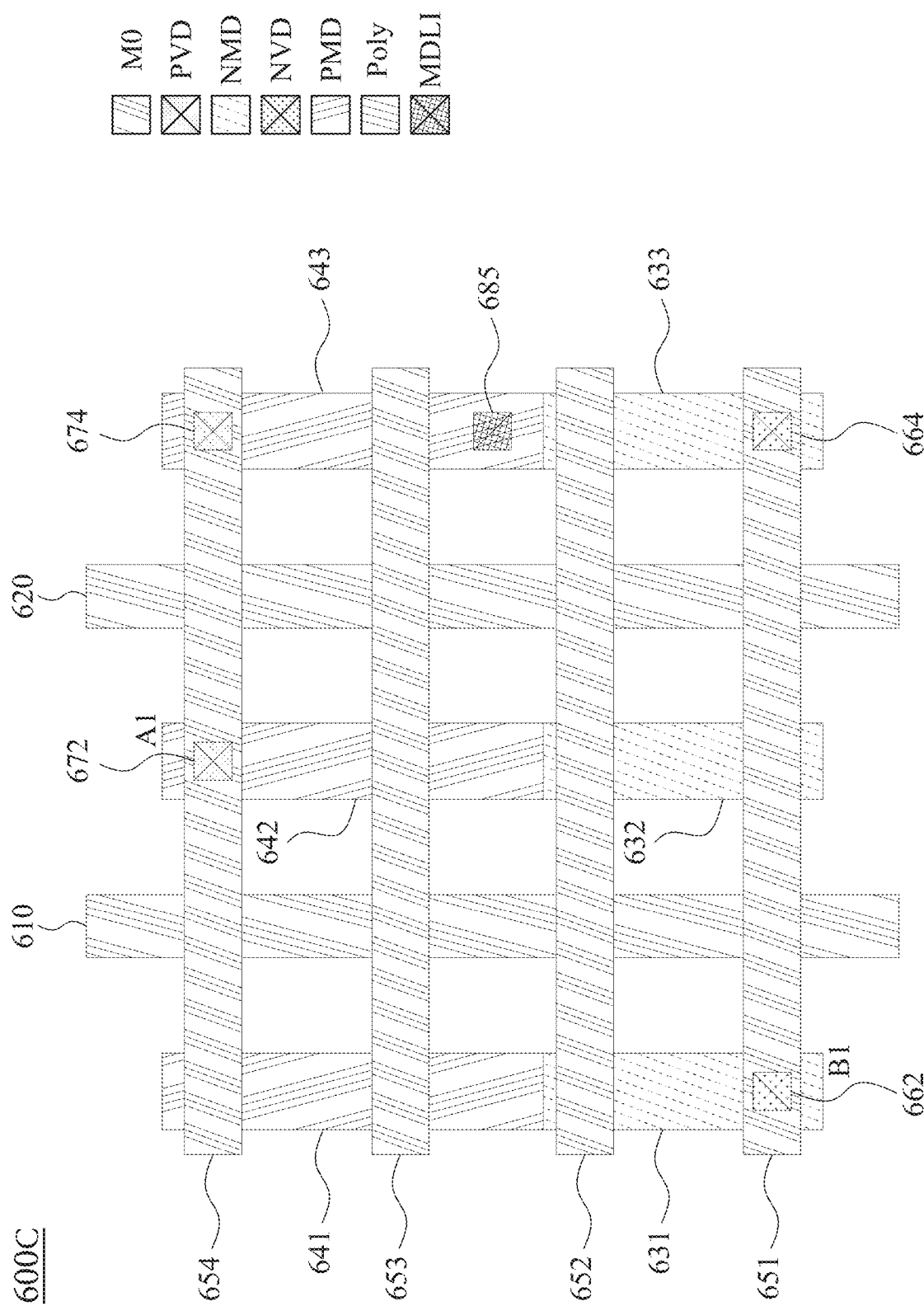
Figure 6D:
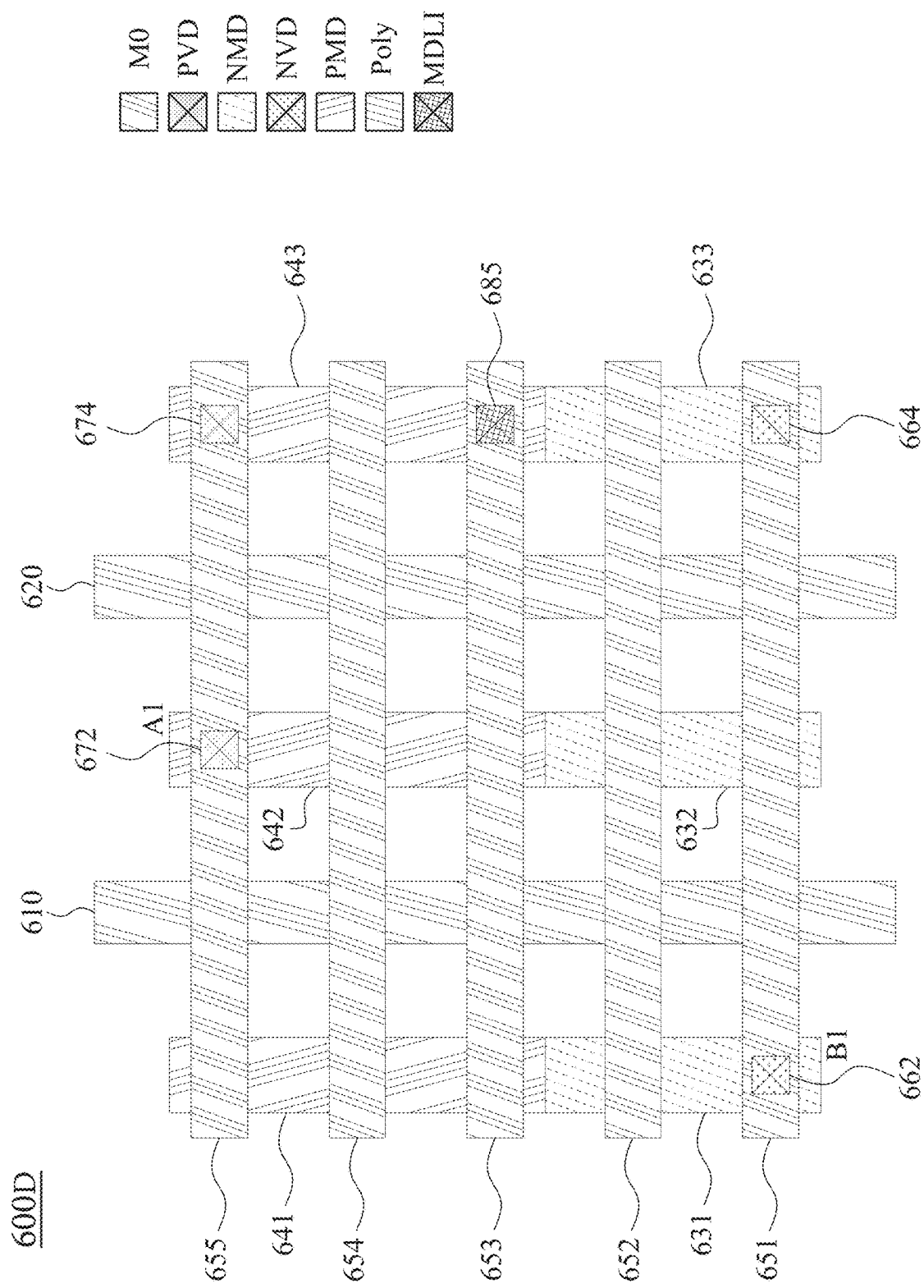

FIGS. 6C and 6D depict respective layout diagrams 600C and 600D based on the layout structure 600 illustrated in FIG. 6A, in accordance with various embodiments of the present disclosure. In various embodiments, compared to the embodiments of FIG. 6B, the layout diagram 600C depicted in FIG. 6C includes four M0 portions 651-654 extending across and above the Poly portions, in which the M0 portions 651 and 654 are coupled together to couple the NMD portion 631 indicating the node B1 to the PMD portion 642 indicating the node A1, as discussed above. In some embodiments, compared to the embodiments of FIG. 6B, the layout diagram 600D depicted in FIG. 6D includes five M0 portions 651-655 extending across and above the Poly portions, in which the M0 portions 651 and 655 are coupled together to couple the NMD portion 631 indicating the node B1 to the PMD portion 642 indicating the node A1, as discussed above.

Figure 7A:
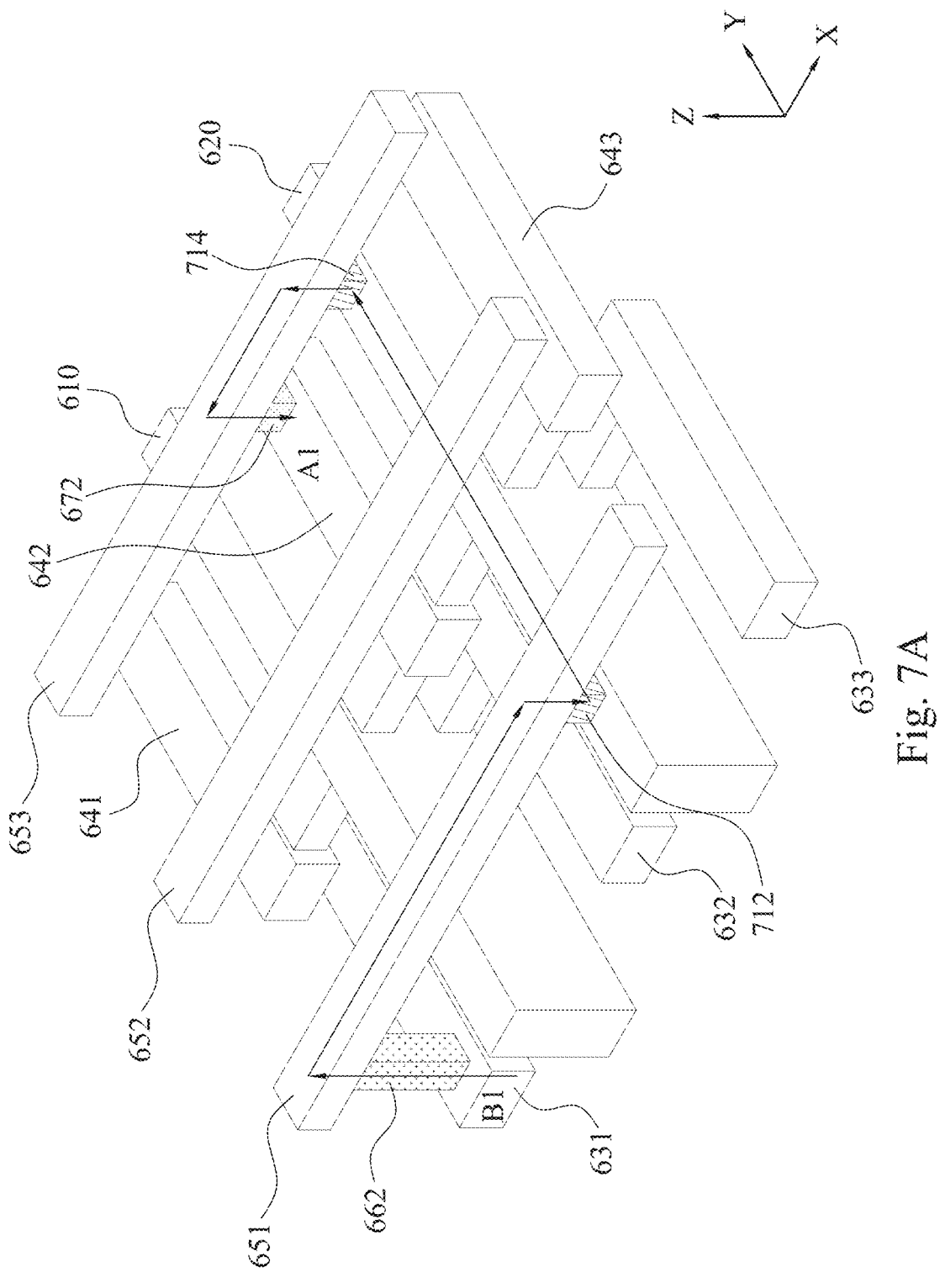
FIG. 7A is a schematic diagram of a perspective view of a layout structure corresponding to a portion of the IC in FIG. 4A, in accordance with various embodiments of the present disclosure.

FIG. 7A is a schematic diagram of a perspective view of a layout structure 700 corresponding to a portion of the IC 400 in FIG. 4A, in accordance with various embodiments of the present disclosure. The layout structure 700 corresponds to the PMOS transistor P1 and the NMOS transistor N1 illustrated in FIG. 4C, with the arrangements similar to those in FIG. 2B. The layout structure 700 also includes like portions corresponding to those in FIG. 6A, and thus the corresponding portions of the layout structure 700 are not further detailed herein.

In the illustration of FIG. 7A, compared to the embodiments of FIG. 6A, the vias 664 and 674 and the conductive local interconnect 685 are not included in the layout structure 700. The layout structure 700 further includes vias 712 and 714. The vias 712 and 714 are arranged on the gate 620 and couple the conductive traces 651 and 653, respectively, to the gate 620. In some embodiments, heights of the vias 712 and 714 are the same as the height of the via 672, and are different from the height of the via 662.

To implement the connection ZA of the PMOS transistor P1 and the NMOS transistor N1 in FIG. 4A, as illustratively indicated by arrows in FIG. 7A, the conductive segment 631 corresponding to one source/drain of the NMOS transistor N1 is coupled, through the via 662, the conductive trace 651, the via 712, the gate 620, the via 714, the conductive trace 653, the via 672, to the conductive segment 642 corresponding to one source/drain of the PMOS transistor P1. Accordingly, the node A1 is coupled to the node B1 by the gate 620 and the conductive traces 651 and 653.

Figure 7B:
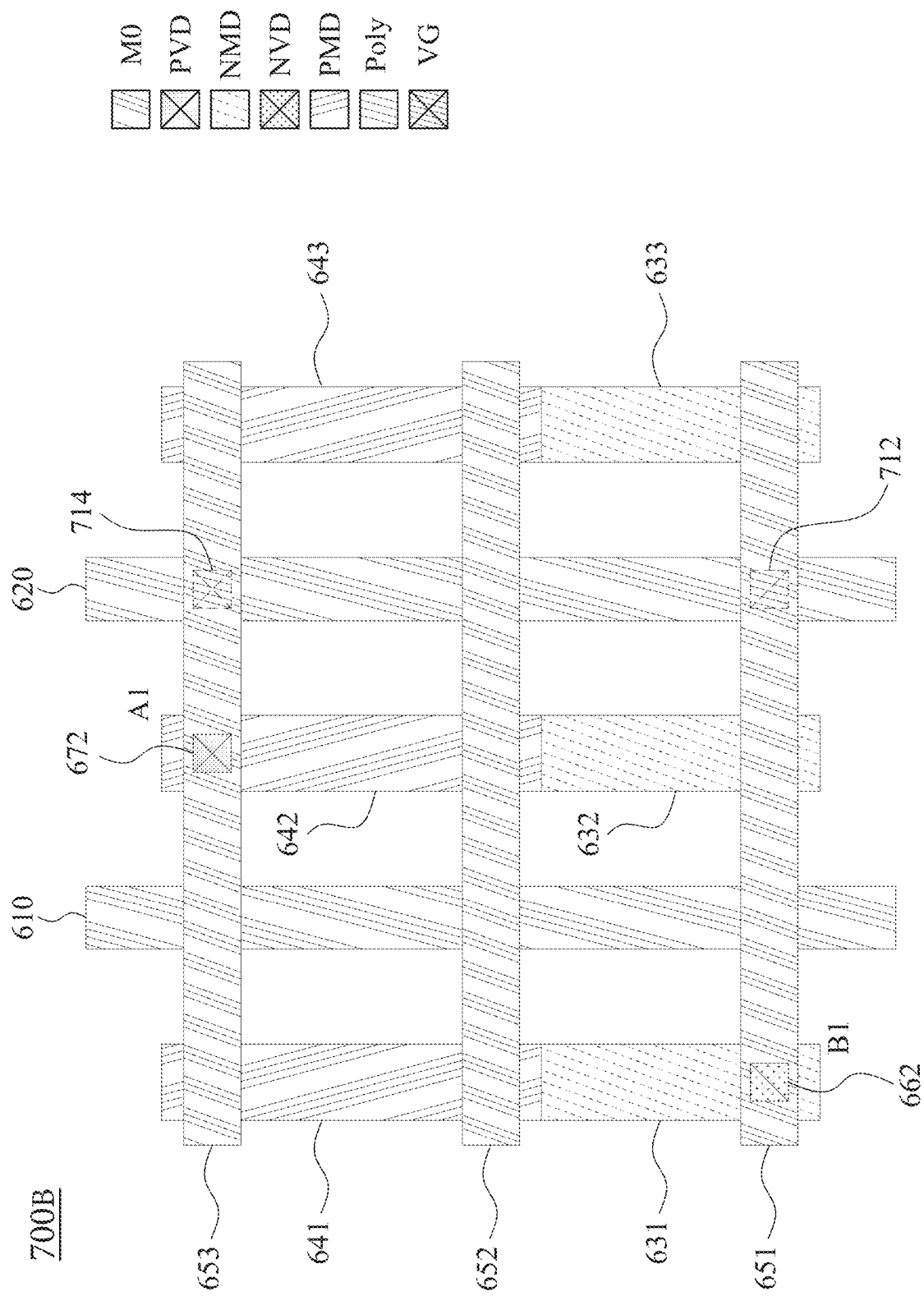
FIGS. 7B-7D depict layout diagrams corresponding to the layout structure illustrated in FIG. 7A, in accordance with some embodiments of the present disclosure.

FIG. 7B depicts a layout diagram 700B corresponding to the layout structure 700 illustrated in FIG. 7A, in accordance with some embodiments of the present disclosure. As illustrated in FIG. 7B, in a top view of the layout diagram 700B, compared to FIG. 6B, the vias 712 and 714 are included and correspond to different VG portions. In the layout diagram 700B of FIG. 7B, the NMD portion (e.g., conductive segment 631) indicating the node B1 is coupled, sequentially through the NVD portion (e.g., via 662), the first M0 portion (e.g., conductive trace 651), the first VG portion (e.g., via 712), the Poly portion (e.g., gate 620), the second VG portion (e.g., via 714), the second M0 portion (e.g., conductive trace 653), the PVD portion (e.g., via 672), to the PMD portion (e.g., conductive segment 642) indicating the node A1.

The layout diagram 700B depicted in FIG. 7B includes three M0 portions extending across and above the Poly portions, in which two of the three M0 portions are coupled together to couple the NMD portion indicating the node B1 to the PMD portion indicating the node A1, as discussed above. The number of the M0 portions illustrated in FIG. 7B is given for illustrative purposes. Various numbers of the M0 portions illustrated in FIG. 7B are within the contemplated scope of the present disclosure. For example, various embodiments are discussed below with reference to FIGS. 7C and 7D.

Figure 7C:
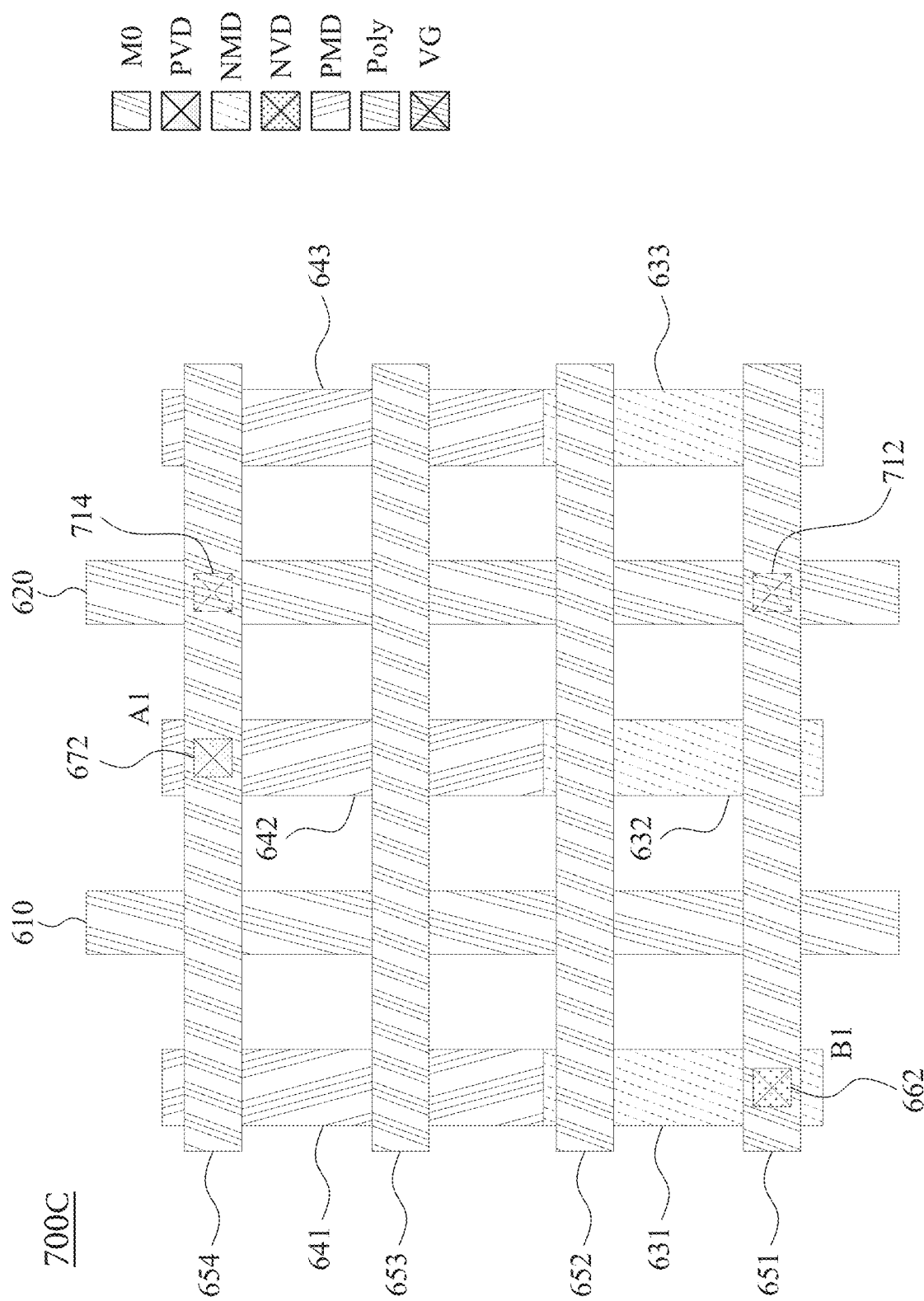
Figure 7D:
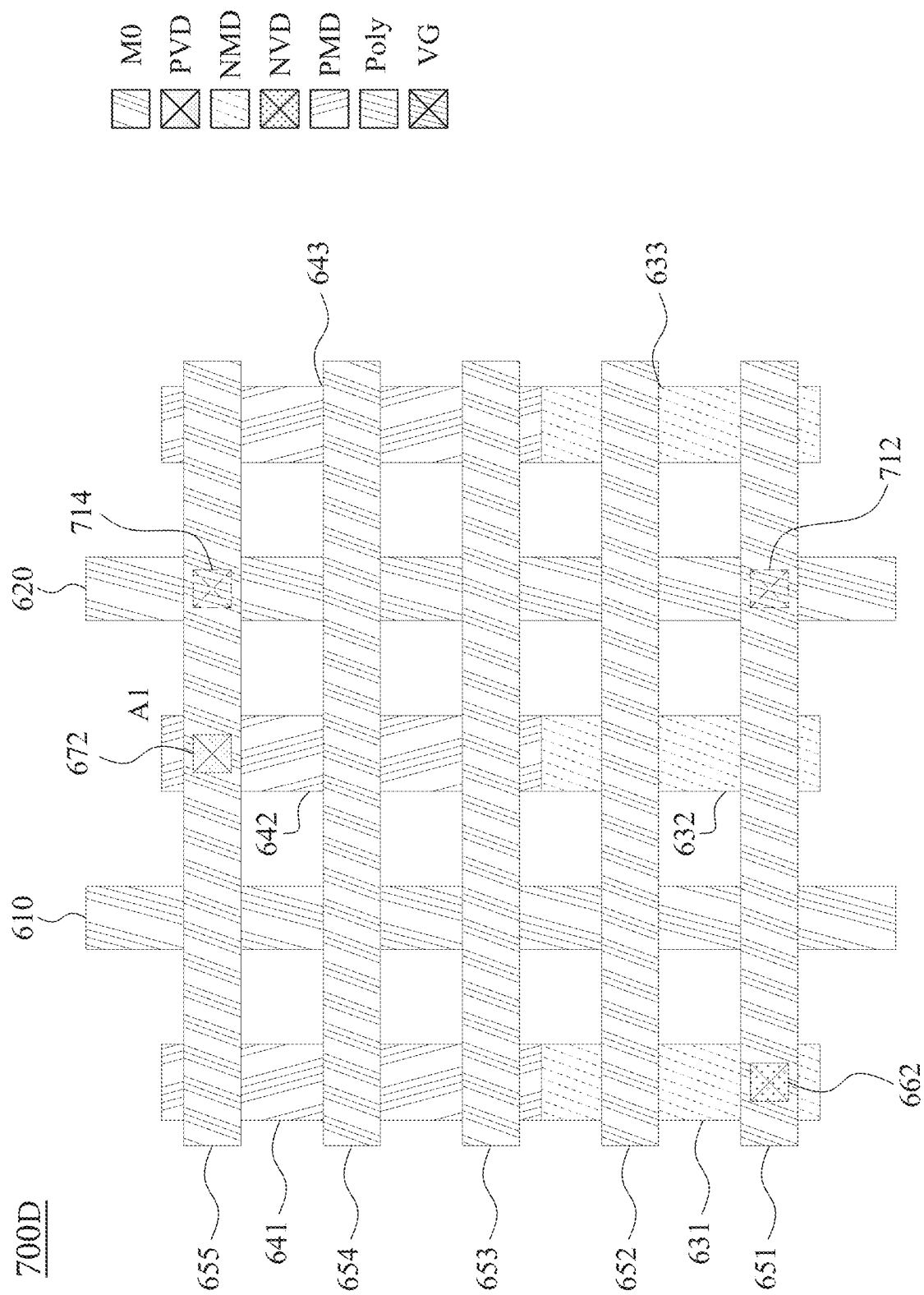

FIGS. 7C and 7D depict respective layout diagrams 700C and 700D based on the layout structure 700 illustrated in FIG. 7A, in accordance with various embodiments of the present disclosure. In various embodiments, compared to the embodiments of FIG. 7B, the layout diagram 700C depicted in FIG. 7C includes four M0 portions 651-654 extending across and above the Poly portions, in which the M0 portions 651 and 654 are coupled together to couple the NMD portion 631 indicating the node B1 to the PMD portion 642 indicating the node A1, as discussed above. In some embodiments, compared to the embodiments of FIG. 7B, the layout diagram 700D depicted in FIG. 7D includes five M0 portions 651-655 extending across and above the Poly portions, in which the M0 portions 651 and 655 are coupled together to couple the NMD portion 631 indicating the node B1 to the PMD portion 642 indicating the node A1, as discussed above.

Figure 8A:
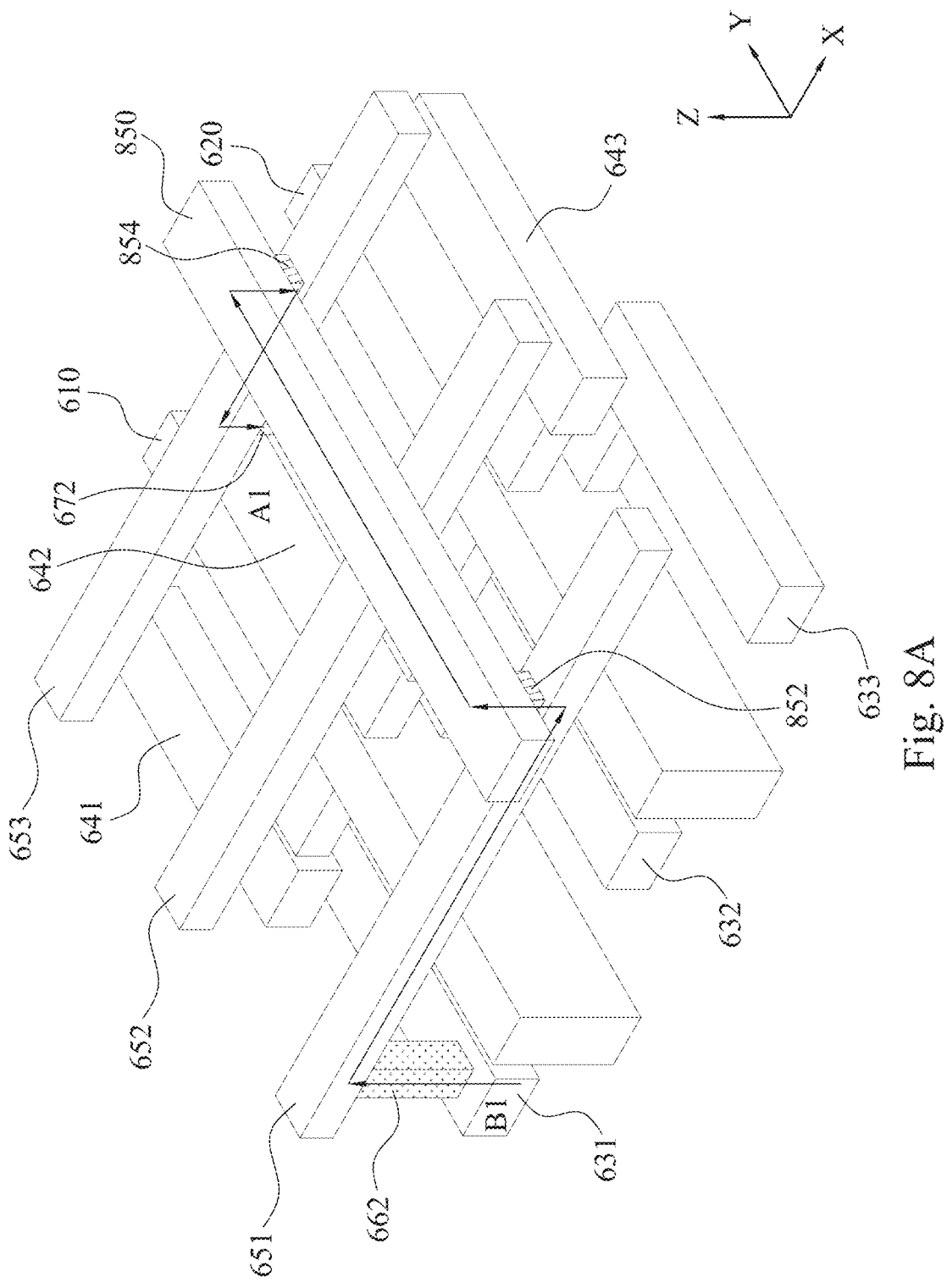
FIG. 8A is a schematic diagram of a perspective view of a layout structure corresponding to a portion of the IC in FIG. 4A, in accordance with various embodiments of the present disclosure.

FIG. 8A is a schematic diagram of a perspective view of a layout structure 800 corresponding to a portion of the IC 400 in FIG. 4A, in accordance with various embodiments of the present disclosure. The layout structure 800 corresponds to the PMOS transistor P1 and the NMOS transistor N1 illustrated in FIG. 4C, with the arrangements similar to those in FIG. 2B. The layout structure 800 also includes like portions corresponding to those in FIG. 7A, and thus the corresponding portions of the layout structure 800 are not further detailed herein.

In the illustration of FIG. 8A, compared to the embodiments of FIG. 7A, the vias 712 and 714 are not included in the layout structure 800. The layout structure 800 further includes a conductive trace 850 and vias 852 and 854. The conductive trace 850 is arranged to extend, for illustration, along the Y-axis direction, above and across the conductive traces 651-653. The vias 852 and 854 are disposed on the conductive traces 651 and 653, respectively. The vias 852 and 854 couple the conductive traces 651 and 653, respectively, to the conductive trace 850.

In some embodiments, the conductive trace 850 is disposed in a metal one (M1) layer in some embodiments, and accordingly, the conductive trace 850 is also referred to as an M1 portion in some embodiments. In some embodiments, heights of the vias 852 and 854 are the same as the height of the via 672. In some other embodiments, the heights of the vias 852 and 854 are different from the height of the via 672.

To implement the connection ZA of the PMOS transistor P1 and the NMOS transistor N1 in FIG. 4A, as illustratively indicated by arrows in FIG. 8A, the conductive segment 631 corresponding to one source/drain of the NMOS transistor N1 is coupled, through the via 662, the conductive trace 651, the via 852, the conductive trace 850, the via 854, the conductive trace 653, the via 672, to the conductive segment 642 corresponding to one source/drain of the PMOS transistor P1. Accordingly, the node A1 is coupled to the node B1 by the conductive traces 651 and 653 and the conductive trace 850 that is disposed above the conductive traces 651 and 653.

Figure 8B:
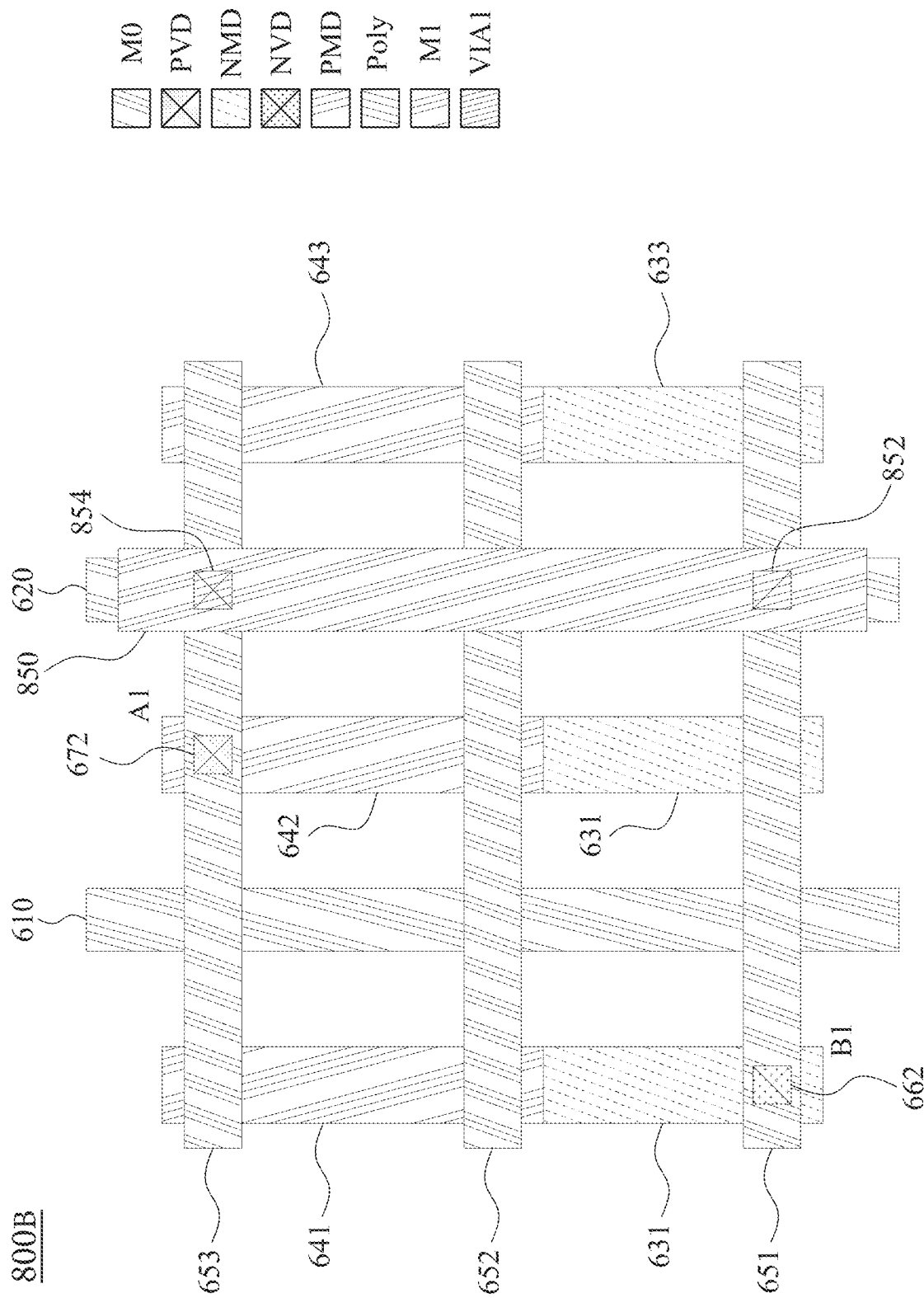
FIGS. 8B-8D depict layout diagrams corresponding to the layout structure illustrated in FIG. 8A, in accordance with some embodiments of the present disclosure.

FIG. 8B depicts a layout diagram 800B corresponding to the layout structure 800 illustrated in FIG. 8A, in accordance with some embodiments of the present disclosure. As illustrated in FIG. 8B, in a top view of the layout diagram 800B, compared to FIG. 7B, the vias 852 and 854 are included and correspond to different VIA1 portions. The conductive trace 850 corresponds to the M1 portion. In the layout design of FIG. 8B, the NMD portion (e.g., conductive segment 631) indicating the node B1 is coupled, sequentially through the NVD portion (e.g., via 662), the first M0 portion (e.g., conductive trace 651), the first VIA1 portion (e.g., via 852), the M1 portion (e.g., conductive trace 850), the second VIA1 portion (e.g., via 854), the second M0 portion (e.g., conductive trace 653), the PVD portion (e.g., via 672), to the PMD portion (e.g., conductive segment 642) indicating the node A1.

In some embodiments, the layout design in FIG. 8B includes three M0 portions extending across and above the Poly portions, in which two of the three M0 portions are coupled together to couple the NMD portion indicating the node B1 to the PMD portion indicating the node A1, as discussed above. The number of the M0 portions illustrated in FIG. 8B is given for illustrative purposes. Various numbers of the M0 portions illustrated in FIG. 8B are within the contemplated scope of the present disclosure. For example, various embodiments are discussed below with reference to FIGS. 8C and 8D.

Figure 8C:
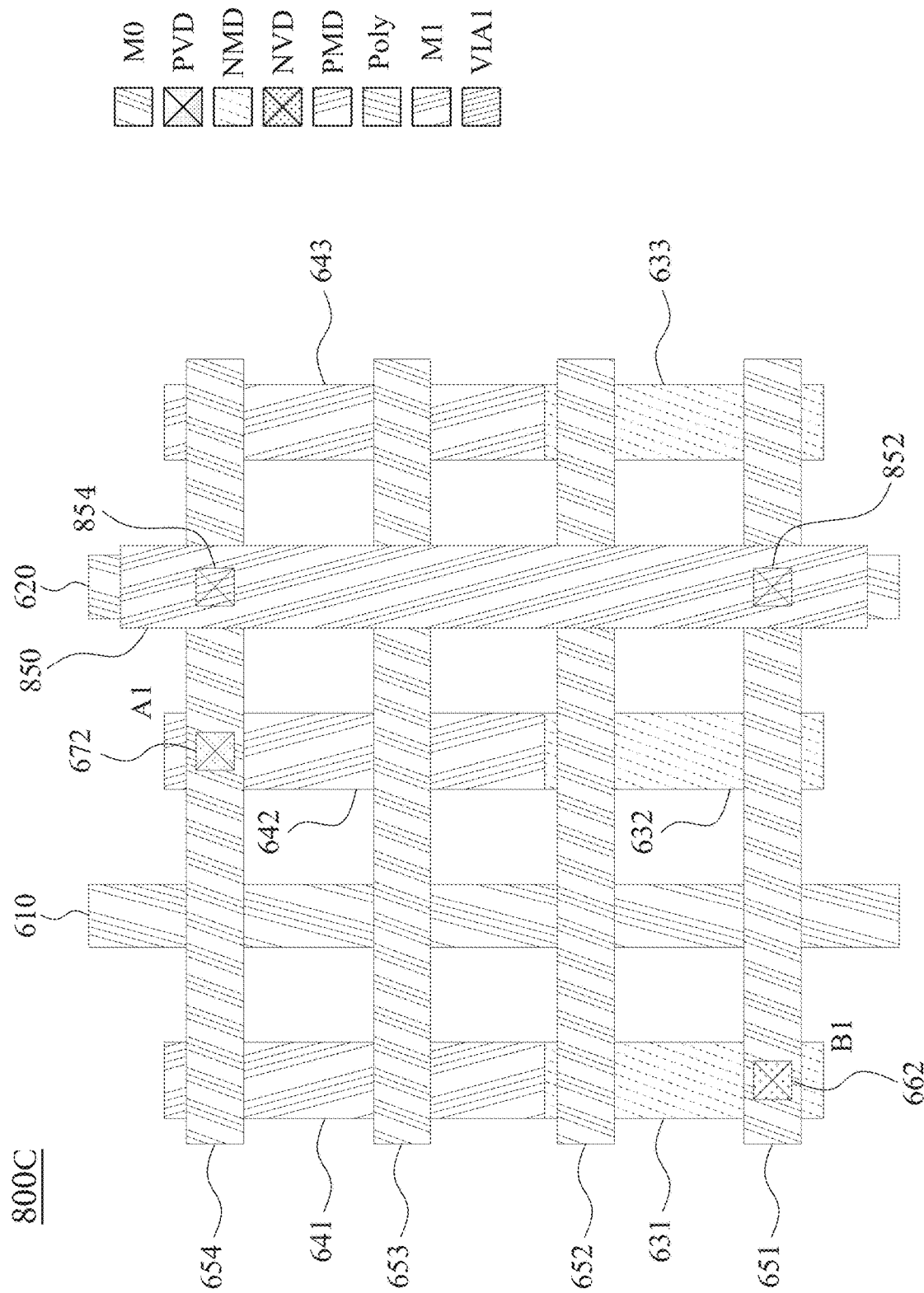
Figure 8D:
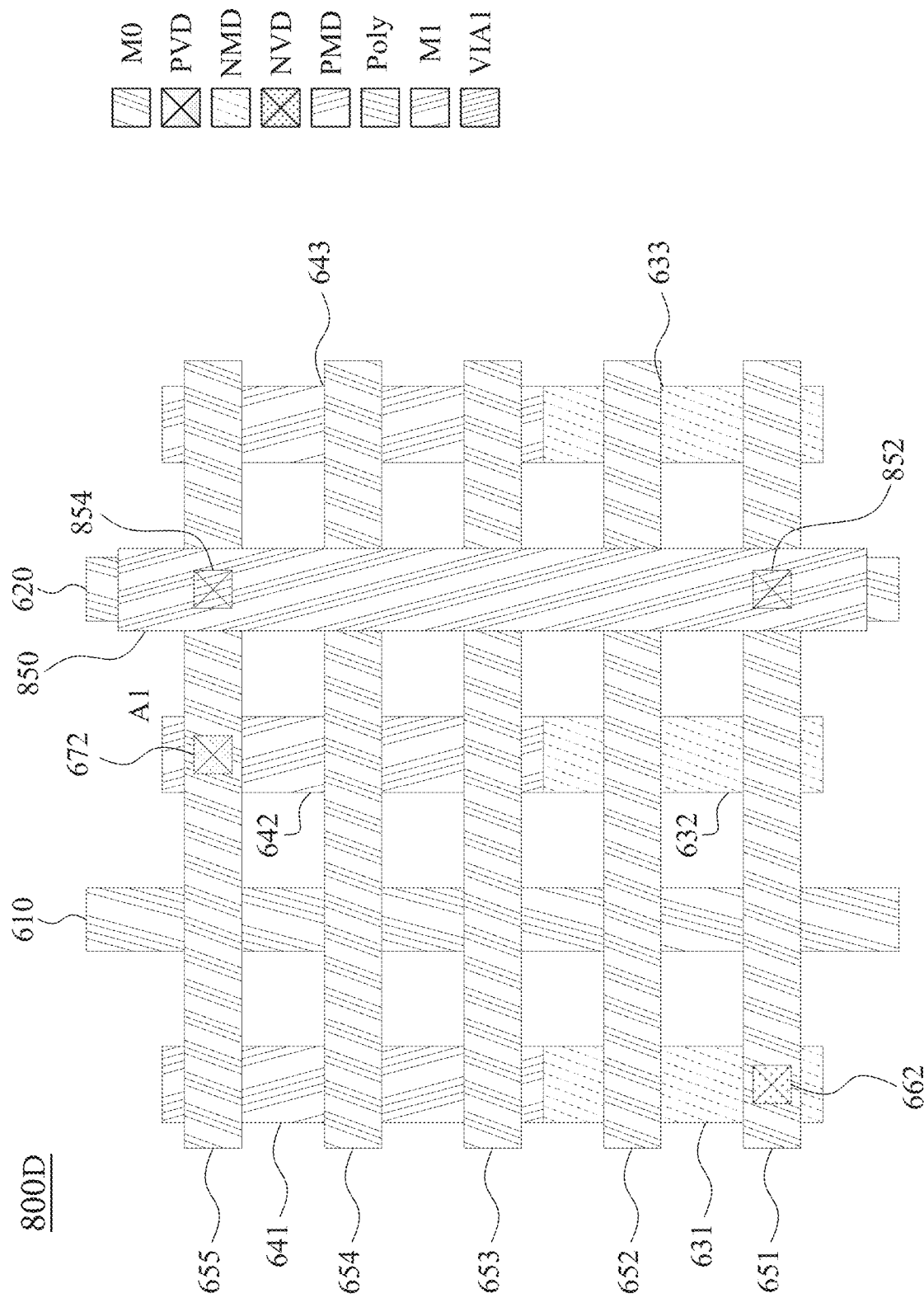

FIGS. 8C and 8D depict respective layout diagrams 800C and 800D based on the layout structure 800 illustrated in FIG. 8A, in accordance with various embodiments of the present disclosure. In various embodiments, compared to the embodiments of FIG. 8B, the layout diagram 800C depicted in FIG. 8C includes four M0 portions 651-654 extending across and above the Poly portions, in which M0 portions 651 and 654 are coupled together to couple the NMD portion 631 indicating the node B1 to the PMD portion 642 indicating the node A1, as discussed above. In some embodiments, compared to the embodiments of FIG. 8B, the layout diagram 800D depicted in FIG. 8D includes five M0 portions 651-655 extending across and above the Poly portions, in which M0 portions 651 and 655 are coupled together to couple the NMD portion 631 indicating the node B1 to the PMD portion 642 indicating the node A1, as discussed above.

Figure 9A:
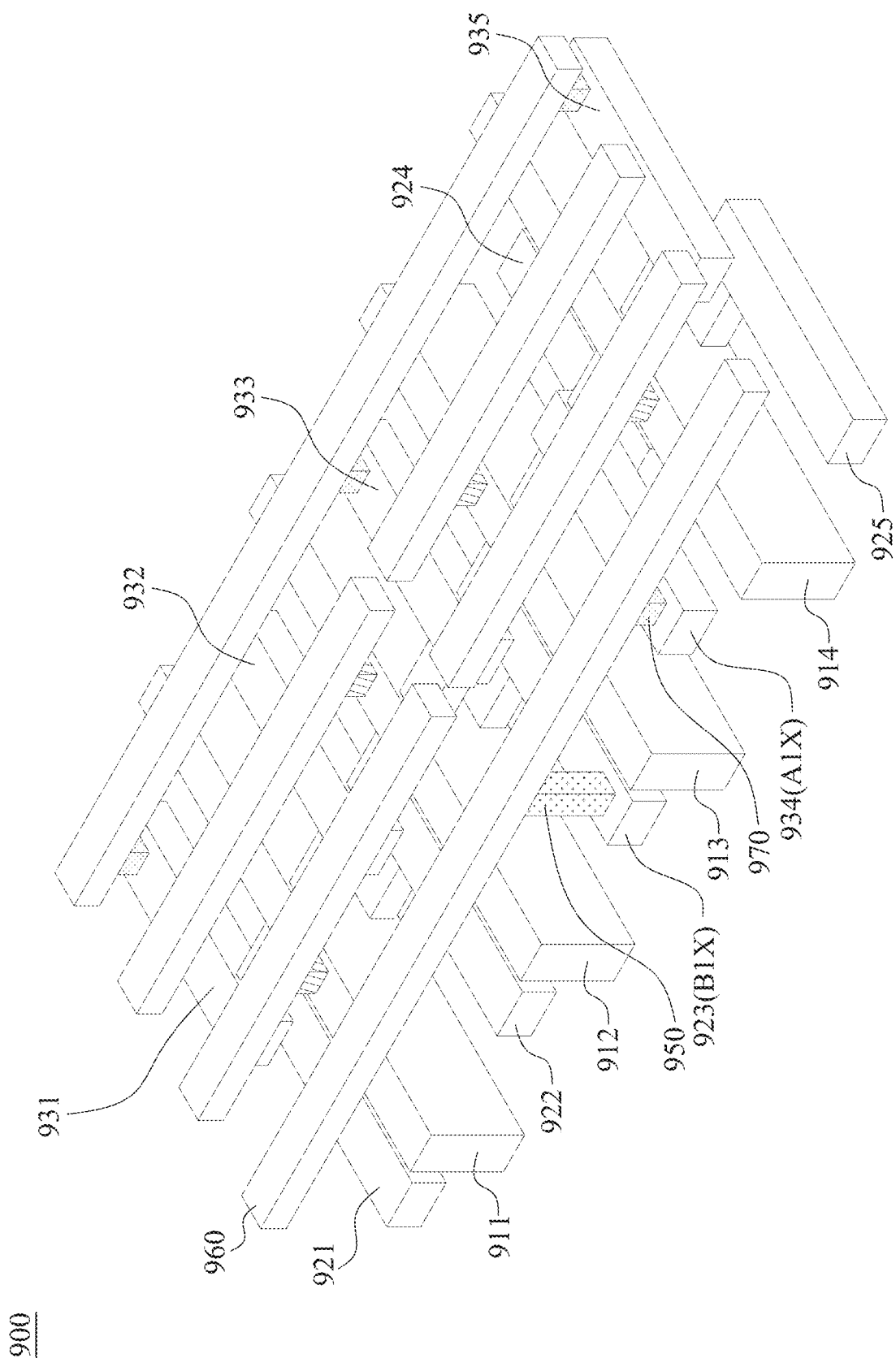
FIG. 9A is a schematic diagram of a perspective view of a layout structure corresponding to a gate circuit, in accordance with some embodiments of the present disclosure.

FIG. 9A is a schematic diagram of a perspective view of a layout structure 900 corresponding to a gate circuit, in accordance with some embodiments of the present disclosure. In some embodiments, the layout structure 900 corresponds to an AND-OR-INVERT-22 (AOI22) gate circuit. In some embodiments, the AOI22 gate circuit includes circuits having functions of two AND gates and a NOR gate. Alternatively stated, the two AND gates and the NOR gate together form a logical representation of the AOI22 gate circuit. Each AND gate includes two inputs and an output, the output of each AND gate being coupled to one of two inputs of the NOR gate.

In operation, a logic high input to the NOR gate causes the NOR gate to provide a logic low output. For one of the two AND gates to provide a logic high output, both inputs to that AND gate are logic high. A logic low input to one of the two AND gates causes that AND gate to provide a logic low output to the NOR gate and thus allows the other AND gate control the output of the NOR gate. Accordingly, the inputs to the AOI22 gate circuit are divided by the two AND gates, and are referred to as inputs to one AND gate and inputs to the other AND gate. In some embodiments, the AOI22 gate circuit is implemented by eight transistors, including, for illustration, four pairs of CFETs as discussed above.

In the embodiments of the AOI22 gate circuit being implemented by four pairs of CFETs, as discussed above, the layout structure 900 corresponding to four p-type FETs (not labeled) and four n-type FETs (not labeled) is given for illustration in FIG. 9A. As illustratively shown in FIG. 9A, the layout structure 900 includes gates 911-914 and conductive segments 921-925 and 931-935. For illustration, the gate 911 and the conductive segments 921 and 922 together correspond to a first n-type FET. The gate 912 and the conductive segments 922 and 923 together correspond to a second n-type FET. The gate 913 and the conductive segments 923 and 924 together correspond to a third n-type FET. The gate 914 and the conductive segments 924 and 925 together correspond to a fourth n-type FET. The gate 911 and the conductive segments 931 and 932 together correspond to a first p-type FET. The gate 912 and the conductive segments 932 and 933 together correspond to a second p-type FET. The gate 913 and the conductive segments 933 and 934 together correspond to a third p-type FET. The gate 914 and the conductive segments 934 and 935 together correspond to a fourth p-type FET. The conductive segment 924 is arranged to be located offset from the other conductive segments for the n-type FETs, and the conductive segment 934 is arranged to be located offset from the other conductive segments for the p-type FETs, in a top view of the layout structure 900.

The conductive segment 923 corresponding to one source/drain of each of the second and third n-type FETs also corresponds to a node B1X (similar to the node B1 in FIG. 4A) and is coupled, through a via 950, a conductive trace 960, and a via 970, to the conductive segment 934 corresponding to one source/drain of each of the third and fourth p-type FETs and to a node MX (similar to the node A1 in FIG. 4A), thereby being arranged similarly to the layout structure 500 as illustrated in FIG. 5A. By the configurations discussed above, the layout structure 900 supports electrical connections similar to those discussed above with respect to FIGS. 4A-4C, and is thereby capable of realizing the benefits discussed above with respect to the IC 400.

Figure 9B:
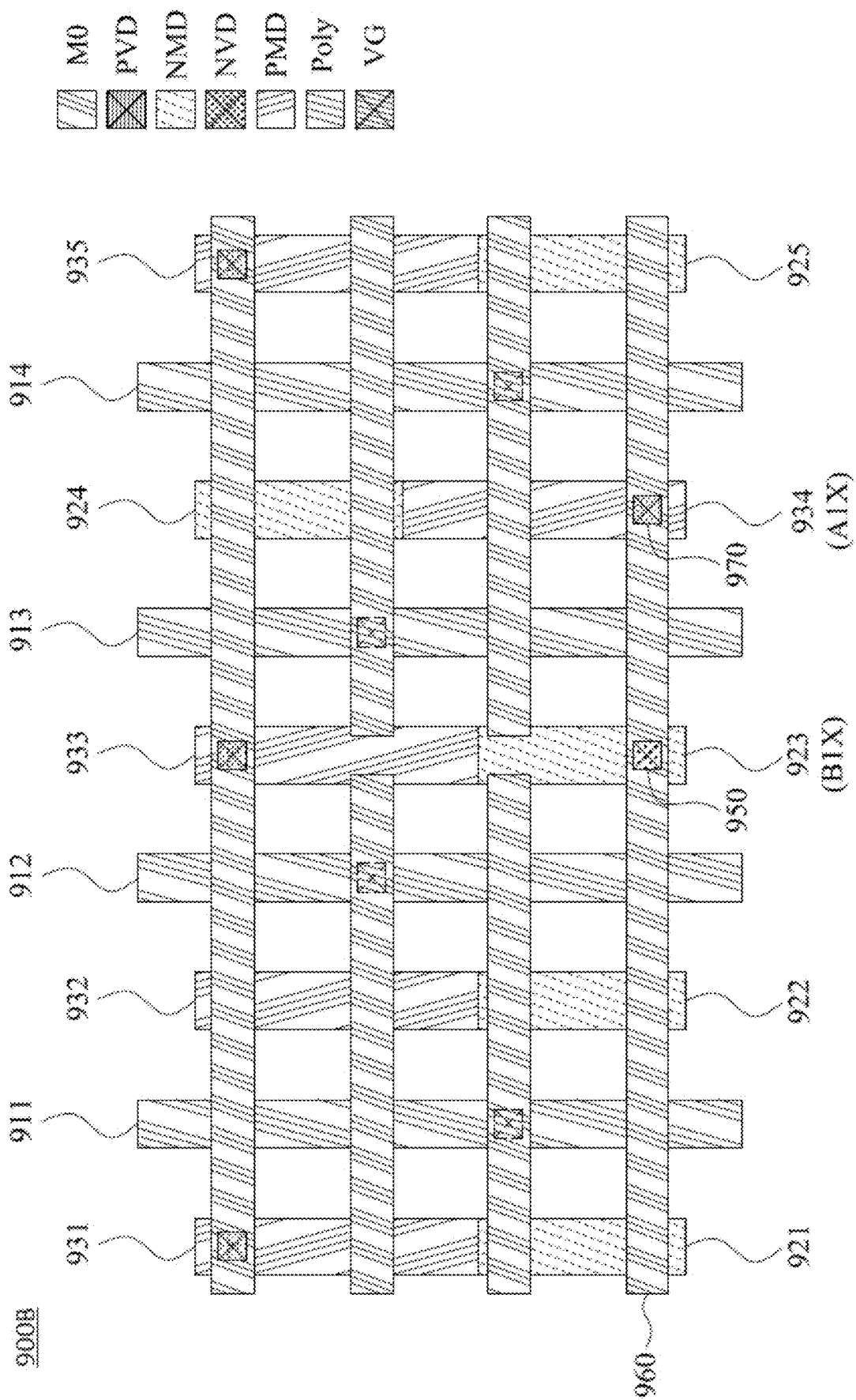
FIG. 9B depicts a layout diagram corresponding to the layout structure illustrated in FIG. 9A, in accordance with some embodiments of the present disclosure.

FIG. 9B depicts a layout diagram 900B corresponding to the layout structure 900 illustrated in FIG. 9A, in accordance with some embodiments of the present disclosure. As illustrated in FIG. 9B, in a top view of the layout diagram 900B, the gates 911-914 correspond to different Poly portions, the conductive trace 960 corresponds to the M0 portion, the vias 950 and 970 correspond to the NVD and PVD portions, respectively, the conductive segments 921-925 correspond to different NMD portions, the conductive segments 931-935 correspond to different PMD portions. In the layout diagram 900B of FIG. 9B, the first NMD portion (e.g., conductive segment 923) indicating the node B1X is coupled, sequentially through the NVD portion (e.g., via 950), the M0 portion (e.g., conductive trace 960), the PVD portion (e.g., via 970), to the PMD portion (e.g., conductive segment 934) indicating the node MX.

The layout structure 900 illustrated in FIG. 9A and the corresponding layout diagram 900B illustrated in FIG. 9B, as discussed above, used to implement the AOI22 gate circuit, are given for illustrative purposes. Various layout structures and designs are within the contemplated scope of the present disclosure. For example, each one of the layout structures 600, 700, and 800 and the corresponding layout design is able to be implemented in the AOI22 gate circuit as discussed above.

Figure 10:
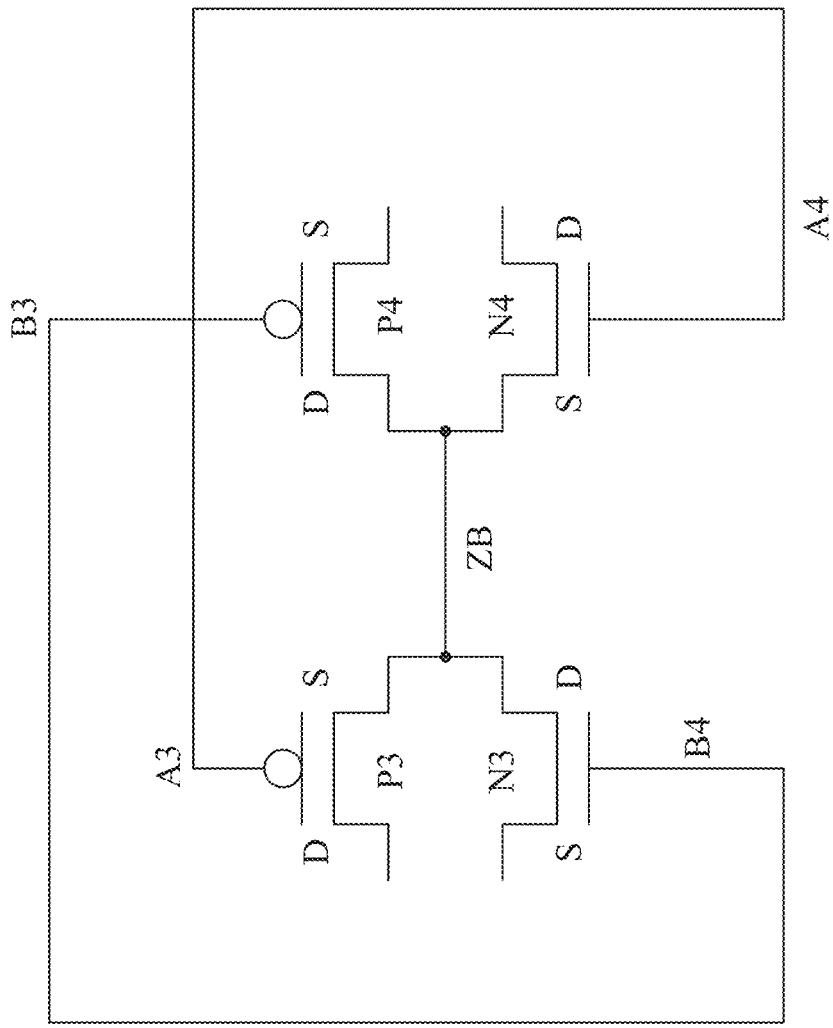
FIG. 10 is a circuit diagram of a transmission gate circuit, in accordance with some embodiments of the present disclosure.

FIG. 10 is a circuit diagram of a transmission gate circuit 1000, in accordance with some embodiments of the present disclosure. In the illustration of FIG. 10, a PMOS transistor P3 includes a gate terminal A3, a drain (D) terminal and a source (S) terminal. An NMOS transistor N3 includes a gate terminal B4, a D terminal and an S terminal. The S terminal of the PMOS transistor P3 is coupled to the D terminal of the NMOS transistor N3 to form a first transistor pair. A PMOS transistor P4 includes a gate terminal B3, a D terminal and an S terminal. An NMOS transistor N4 includes a gate terminal A4, a D terminal and an S terminal. The D terminal of the PMOS transistor P4 is coupled to the S terminal of the NMOS transistor N4 to form a second transistor pair.

The gate terminal A3 of the PMOS transistor P3 is coupled to the gate terminal A4 of the NMOS transistor N4. The gate terminal B3 of the PMOS transistor P4 is coupled to the gate terminal B4 of the NMOS transistor N3. The S terminal of the PMOS transistor P3 and the D terminal of the NMOS transistor N3 are coupled to the D terminal of the PMOS transistor P4 and the S terminal of the NMOS transistor N4, to indicate a connection ZB as shown in FIG. 10, in order to operate as a transmission gate circuit 1000. In some embodiments, the transmission gate circuit 1000 is in a single cell. To implement the transmission gate circuit 1000 including the connection ZB in the embodiments of the present disclosure, embodiments of layout designs and/or structures are provided as discussed in more detail below.

Figure 11A:
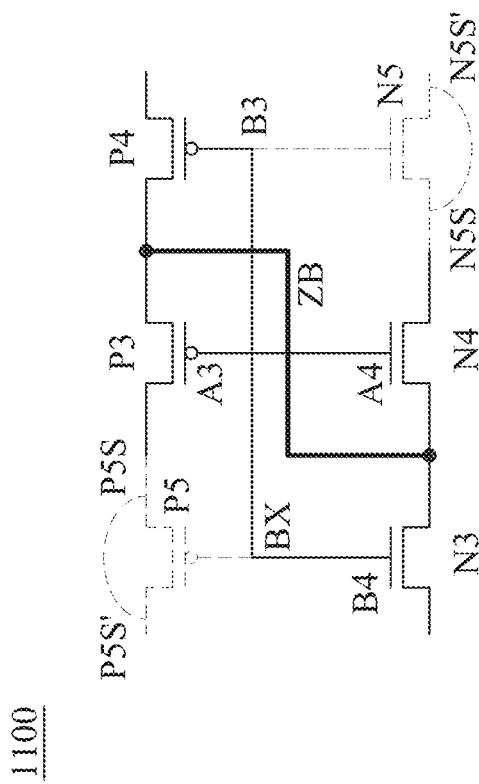
FIG. 11A is a circuit diagram of an IC equivalent to the transmission gate circuit of FIG. 10, in accordance with some embodiments of the present disclosure.

FIG. 11A is a circuit diagram of an IC 1100 equivalent to the transmission gate circuit 1000 in FIG. 10, in accordance with some embodiments of the present disclosure. In the illustration of FIG. 11A, compared to FIG. 10, the IC 1100 further includes a PMOS transistor P5 and an NMOS transistor N5. A gate terminal (not labeled) of the PMOS transistor P5 is coupled to the gate terminal B4 of the NMOS transistor N3 and a gate terminal (not labeled) of the NMOS transistor N5 is coupled to the gate terminal B3 of the PMOS transistor P4. A source terminal (not labeled) of the PMOS transistor P5 is coupled to the drain terminal of the PMOS transistor P3. A source terminal (not labeled) of the NMOS transistor N5 is coupled to the drain terminal of the NMOS transistor N4. The source and drain terminals of the PMOS transistor P5, corresponding to nodes P5S and P5S', are coupled together in a short-circuit configuration such that the PMOS transistor P5 is inoperative. The source and drain of the NMOS transistor N5, corresponding to nodes N5S and N5S', are coupled together in a short-circuit configuration such that the NMOS transistor N5 is inoperative. With the connections of the PMOS transistors P3-P5 and the NMOS transistors N3-N5, as illustrated in FIG. 11A, the IC 1100 is able to operate as a circuit equivalent to the transmission gate circuit 1000 in FIG. 10.

Figure 11B:
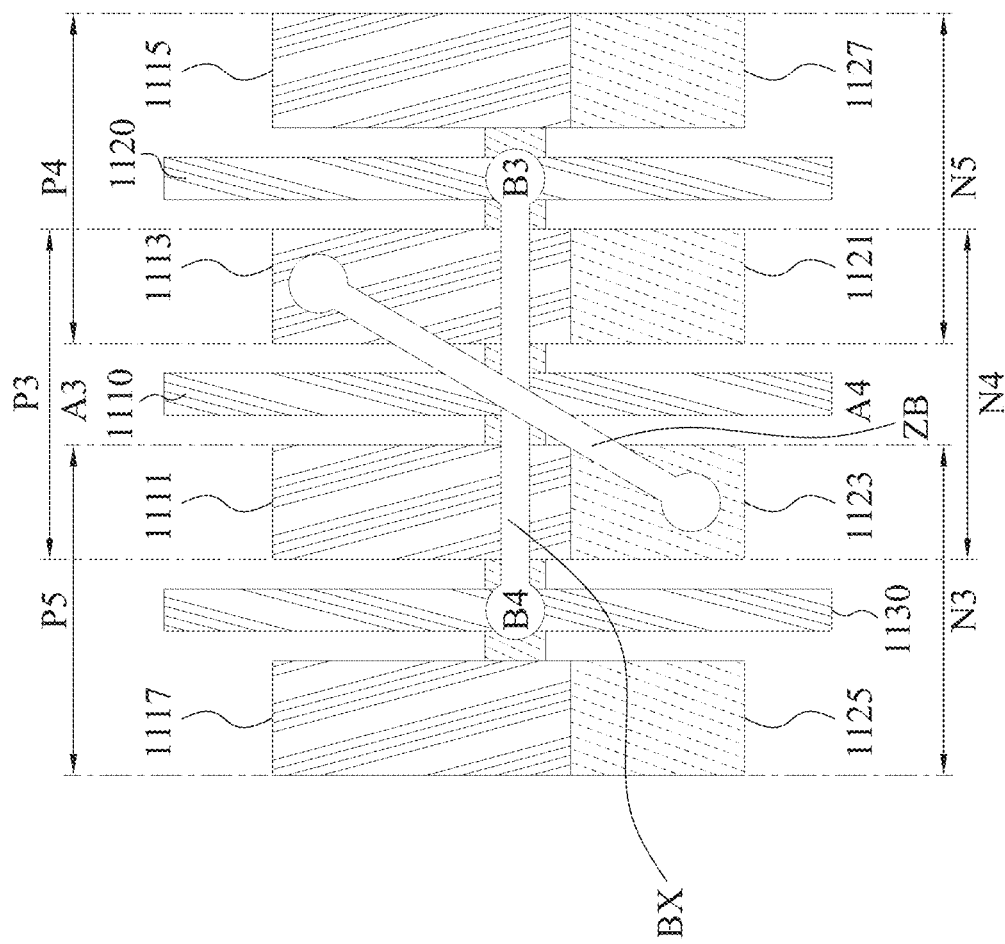
FIG. 11B depicts a layout diagram corresponding to the IC of FIG. 11A, in accordance with some embodiments of the present disclosure.

FIG. 11B depicts a layout diagram 1100B corresponding to the IC 1100 of FIG. 11A, in accordance with some embodiments of the present disclosure. In the embodiment of FIG. 11B, the PMOS transistors P3-P5 of FIG. 11A are configured to be stacked on the NMOS transistors N3-N5 of FIG. 11A. For illustration, with the PMD portions being disposed above and partially overlapped with the NMD portions, respectively, the PMOS transistors P3-P5 are stacked on the NMOS transistors N3-N5. In some embodiments, the PMOS transistors P3-P5 of FIG. 11A are stacked under the NMOS transistors N3-N5.

In the illustration of FIG. 11B, gates 1110, 1120, and 1130 are arranged to extend in a predetermined direction (not labeled). Conductive segments 1111, 1113, 1115, and 1117 are arranged, in a first conductive layer, as sources/drains of the PMOS transistors P3-P5. The gate 1110 and the conductive segments 1111 and 1113 together correspond to the PMOS transistor P3. The gate 1120 and the conductive segments 1113 and 1115 together correspond to the PMOS transistor P4. The gate 1130 and the conductive segments 1111 and 1117 together correspond to the PMOS transistor P5. In such embodiments, the PMOS transistors P3 and P4 share the conductive segment 1113, which corresponds to the PMOS transistors P3 and P4 being coupled to each other, and the PMOS transistors P3 and P5 share the conductive segment 1111, which corresponds to the PMOS transistors P3 and P5 being coupled to each other.

As further illustrated in FIG. 11B, conductive segments 1121, 1123, 1125, and 1127 are arranged, in a second conductive layer stacked under the first layer in which the conductive segments 1111, 1113, 1115, and 1117 are arranged, as sources/drains of the NMOS transistors N3-N5. The gate 1110 and the conductive segments 1121 and 1123 together correspond to the NMOS transistor N4. The gate 1130 and the conductive segments 1123 and 1125 together correspond to the NMOS transistor N3. The gate 1120 and the conductive segments 1121 and 1127 together correspond to the NMOS transistor N5. In such embodiments, the NMOS transistors N3 and N4 share the conductive segment 1123, which corresponds to the NMOS transistors N3 and N4 being coupled to each other, and the NMOS transistors N4 and N5 share the conductive segment 1121, which corresponds to the NMOS transistors N4 and N5 being coupled to each other.

As illustrated in FIG. 11B, the layout diagram 1100B of the PMOS transistor P5 together with the NMOS transistor N3 corresponds to the layout structure illustrated in FIG. 2B, and the layout design of the PMOS transistor P4 together with the NMOS transistor N5 corresponds to the layout structure illustrated in FIG. 2D. The layout diagram 1100B illustrated in FIG. 11B is given for illustrative purposes. Various layout designs for the IC 1100 of FIG. 11A are within the contemplated scope of the present disclosure. For example, in various embodiments, the layout design of the PMOS transistor P5 together with the NMOS transistor N3 corresponds to the layout structure as illustrated in FIG. 2A, and the layout design of the PMOS transistor P4 together with the NMOS transistor N5 corresponds to the layout structure as illustrated in FIG. 2C.

For illustration, the gate 1110 corresponds to the gate terminal A3 of the PMOS transistor P3 and the gate terminal A4 of the NMOS transistor N4, the gate 1120 corresponds to the gate terminal B3 of the PMOS transistor P4, and the gate 1130 corresponds to the gate terminal B4 of the NMOS transistor N3. In such embodiments, the PMOS transistor P3 and the NMOS transistor N4 share the gate 1110, which corresponds to the connection of the gate terminals A3 and A4 as shown in FIG. 11A. The conductive segment 1113 is coupled to the conductive segment 1123, which corresponds to the connection ZB shown in FIG. 11A. The gate 1120 is coupled to the gate 1130, which corresponds to a connection BX of the gate terminals B1 and B2 as shown in FIG. 11A.

To realize the concepts as discussed above with respect to FIG. 11B, layout structures for the IC 1100 are illustrated in FIGS. 12A, 13A, 14A, 15A, 16A, and 17A. Layout diagrams corresponding to these layout structures are also illustrated in corresponding FIGS. 12B, 13B, 14B, 15B, 16B, and 17B, each discussed below.

Figure 12A:
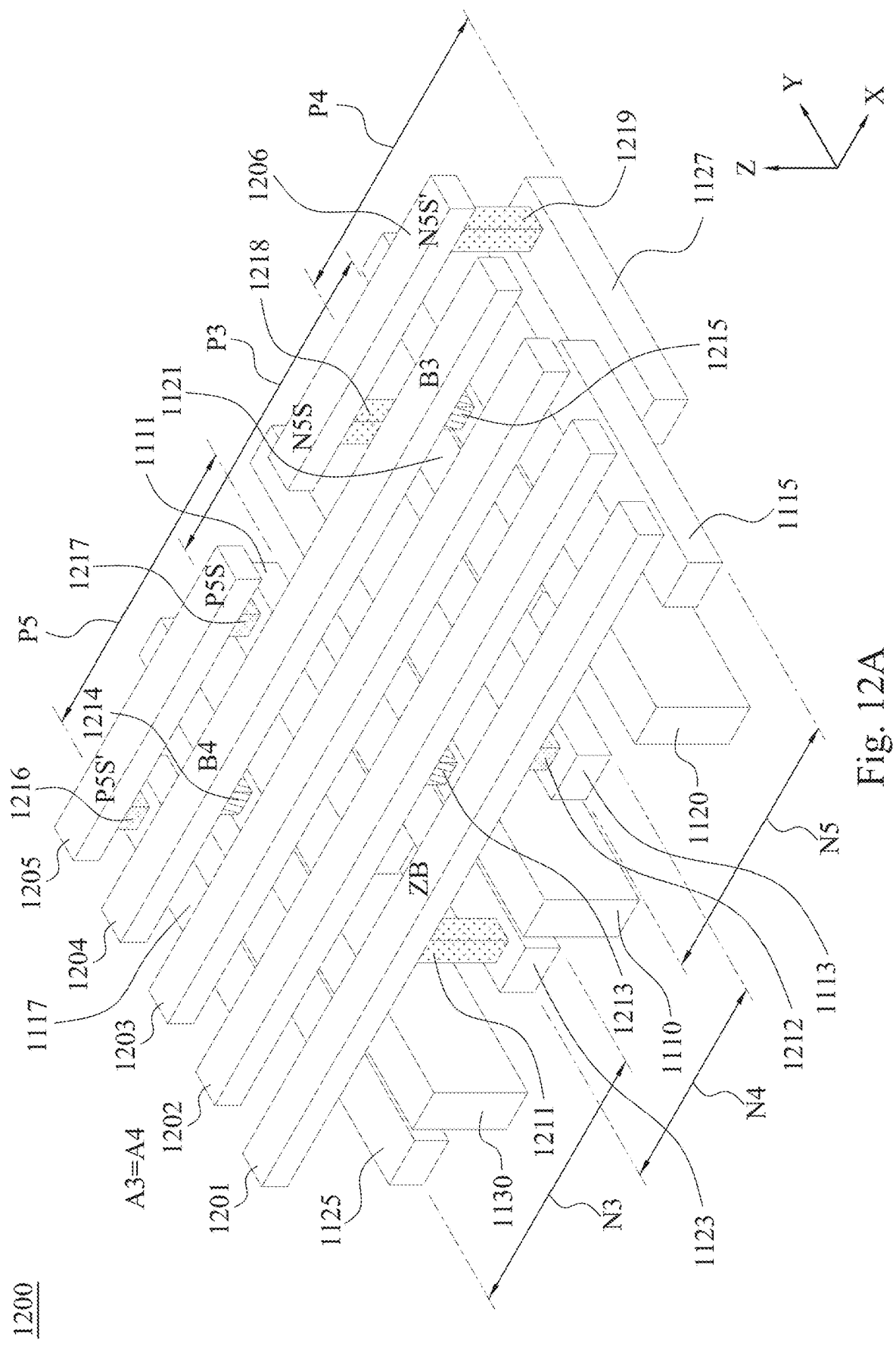
FIG. 12A is a schematic diagram of a perspective view of a layout structure corresponding to the IC of FIG. 11A and the layout design of FIG. 11B, in accordance with some embodiments of the present disclosure.

FIG. 12A is a schematic diagram of a perspective view of a layout structure 1200 corresponding to the IC 1100 in FIG.

11A based on a variation of the layout diagram 1100B depicted in FIG. 11B, in accordance with some embodiments of the present disclosure. The layout structure 1200 includes portions corresponding to the layout diagram 1100B illustrated in FIG. 11B, and thus the corresponding portions are not further detailed herein. In the illustration of FIG. 12A, compared to the PMOS transistors P3-P5 and the NMOS transistors N3-N5 illustrated in FIG. 11B, each of conductive segments 1113 and 1115 is offset in the negative Y-axis direction, each of conductive segments 1121 and 1127 is offset in the positive Y-axis direction, and the layout structure 1200 further includes conductive traces 1201-1206 and vias 1211-1219. In some embodiments, the conductive traces 1201-1206 are disposed in the M0 layer.

The layout structure corresponding to the PMOS transistor P3 together with the NMOS transistor N4 has arrangements similar to those in FIG. 5A. For illustration, the via 1211 couples the conductive segment 1123 to the conductive trace 1201, and the via 1212 couples the conductive segment 1113 to the conductive trace 1201. Accordingly, the conductive segment 1123 corresponding to one source/drain of the NMOS transistor N4 is coupled to the conductive segment 1113 corresponding to one source/drain of the PMOS transistor P3, for illustration, using only one conductive trace 1201. Alternatively stated, the conductive trace 1201 which is disposed in the M0 layer that is, for illustration, a closest metal layer on the gates 1110, 1120, and 1130, is arranged to couple the conductive segment 1123 to the conductive segment 1113, which corresponds to the connection ZB of the PMOS transistor P3 and the NMOS transistor N4 in FIG. 11A.

The PMOS transistor P3 and the NMOS transistor N4 share the gate 1110, which corresponds to the connection of the gate terminal A3 of the PMOS transistor P3 and the gate terminal A4 of the NMOS transistor N4 in FIG. 11A. The conductive trace 1202 is coupled to the gate 1110 through the via 1213, for illustration, to receive signals for controlling the PMOS transistor P3 and the NMOS transistor N4.

The conductive trace 1203 is not arranged to couple conductive segments in some embodiments. The via 1214 couples the gate 1130 to the conductive trace 1204, and the via 1215 couples the gate 1120 to the conductive trace 1204. Alternatively stated, the conductive trace 1204 which is disposed in the M0 layer, is arranged to couple the gate 1130 to the gate 1120, which corresponds to the connection BX of the gate terminal B3 of the PMOS transistor P4 and the gate terminal B4 of the NMOS transistor N3 in FIG. 11A.

The via 1216 couples the conductive segment 1117 to the conductive trace 1205, and the via 1217 couples the conductive segment 1111 to the conductive trace 1205. Alternatively stated, the conductive trace 1205 which is disposed in the M0 layer is arranged to couple the conductive segment 1117 to the conductive segment 1111, which corresponds to the connection of the nodes P5S and P5S' in FIG. 11A. The via 1218 couples the conductive segment 1121 to the conductive trace 1206, and the via 1219 couples the conductive segment 1127 to the conductive trace 1206. Alternatively stated, the conductive trace 1206 which is disposed in the M0 layer is arranged to couple the conductive segment 1121 to the conductive segment 1127, which corresponds to the connection of the nodes N5S and N5S' in FIG. 11A.

In some embodiments, a height of the via 1211 is greater than a height of the via 1212, because the conductive segments 1123 and 1113 are disposed in different layers as discussed above. In some embodiments, heights of the vias 1216 and 1217 are the same as that of the via 1212. In some embodiments, heights of the vias 1218 and 1219 are the same as that of the via 1211. In some embodiments, heights of the vias 1213, 1214, and 1215 are all the same.

Figure 12B:
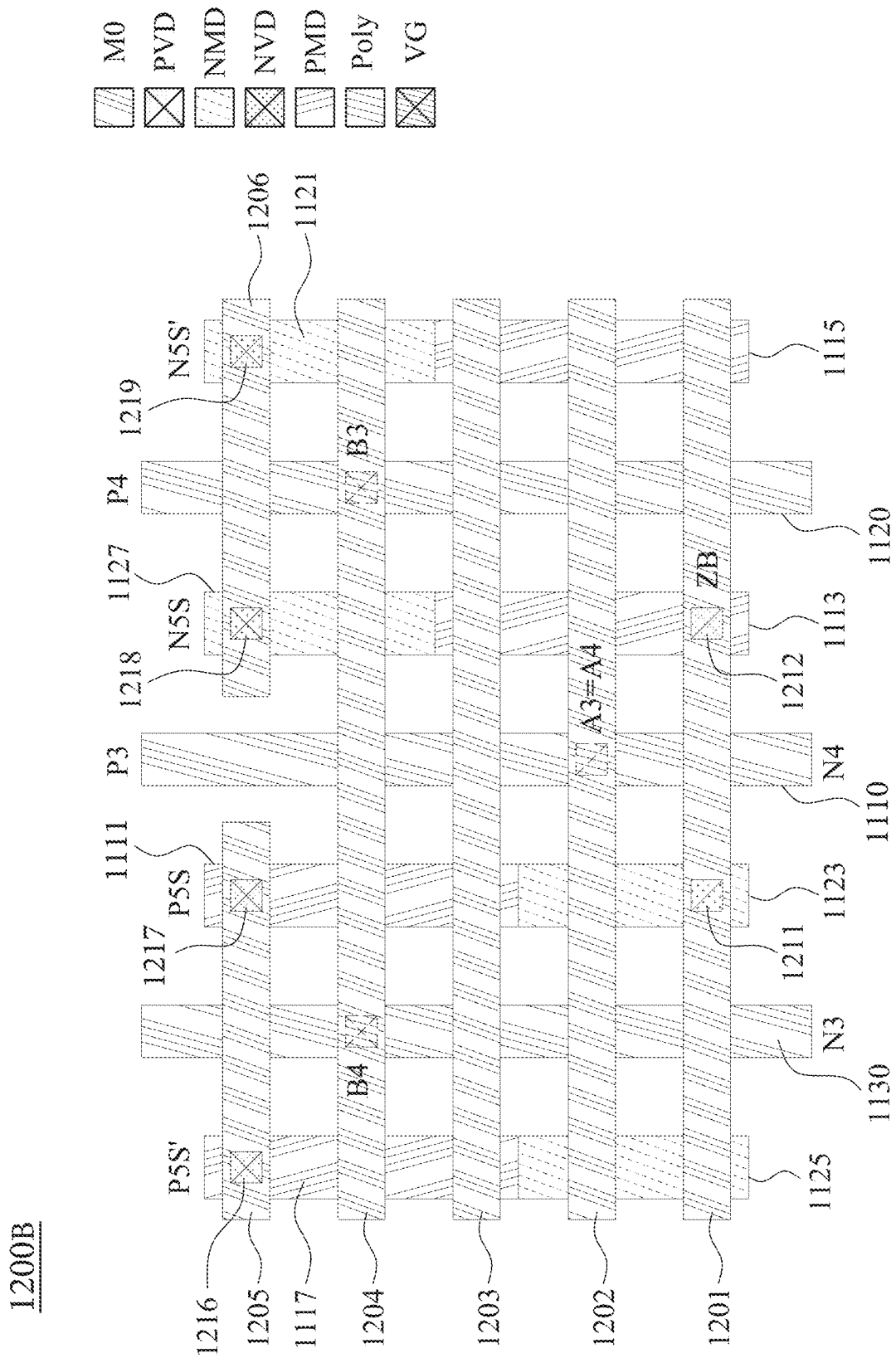
FIG. 12B depicts a layout diagram corresponding to the layout structure illustrated in FIG. 12A, in accordance with some embodiments of the present disclosure.

FIG. 12B depicts a layout diagram 1200B corresponding to the layout structure 1200 illustrated in FIG. 12A, in accordance with some embodiments of the present disclosure. As illustrated in FIG. 12B, in a top view of the layout diagram 1200B, the gates 1110, 1120, and 1130 correspond to the Poly portions, the conductive traces 1201-1206 correspond to the M0 portions, the vias 1212, 1216, and 1217 correspond to the PVD portions, and the vias 1211, 1218, and 1219 correspond to the NVD portions. The vias 1213-1215 (not labeled in FIG. 12B) correspond to the VG portions. The conductive segments 1111, 1113, 1115, and 1117 correspond to the PMD portions. The conductive segments 1121, 1123, 1125, and 1127 correspond to the NMD portions.

The layout diagram 1200B depicted in FIG. 12B includes five M0 portions extending across and above the Poly portions. The number of the M0 portions illustrated in FIG. 12B is given for illustrative purposes. Various numbers of the M0 portions illustrated in FIG. 12B are within the contemplated scope of the present disclosure. For example, in various embodiments, the M0 portion corresponding to the conductive trace 1203 in FIG. 12A is omitted, which will be discussed below with reference to FIG. 16A.

Figure 13A:
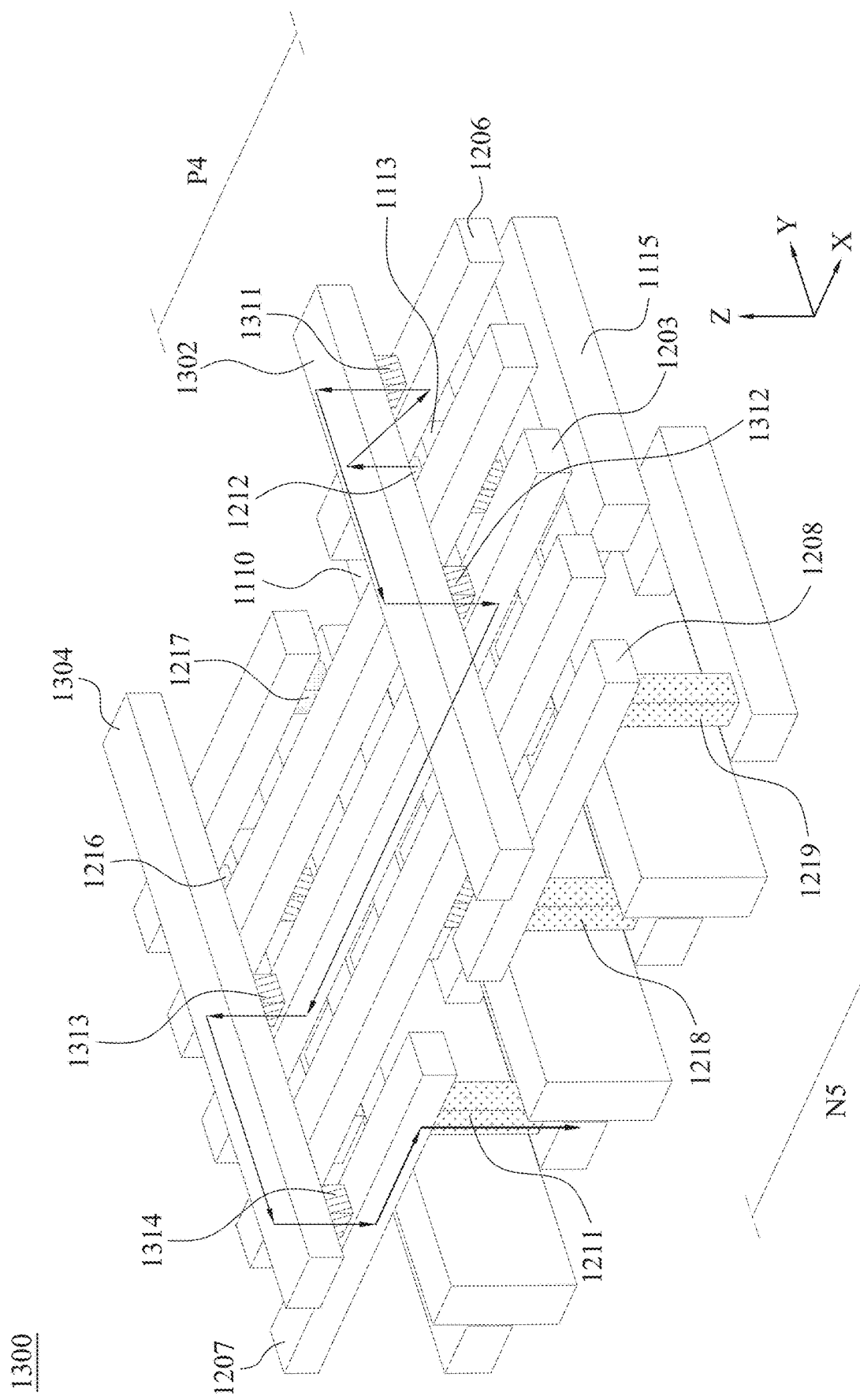
FIG. 13A is a schematic diagram of a perspective view of a layout structure corresponding to the IC in FIG. 11A and the layout design of FIG. 11B, in accordance with some embodiments of the present disclosure.

FIG. 13A is a schematic diagram of a perspective view of a layout structure 1300 corresponding to the IC 1100 in FIG. 11A based on the layout diagram 1100B depicted in FIG. 11B, in accordance with some embodiments of the present disclosure. The layout structure 1300 includes portions corresponding to the layout design illustrated in FIG. 12A, and thus the corresponding portions are not further detailed herein. Compared to the layout structure 1200 of FIG. 12A, the PMOS transistor P4 together with the NMOS transistor N5 in the layout structure 1300 corresponds to the layout structure illustrated in FIG. 2B.

Moreover, compared to the layout structure 1200 of FIG. 12A, the vias 1218 and 1219 are arranged at the side where the via 1211 is arranged. The via 1212 is arranged at the side where the vias 1216 and 1217 are arranged. In the illustration of FIG. 13A, the vias 1218 and 1219 are arranged opposite to the via 1211 with respect to the gate 1110, and the via 1212 is arranged opposite to the vias 1216 and 1217 with respect to the gate 1110.

Compared to the layout structure 1200 of FIG. 12A including the conductive trace 1201, the layout structure 1300 includes separate conductive traces 1207 and 1208. The conductive trace 1207 is coupled through the via 1211 to the conductive segment 1123. The conductive trace 1208 is coupled through the via 1218 to the conductive segment 1121 (not labeled in FIG. 13A), and coupled through the via 1219 to the conductive segment 1127 (not labeled in FIG. 13A), which corresponds to the connection of the nodes N5S2 and N5S2' in FIG. 11A.

In some embodiments, compared to the layout structure 1200 of FIG. 12A, the layout structure 1300 further includes conductive traces 1302 and 1304 and vias 1311-1314. The conductive trace 1304 is arranged to extend, for illustration, along the Y-axis direction, above and across the conductive traces 1202-1205 (not labeled in FIG. 13A) and 1207. The conductive trace 1302 is arranged to extend, for illustration, along the Y-axis direction, above and across the conductive traces 1202-1204, 1206, and 1208. The vias 1311 and 1312 are disposed on the conductive traces 1206 and 1203, respectively. The vias 1313 and 1314 are disposed on the conductive traces 1203 and 1207, respectively.

In some embodiments, the conductive traces 1302 and 1304 are disposed in the M1 layer in some embodiments, and accordingly, the conductive traces 1302 and 1304 are also referred to as M1 portions in some embodiments. In some embodiments, heights of the vias 1311-1314 are the same as the heights of the vias 1216-1217. In some embodiments, the heights of the vias 1311-1314 are different from the heights of the vias 1216-1217.

To implement the connection ZB of the PMOS transistor P3 and the NMOS transistor N4 in FIG. 11A, as illustratively indicated by arrows in FIG. 13A, the conductive segment 1113 corresponding to the source of the PMOS transistor P3 is coupled, through the via 1212, the conductive trace 1206, the via 1311, the conductive trace 1302, the via 1312, the conductive trace 1203, the via 1313, the conductive trace 1304, the via 1314, the conductive trace 1207, and the via 1211, to the conductive segment 1123 corresponding to the source of the NMOS transistor N4.

Figure 13B:
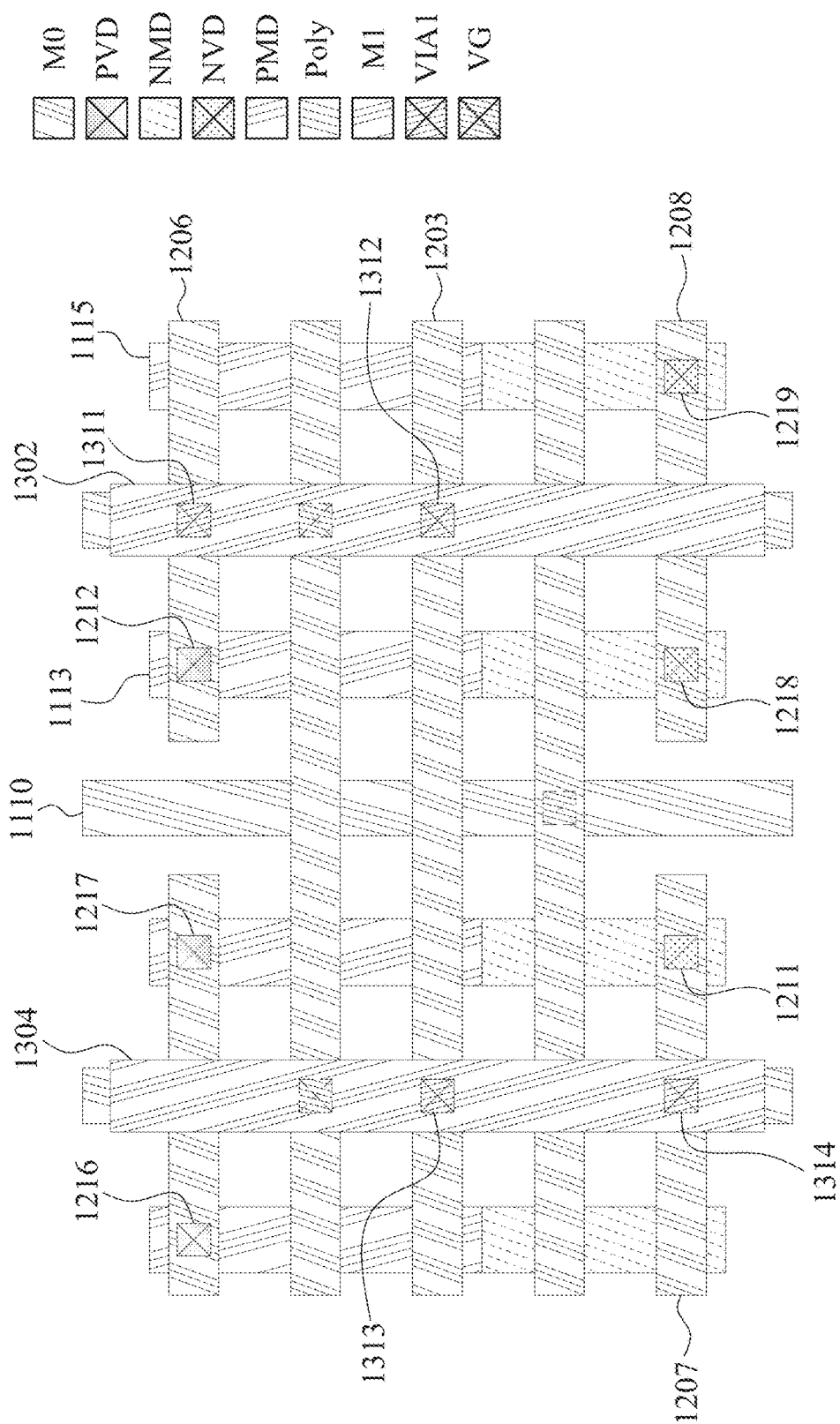
FIG. 13B depicts a layout diagram corresponding to the layout structure illustrated in FIG. 13A, in accordance with some embodiments of the present disclosure.

FIG. 13B depicts a layout diagram 1300B corresponding to the layout structure 1300 illustrated in FIG. 13A, in accordance with some embodiments of the present disclosure. As illustrated in FIG. 13B, in a top view of the layout diagram 1300B, compared to FIG. 12B, the M0 portions, e.g., corresponding to the conductive traces 1203 and 1206-1208, the PMD and NMD portions, e.g., corresponding to the conductive segments 1113 and 1115, the PVD and NVD portions, e.g., corresponding to the vias 1211, 1212, and 1216-1219, and the Poly portions, e.g., corresponding to the gate 1110, are arranged corresponding to those as discussed above with respect to the layout structure 1300 illustrated in FIG. 13A. Furthermore, compared to FIG. 12B, the conductive traces 1302 and 1304 are included and correspond to different M1 portions, and the vias 1311-1314 are included and correspond to different VIA1 portions.

The layout diagram 1300B depicted in FIG. 13B is given for illustrative purposes. Various layout designs are within the contemplated scope of the present disclosure. For example, the layout diagram 1300B depicted in FIG. 13B includes seven M0 portions extending across and above the respective Poly portions, and in various embodiments, the layout diagram 1300B includes more than seven M0 portions.

Figure 14A:
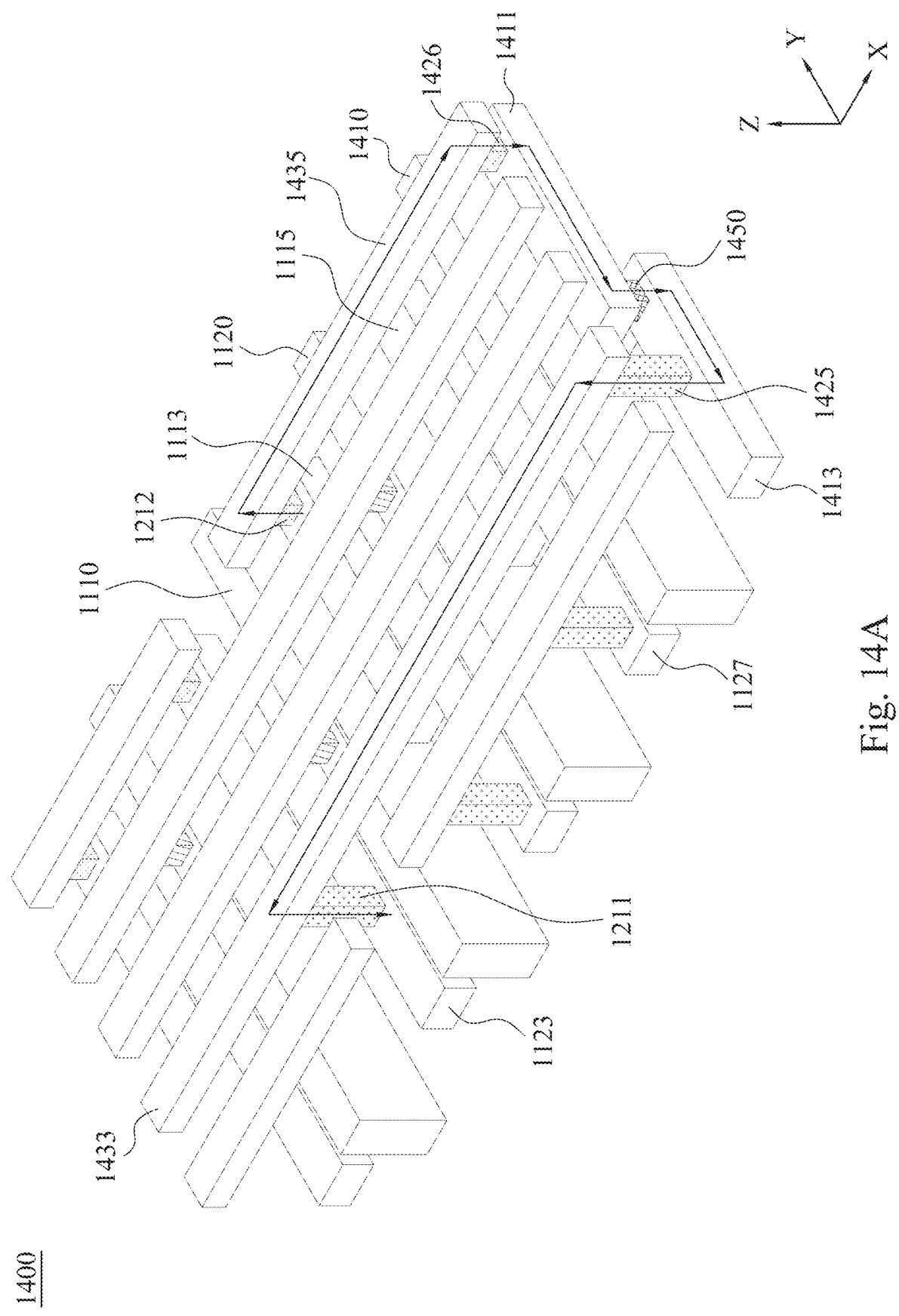
FIG. 14A is a schematic diagram of a perspective view of a layout structure corresponding to the IC of FIG. 11A and the layout design of FIG. 11B, in accordance with some embodiments of the present disclosure.

FIG. 14A is a schematic diagram of a perspective view of a layout structure 1400 corresponding to the IC 1100 in FIG. 11A based on the layout diagram 1100B depicted in FIG. 11B, in accordance with some embodiments of the present disclosure. The layout structure 1400 includes portions corresponding to the layout design illustrated in FIG. 12A, and thus the corresponding portions are not further detailed herein.

Compared to the layout structure 1300 of FIG. 13A, the layout structure 1400 further includes a gate 1410, conductive segments 1411 and 1413, vias 1425 and 1426, and a conductive local interconnect 1450. For illustration, the conductive segment 1411 is arranged in the first conductive layer in which the conductive segments 1111, 1113, 1115, and 1117 are arranged. The conductive segment 1411 is opposite to the conductive segment 1115 with respect to the gate 1410. The conductive segment 1413 is arranged in the second conductive layer in which the conductive segments 1121, 1123, 1125, and 1127 are arranged, which is stacked under the first layer. The conductive segment 1413 is opposite to the conductive segment 1127 with respect to the gate 1410. The conductive segment 1411 is coupled to the conductive segment 1413 through the conductive local interconnect 1450. In some embodiments, the height of the via 1425 is greater than the height of the conductive local interconnect 1450.

As further illustrated in FIG. 14A, compared to FIG. 13A using the conductive trace 1207, the layout structure 1400 includes a conductive trace 1433 disposed in the M0 layer. The conductive segment 1123 is coupled, through the via 1211, the conductive trace 1433, the via 1425, to the conductive segment 1413. Moreover, without the conductive trace 1206 in FIG. 13A, the layout structure 1400 includes a conductive trace 1435 disposed in the M0 layer and arranged to extend across the gates 1120 and 1410. The conductive segment 1113 is coupled, through the via 1212, the conductive trace 1435, the via 1426, to the conductive segment 1411.

To implement the connection ZB of the PMOS transistor P3 and the NMOS transistor N4 in FIG. 11A, as illustratively indicated by arrows in FIG. 14A, the conductive segment 1113 corresponding to the source of the PMOS transistor P3 is coupled, through the via 1212, the conductive trace 1435, the via 1426, the conductive segment 1411, the conductive local interconnect 1450, the conductive segment 1413, the via 1425, the conductive trace 1433, the via 1211, to the conductive segment 1123 corresponding to the source of the NMOS transistor N4.

Figure 14B:
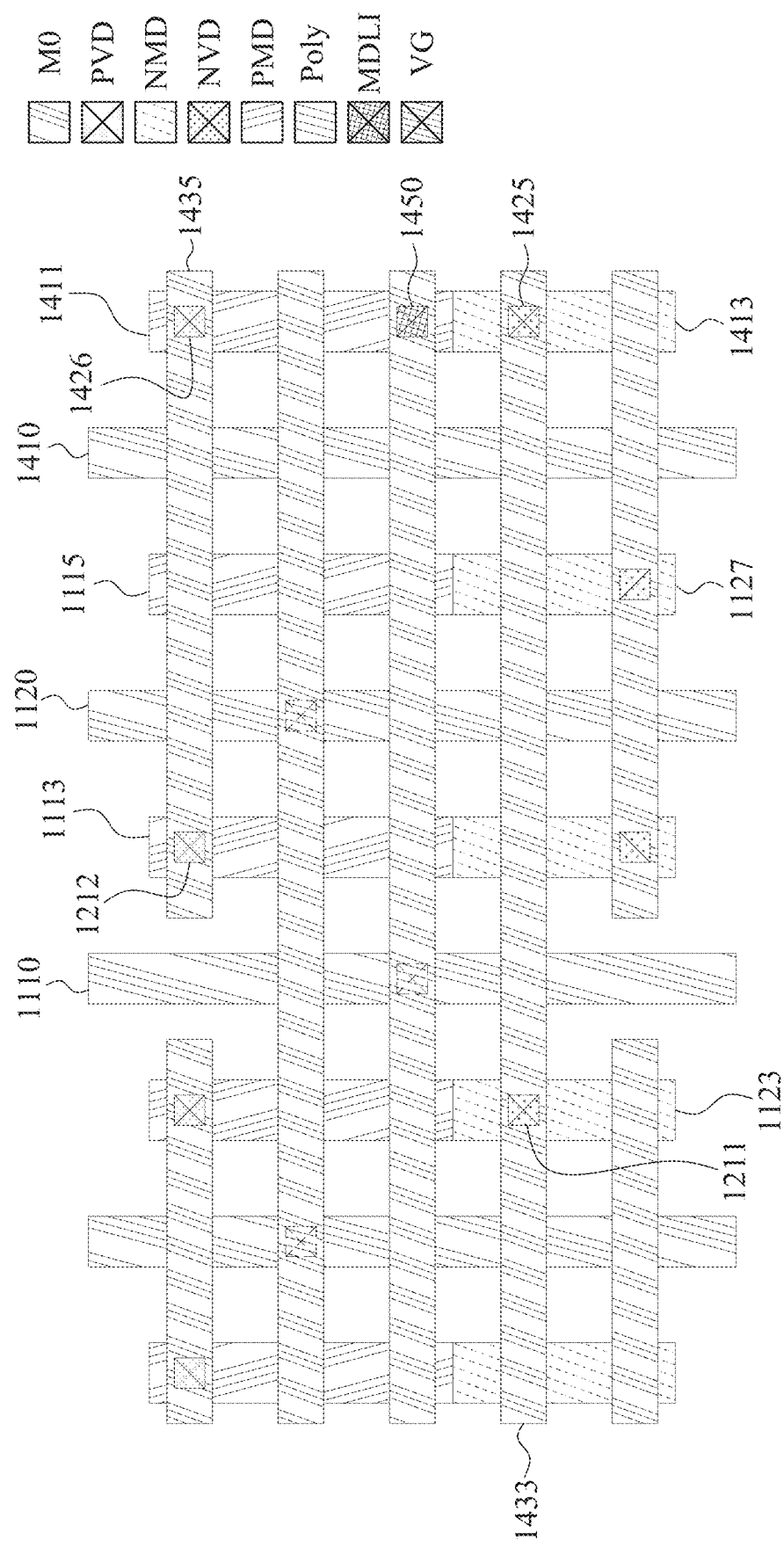
FIG. 14B depicts a layout diagram corresponding to the layout structure illustrated in FIG. 14A, in accordance with some embodiments of the present disclosure.

FIG. 14B depicts a layout diagram 1400B corresponding to the layout structure 1400 illustrated in FIG. 14A, in accordance with some embodiments of the present disclosure. As illustrated in FIG. 14B, in a top view of the layout diagram 1400B, the M0 portions, e.g., corresponding to the conductive traces 1433 and 1435, the PMD and NMD portions, the PVD and NVD portions, e.g., corresponding to conductive segments 1113, 1115, 1123, 1127, and 1411, the VG portions, e.g., corresponding to vias 1211 and 1212 and the Poly portions, e.g., corresponding to the gates 1110, 1120, and 1410, are arranged corresponding to those as discussed above with respect to the layout structure 1400 illustrated in FIG. 14A. Compared to FIG. 12B, in the illustration of FIG. 14B, the conductive local interconnect 1450 is included and corresponds to the MDLI portion, such that the connection ZB between the PMD portion of the PMOS transistor P3 and the NMD portion of the NMOS transistor N4, is achieved using the MDLI portion.

The layout diagram 1400B depicted in FIG. 14B is given for illustrative purposes. Various layout designs are within the contemplated scope of the present disclosure. For example, in some embodiments, the layout diagram 1400B includes more than one MDLI portion for coupling the PMD portion of the PMOS transistor P3 and the NMD portion of the NMOS transistor N4.

Figure 15A:
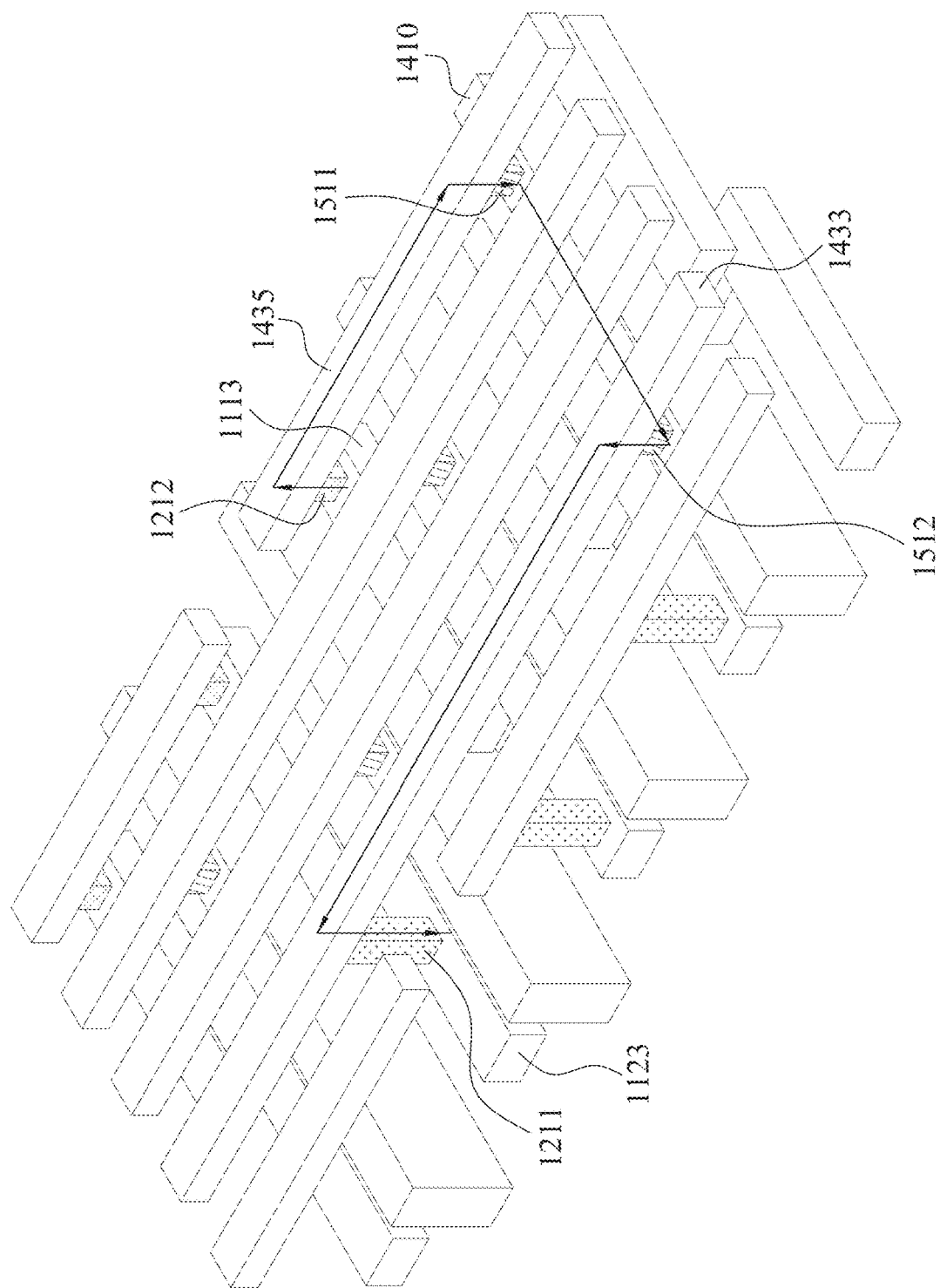
FIG. 15A is a schematic diagram of a perspective view of a layout structure corresponding to the IC of FIG. 11A and the layout design of FIG. 11B, in accordance with some embodiments of the present disclosure.

FIG. 15A is a schematic diagram of a perspective view of a layout structure 1500 for the IC 1100 in FIG. 11A based on the layout diagram 1100B depicted in FIG. 11B, in accordance with some embodiments of the present disclosure. The layout structure 1500 includes portions corresponding to the layout design illustrated in FIG. 14A, and thus the corresponding portions are not further detailed herein.

Compared to the layout structure 1400 of FIG. 14A including the via 1426 and the conductive local interconnect 1450, in the illustration of FIG. 15A, the layout structure 1500 includes vias 1511 and 1512 disposed on the gate 1410. The via 1511 couples the gate 1410 to the conductive trace 1435. The via 1512 couples the gate 1410 to the conductive trace 1433. In some embodiments, the heights of the vias 1511 and 1512 are the same as the heights of the vias 1214 and 1215 as illustrated in FIG. 12A.

To implement the connection ZB of the PMOS transistor P3 and the NMOS transistor N4 in FIG. 11A, as illustratively indicated by arrows in FIG. 15A, the conductive segment 1113 corresponding to the source of the PMOS transistor P3 is coupled, through the via 1212, the conductive trace 1435, the via 1511, the gate 1410, the via 1512, the conductive trace 1433, the via 1211, to the conductive segment 1123 corresponding to the source of the NMOS transistor N4.

Figure 15B:
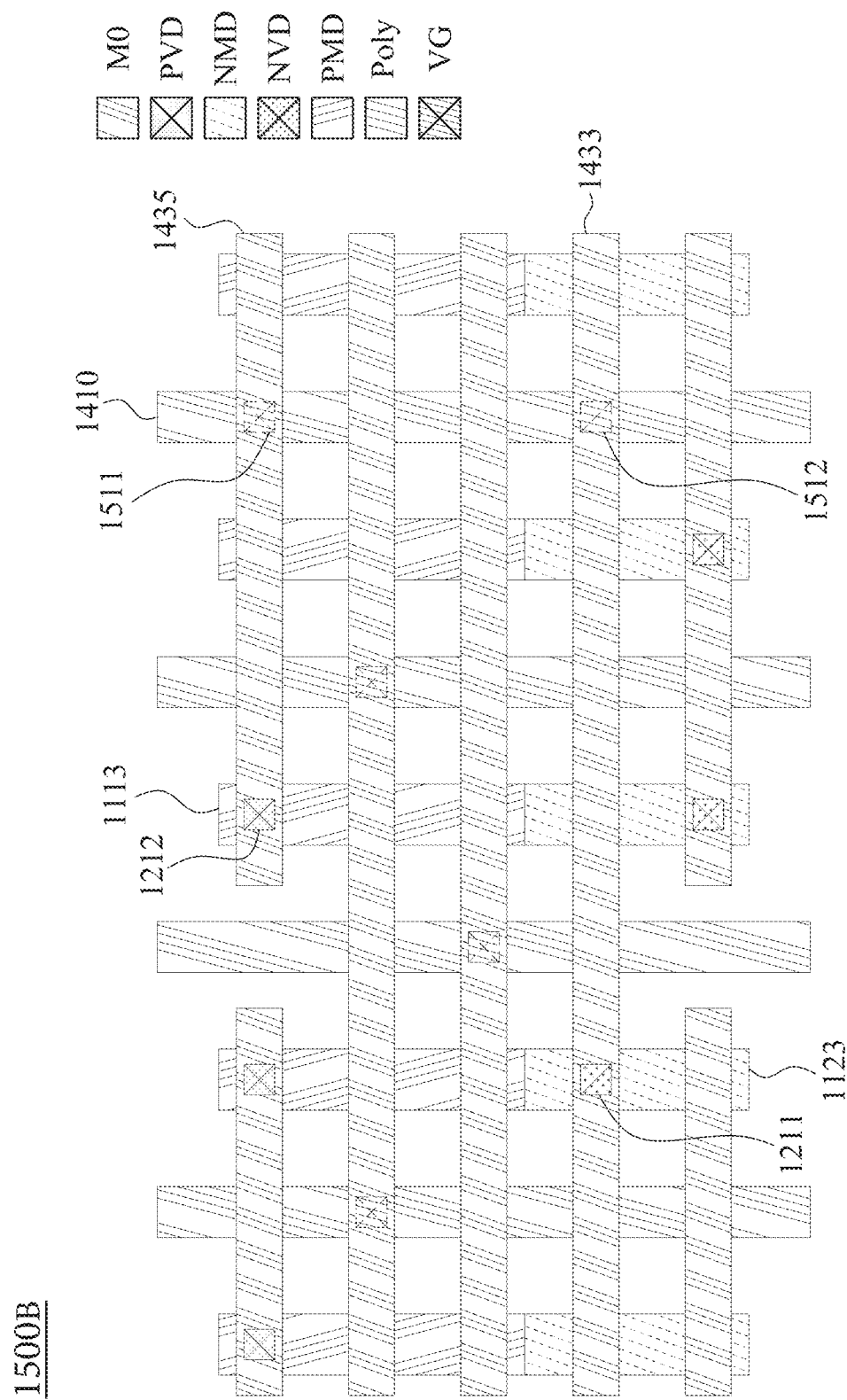
FIG. 15B depicts a layout diagram corresponding to the layout structure illustrated in FIG. 15A, in accordance with some embodiments of the present disclosure.

FIG. 15B depicts a layout diagram 1500B corresponding to the layout structure 1500 illustrated in FIG. 15A, in accordance with some embodiments of the present disclosure. As illustrated in FIG. 15B, in a top view of the layout diagram 1500B, the M0 portions, e.g., corresponding to the conductive traces 1433 and 1435, the PMD and NMD portions, e.g., corresponding to conductive segments 1113 and 1123, the PVD and NVD portions, the VG portions, e.g., corresponding to vias 1211 and 1212, and the Poly portions, e.g., corresponding to the gate 1410, are arranged corresponding to those as discussed above with respect to the layout structure 1500 illustrated in FIG. 15A. Compared to FIG. 14B, in the illustration of FIG. 15B, the vias 1511 and 1512 are included and correspond to two more VG portions, such that the connection ZB between the PMD portion of the PMOS transistor P3 and the NMD portion of the NMOS transistor N4, is achieved using the VG portions.

The layout diagram 1500B depicted in FIG. 15B is given for illustrative purposes. Various layout designs are within the contemplated scope of the present disclosure. For example, the layout diagram 1500B includes additional VG portions for coupling the PMD portion of the PMOS transistor P3 and the NMD portion of the NMOS transistor N4.

Figure 16A:
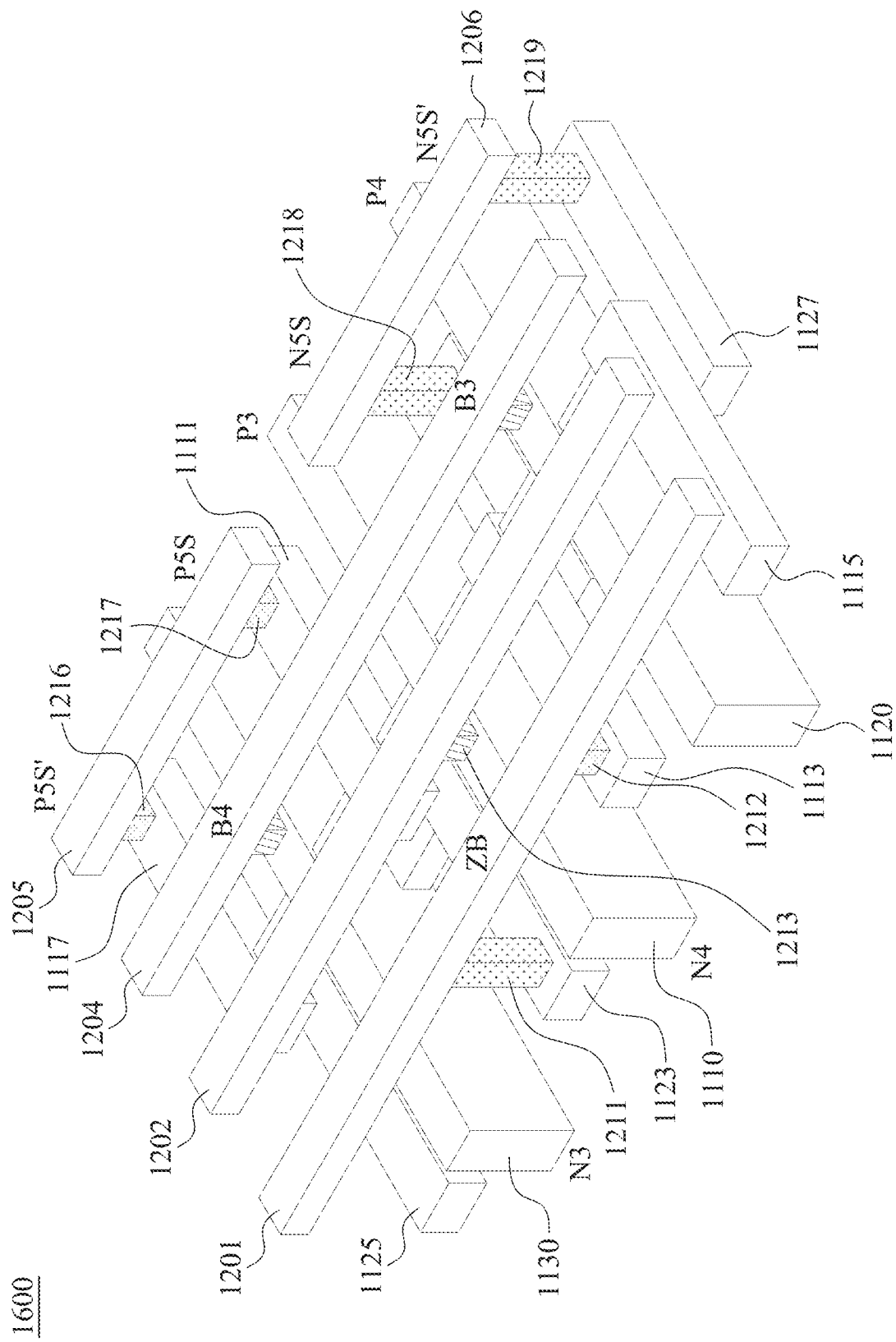
FIG. 16A is a schematic diagram of a perspective view of a layout structure corresponding to the IC of FIG. 11A and the layout design of FIG. 11B, in accordance with some embodiments of the present disclosure.

FIG. 16A is a schematic diagram of a perspective view of a layout structure 1600 corresponding to the IC 1100 in FIG. 11A based on the layout diagram 1100B depicted in FIG. 11B, in accordance with some embodiments of the present disclosure. The layout structure 1600 includes portions corresponding to the layout design illustrated in FIG. 12A, and thus the corresponding portions are not further detailed herein.

Compared to the layout structure 1200 of FIG. 12A, the layout structure 1600 includes fewer conductive traces disposed in the M0 layer, in which, for illustration, the conductive trace 1203 is not included in the layout structure 1600.

To implement the connection ZB of the PMOS transistor P3 and the NMOS transistor N4 in FIG. 11A, the conductive segment 1113 corresponding to the source of the PMOS transistor P3 is coupled to the conductive segment 1123 corresponding to the source of the NMOS transistor N4 in a similar manner as illustrated in FIG. 12A.

Figure 16B:
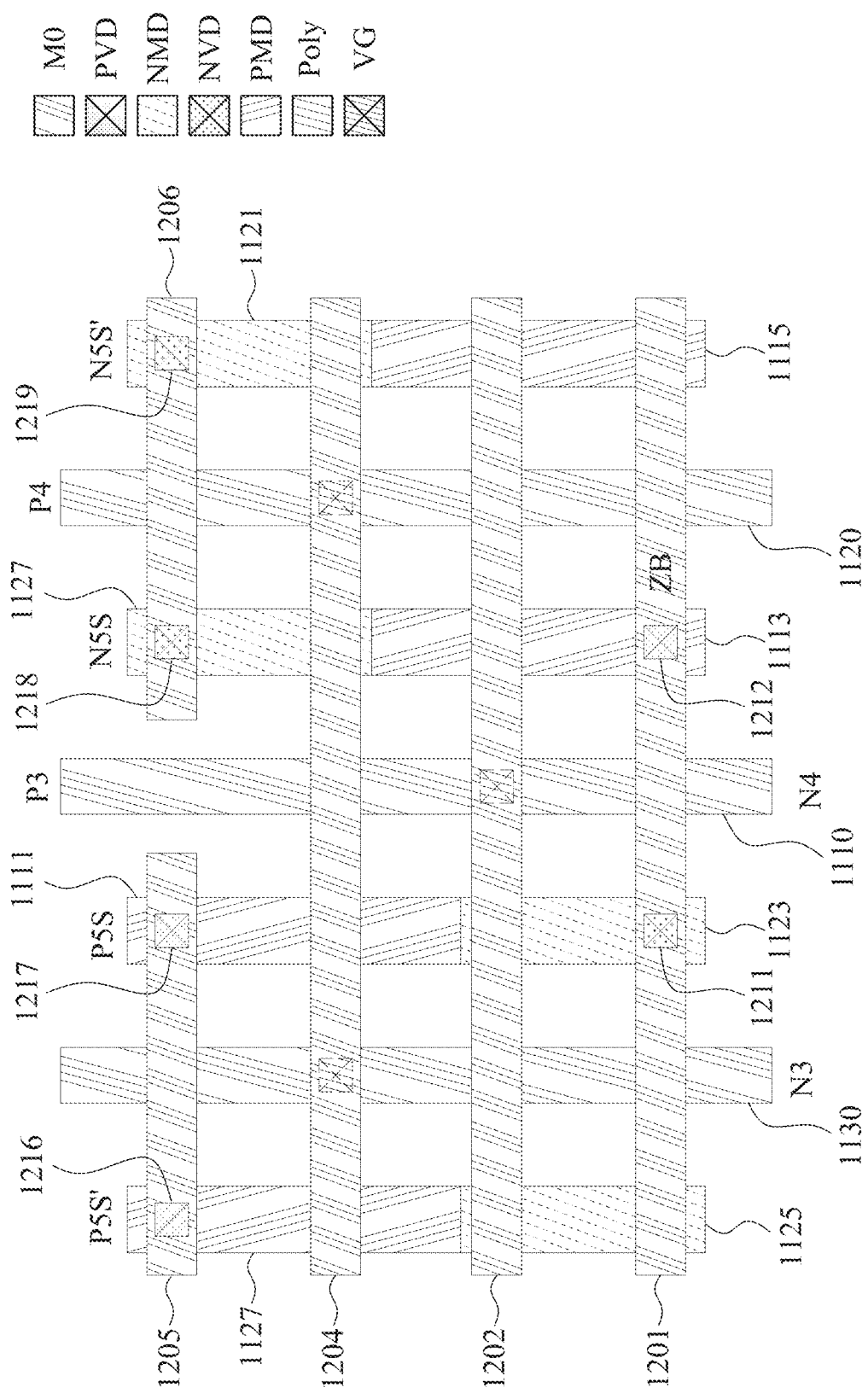
FIG. 16B depicts a layout diagram corresponding to the layout structure illustrated in FIG. 16A, in accordance with some embodiments of the present disclosure.

FIG. 16B depicts a layout diagram 1600B corresponding to the layout structure 1600 illustrated in FIG. 16A, in accordance with some embodiments of the present disclosure. As illustrated in FIG. 16B, in a top view of the layout diagram 1600B, compared to the layout diagram 1200B of FIG. 12B, the M0 portion corresponding to the conductive trace 1203 is not included in the layout design.

Figure 17A:
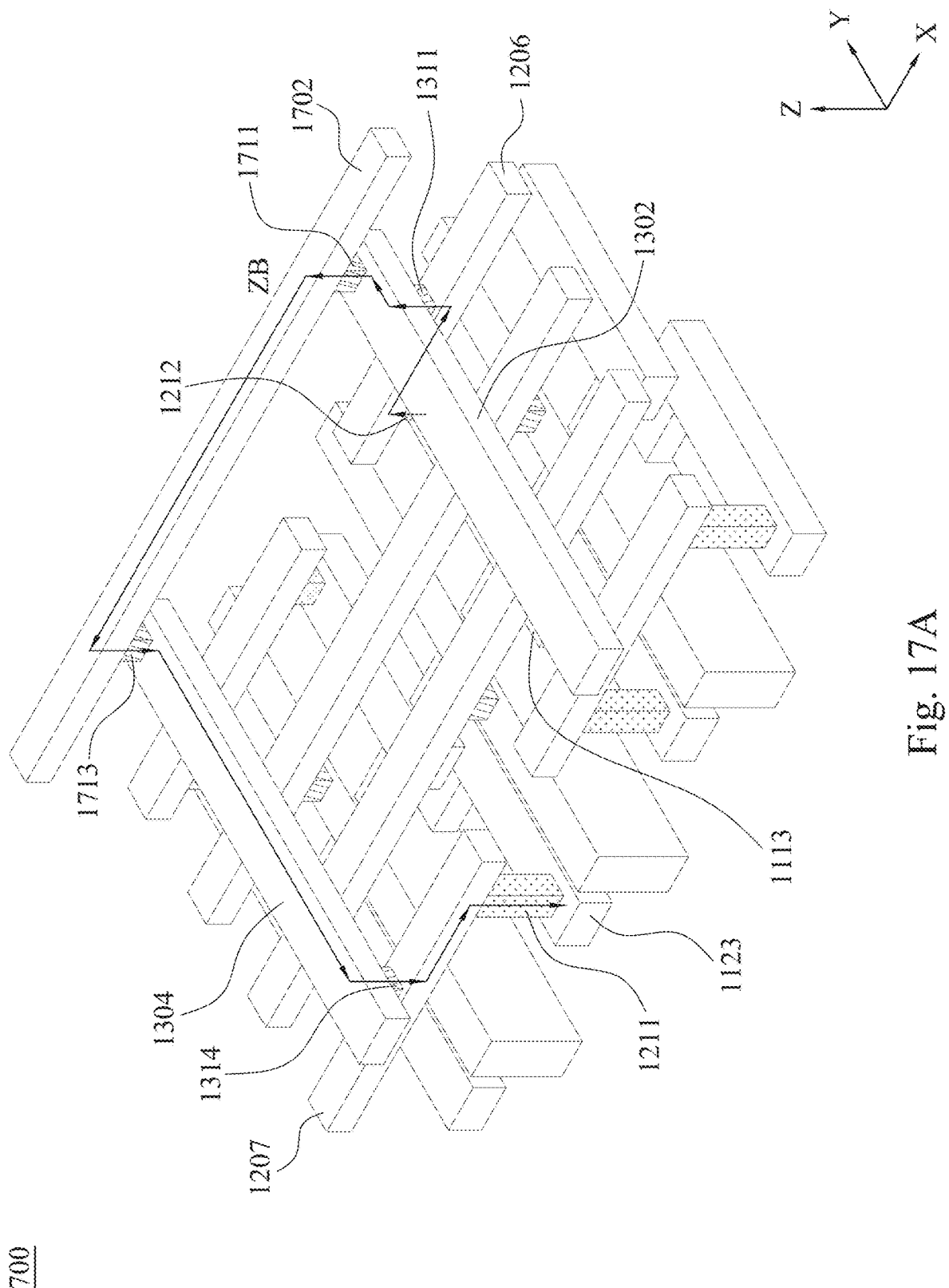
FIG. 17A is a schematic diagram of a perspective view of a layout structure corresponding to the IC of FIG. 11A and the layout design of FIG. 11B, in accordance with various embodiments of the present disclosure.

FIG. 17A is a schematic diagram of a perspective view of a layout structure 1700 corresponding to the IC 1100 in FIG. 11A based on the layout diagram 1100B depicted in FIG. 11B, in accordance with various embodiments of the present disclosure. The layout structure 1700 includes portions corresponding to the layout design illustrated in FIG. 13A, and thus the corresponding portions are not further detailed herein.

Compared to the layout structure 1300 of FIG. 13A including the vias 1312 and 1313, the layout structure 1700 includes a conductive trace 1702 and vias 1711 and 1713. In the illustration of FIG. 17A, the conductive trace 1702 is arranged to extend along the X-axis direction, above and across the conductive traces 1302 and 1304. The conductive trace 1702 is disposed in a metal two (M2) layer, and accordingly, the conductive trace 1702 is also referred to as an M2 portion in some embodiments. The via 1711 couples the conductive trace 1302 to the conductive trace 1702, and the via 1713 couples the conductive trace 1304 to the conductive trace 1702. In some embodiments, heights of the vias 1711 and 1713 are the same as the height of the via 1314 discussed above.

To implement the connection ZB of the PMOS transistor P3 and the NMOS transistor N4 in FIG. 11A, as illustratively indicated by arrows in FIG. 17A, the conductive segment 1113 corresponding to the source of the PMOS transistor P3 is coupled, through the via 1212, the conductive trace 1206, the via 1311, the conductive trace 1302, the via 1711, the conductive trace 1702, the via 1713, the conductive trace 1304, the via 1314, the conductive trace 1207, the via 1211, to the conductive segment 1123 corresponding to the source of the NMOS transistor N4.

Figure 17B:
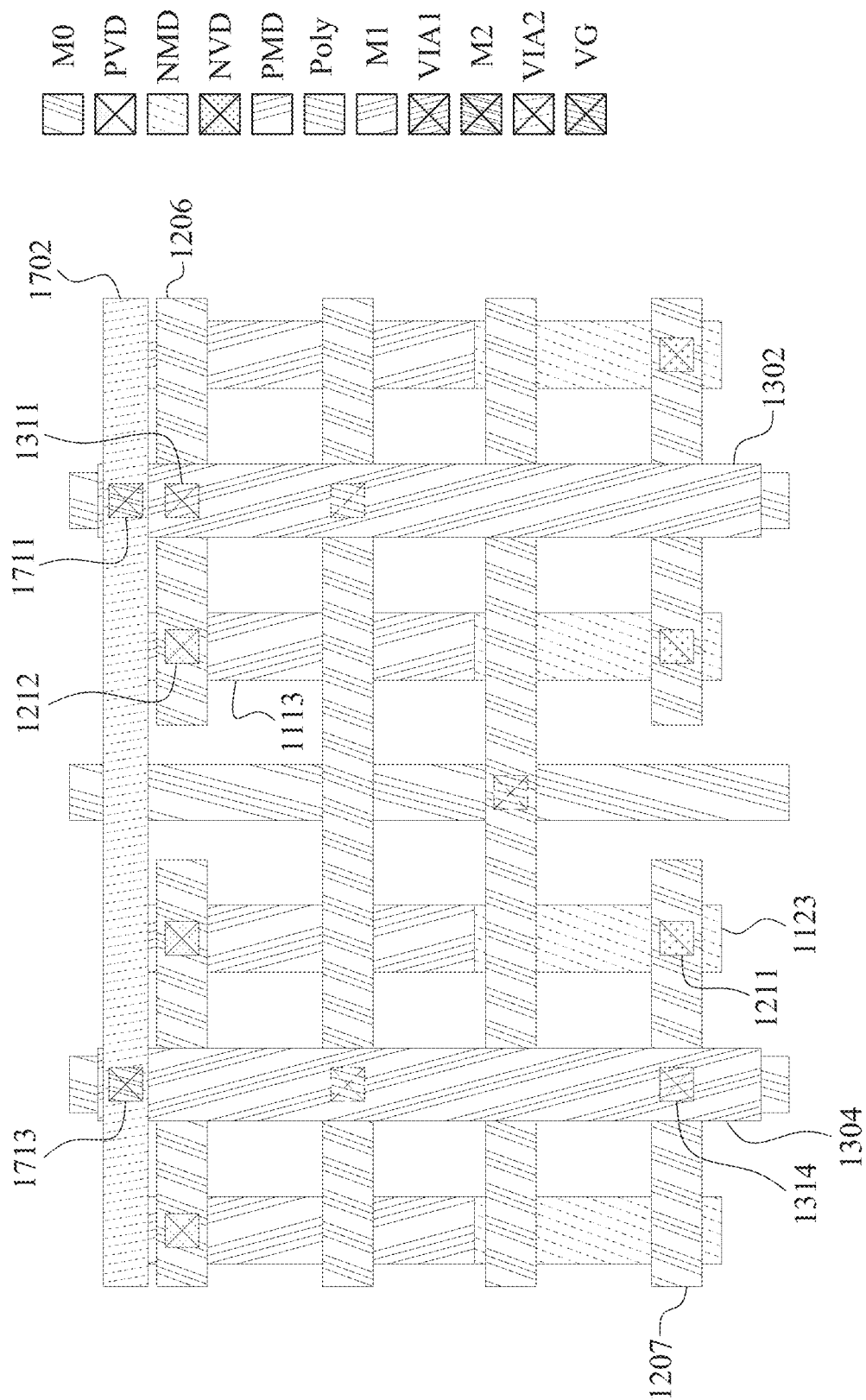
FIG. 17B depicts a layout diagram corresponding to the layout structure illustrated in FIG. 17A, in accordance with some embodiments of the present disclosure.

FIG. 17B depicts a layout diagram 1700B corresponding to the layout structure 1700 illustrated in FIG. 17A, in accordance with some embodiments of the present disclosure. As illustrated in FIG. 17B, in a top view of the layout diagram 1700B, the M0 portions, e.g., corresponding to conductive traces 1206 and 1207, the M1 portions corresponding to conductive traces 1302 and 1304, the PMD and NMD portions, e.g., corresponding to conductive segments 1113 and 1123, the PVD and NVD portions, e.g., corresponding to vias 1211 and 1212, the VIA1 portions corresponding to vias 1311 and 1314, the VG portions, and the Poly portions are arranged corresponding to those as discussed above with respect to the layout structure 1700 illustrated in FIG. 17A. Compared to FIG. 13B, the M2 portion corresponding to the conductive trace 1702 is included, and the VIA2 portions corresponding to the vias 1711 and 1713 are included.

The layout diagram 1700B depicted in FIG. 17B is given for illustrative purposes. Various layout designs are within the contemplated scope of the present disclosure. For example, in some embodiments, the layout diagram 1700B includes more than one conductive trace disposed in the M2 layer, for coupling the source of the PMOS transistor P3 to the source of the NMOS transistor N4.

Figure 18A:
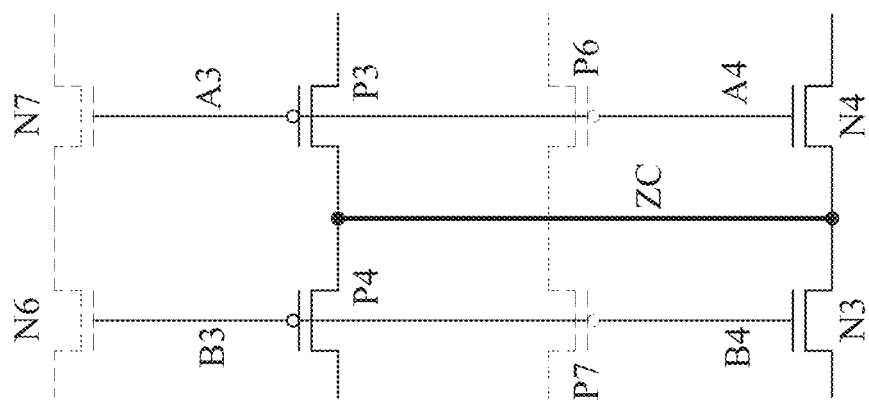
FIG. 18A is a circuit diagram of an IC equivalent to the transmission gate circuit of FIG. 10, in accordance with some embodiments of the present disclosure.

FIG. 18A is a circuit diagram of an IC 1800 equivalent to the transmission gate circuit 1000 in FIG. 10, in accordance with some embodiments of the present disclosure. Compared to the IC 1100 including the PMOS transistor P5 and the NMOS transistor N5 of FIG. 11A, in the illustration of FIG. 18A, the IC 1800 includes PMOS transistors P6 and P7 and NMOS transistors N6 and N7, in addition to the PMOS transistors P3 and P4 and the NMOS transistors N3 and N4. The connections of the PMOS transistors P3 and P4 and the NMOS transistors N3 and N4 are similar to those as discussed above with respect to FIG. 11A, and thus they are not further detailed herein.

In the illustration of FIG. 18A, gate terminals of the NMOS transistor N6 and the PMOS transistor P7 are coupled to the gate terminal B3 of the PMOS transistor P4 and the gate terminal B4 of the NMOS transistor N3. The gate terminals of the NMOS transistor N7 and the PMOS transistor P6 are coupled to the gate terminal A3 of the PMOS transistor P3 and the gate terminal A4 of the NMOS transistor N4. A drain terminal of the NMOS transistor N6 is coupled to a source terminal of the NMOS transistor N7.

A source terminal of the PMOS transistor P7 is coupled to a drain terminal of the PMOS transistor P6. To be equivalent to the transmission gate circuit 1000 in FIG. 10, the source and drain terminals of each one of the PMOS transistors P6 and P7 and the NMOS transistors N6 and N7 are coupled together in a short-circuit configuration such that the PMOS transistors P6 and P7 and the NMOS transistors N6 and N7 are inoperative, as illustratively shown in FIG. 18A. By the connections of the PMOS transistors P3, P4, P6, and P7 and the NMOS transistors N3, N4, N6, and N7, as illustrated in FIG. 18A, the IC 1800 is able to operate as a circuit equivalent to the transmission gate circuit 1000 in FIG. 10.

Figure 18B:
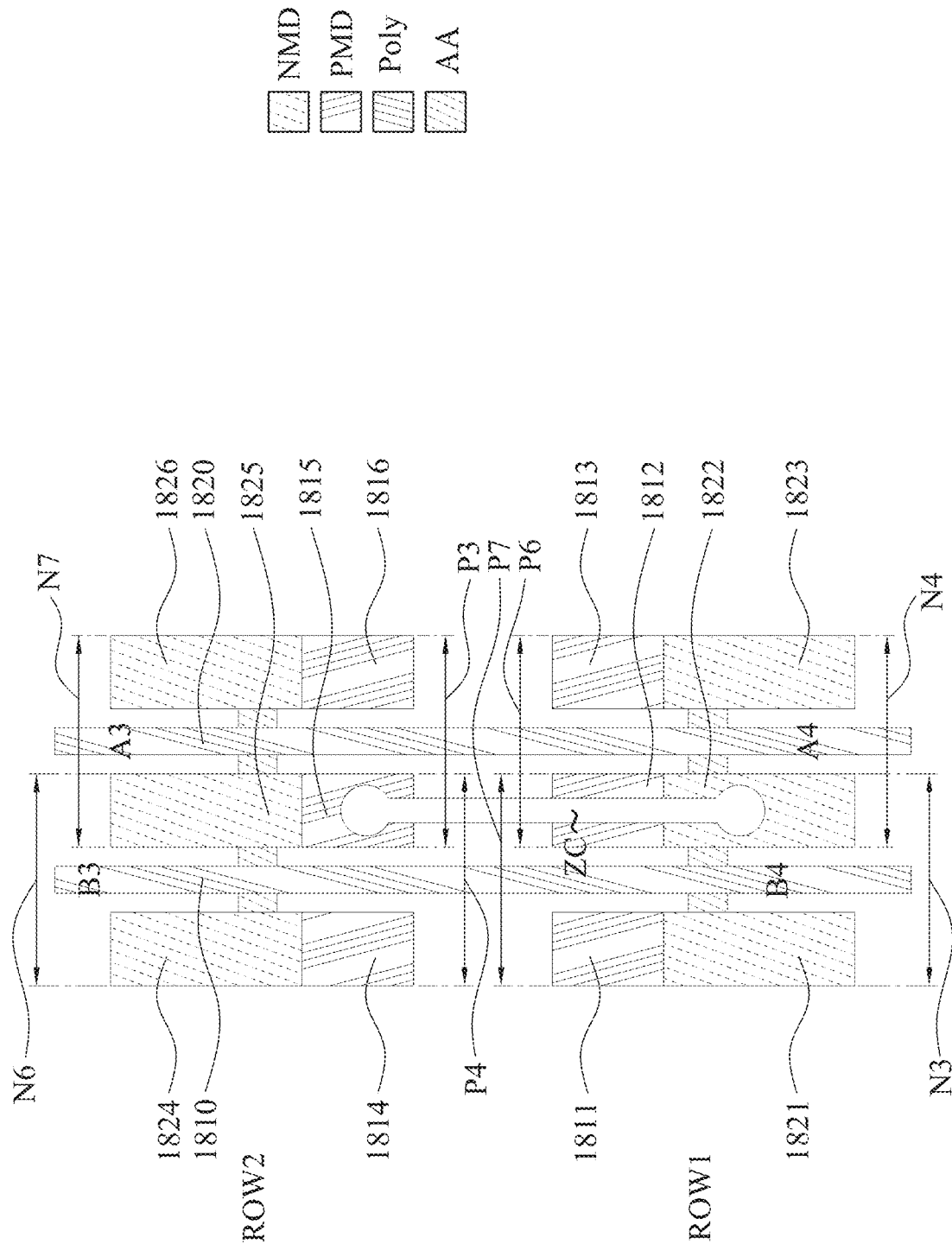
FIG. 18B depicts a layout diagram corresponding to the IC of FIG. 18A, in accordance with some embodiments of the present disclosure.

FIG. 18B depicts a layout diagram 1800B corresponding to the IC 1800 of FIG. 18A, in accordance with some embodiments of the present disclosure. In the embodiment of FIG. 18B, the NMOS transistors N3, N4, N6, and N7 are referred to as being stacked on the PMOS transistors P3, P4, P6, and P7 of FIG. 18A. Accordingly, the corresponding NMD portions are depicted as being disposed above and partially overlapped with the corresponding PMD portions. In some embodiments, the PMOS transistors P3, P4, P6, and P7 are stacked on the NMOS transistors N3, N4, N6, and N7.

In the illustration of FIG. 18B, the layout diagram 1800B includes the NMOS transistors N3 and N4 and the PMOS transistors P6 and P7 arranged in a first row ROW1, and the layout corresponding to the NMOS transistors N6 and N7 and the PMOS transistors P3 and P4 arranged in a second row ROW2. Gates 1810 and 1820 are arranged to extend in a predetermined direction (not labeled), for illustration, across the first row ROW1 and the second row ROW2. The gate 1810 is arranged as a common gate for the NMOS transistors N3 and N6 and the PMOS transistors P4 and P7, which corresponds to the gate terminals of the NMOS transistor N6 and the PMOS transistor P7 being coupled to the gate terminal B3 of the PMOS transistor P4 and the gate terminal B4 of the NMOS transistor N3. The gate 1820 is arranged as a common gate for the NMOS transistors N4 and N7 and the PMOS transistors P3 and P6, which corresponds to the gate terminals of the NMOS transistor N7 and the PMOS transistor P6 being coupled to the gate terminal A3 of the PMOS transistor P3 and the gate terminal A4 of the NMOS transistor N4.

Conductive segments 1811-1816 are arranged, in a first conductive layer, as sources/drains of the PMOS transistors P3, P4, P6, and P7. The gate 1810 and the conductive segments 1811 and 1812 together correspond to the PMOS transistor P7. The gate 1820 and the conductive segments 1812 and 1813 together correspond to the PMOS transistor P6. The gate 1810 and the conductive segments 1814 and 1815 together correspond to the PMOS transistor P4. The gate 1820 and the conductive segments 1815 and 1816 together correspond to the PMOS transistor P3.

Conductive segments 1821-1826 are arranged, in a second conductive layer stacked on the first layer in which the conductive segments 1811-1816 are arranged, as sources/drains of the NMOS transistors N3, N4, N6, and N7. The gate 1810 and the conductive segments 1821 and 1822 together correspond to the NMOS transistor N3. The gate 1820 and the conductive segments 1822 and 1823 together correspond to the NMOS transistor N4. The gate 1810 and the conductive segments 1824 and 1825 together correspond to the NMOS transistor N6. The gate 1820 and the conductive segments 1825 and 1826 together correspond to the NMOS transistor N7.

As illustrated in FIG. 18B, each of the layout design of the PMOS transistor P7 together with the NMOS transistor N3, the layout design of the PMOS transistor P6 together with the NMOS transistor N4, the layout design of the PMOS transistor P4 together with the NMOS transistor N6, and the layout design of the PMOS transistor P3 together with the NMOS transistor N7 corresponds to the layout structure as illustrated in FIGS. 2B and 2D. The layout diagram 1800B illustrated in FIG. 18B is given for illustrative purposes. Various layout designs for the IC 1800 of FIG. 18A are within the contemplated scope of the present disclosure. For example, in various embodiments, the layout diagram 1800B is modified to include layout structures as combinations of those illustrated in FIGS. 2A-2D.

Based on the configuration discussed above, the gate 1820 corresponds to the gate terminal A3 of the PMOS transistor P3 and the gate terminal A4 of the NMOS transistor N4, and the gate 1810 corresponds to the gate terminal B3 of the PMOS transistor P4 and the gate terminal B4 of the NMOS transistor N3. In such embodiments, the PMOS transistor P3 and the NMOS transistor N4 share the gate 1820, which corresponds to the connection of the gate terminals A3 and A4 as shown in FIG. 18A, and the PMOS transistor P4 and the NMOS transistor N3 share the gate 1810, which corresponds to the connection of the gate terminals B3 and B4 as shown in FIG. 18A. The conductive segment 1815 is coupled to the conductive segment 1822, which corresponds to a connection ZC as shown in FIG. 18A. To realize the concepts as discussed above with respect to FIG. 18B, layout designs for the IC 1800 are illustrated in FIGS. 19A-19E as discussed below.

Figure 19A:
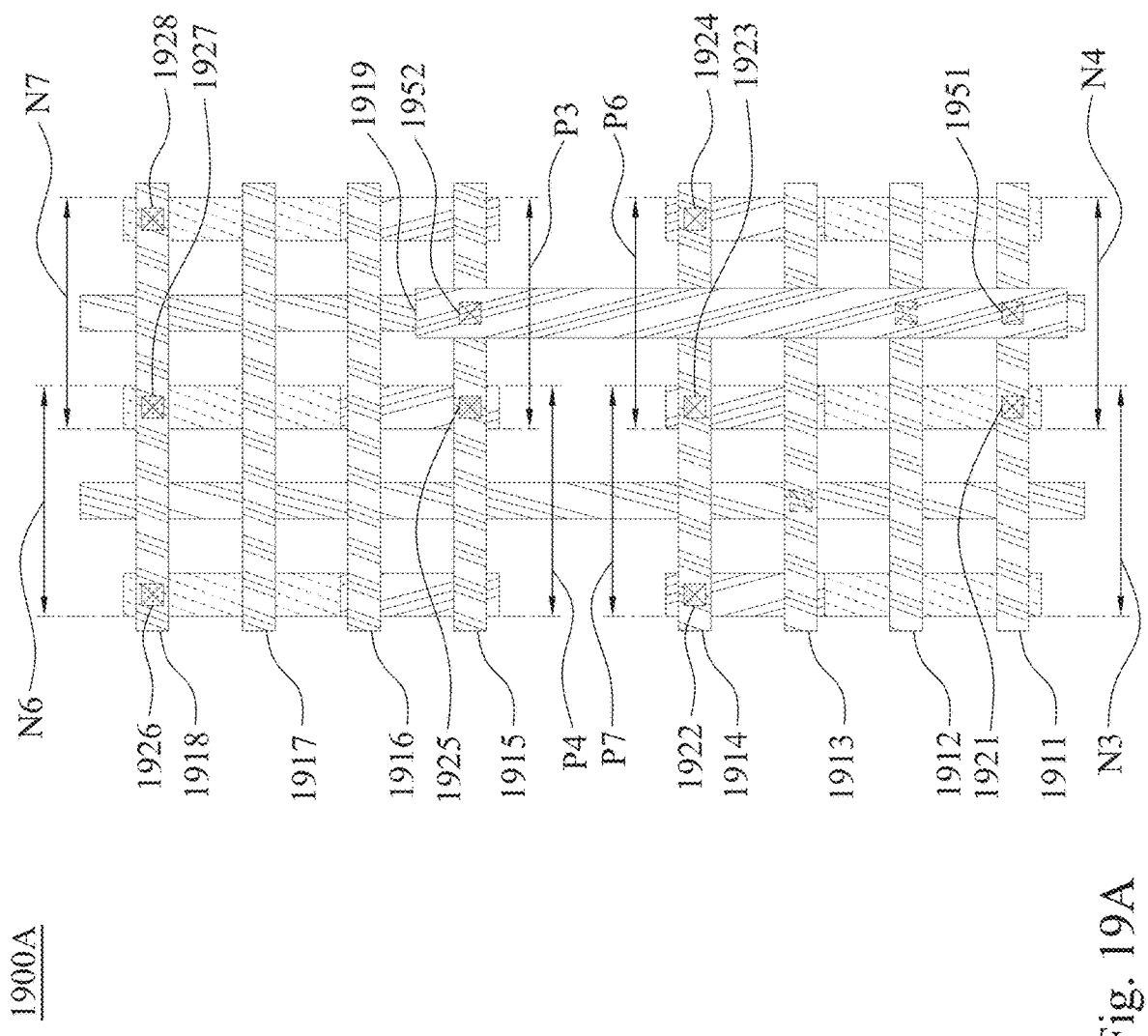

FIG. 19A depicts a layout diagram 1900A corresponding to the IC 1800 in FIG. 18A based on the layout diagram 1800B depicted in FIG. 18B, in accordance with some embodiments of the present disclosure. As illustrated in FIG. 19A, the layout diagram 1900A includes the corresponding portions as discussed above with respect to FIG. 18B, and thus the corresponding portions are not further detailed herein.

In the illustration of FIG. 19A, compared to that illustrated in FIG. 18B, the layout diagram 1900A further includes conductive traces 1911-1919 and vias 1921-1928, 1951, and 1952. The conductive traces 1911-1918 are arranged above the gates 1810 and 1820. With reference to FIG. 18B and FIG. 19A, the conductive traces 1911-1918 extend along a predetermined direction (not labeled) which is, for illustration, perpendicular to the direction along which the gates 1810 and 1820 and the conductive trace 1919 extend, in a top view of the layout diagram 1900A. In some embodiments, the conductive traces 1911-1918 are disposed in the M0 layer, and the conductive trace 1919 is disposed in the M1 layer which is formed over the M0 layer. Accordingly, the conductive traces 1911-1918 are referred to as M0 portions, and the conductive trace 1919 is referred to as a M1 portion, in some embodiments.

The via 1921 is disposed on the conductive segment 1822, and couples the conductive segment 1822 to the conductive trace 1911. The via 1925 is disposed on the conductive segment 1815, and couples the conductive segment 1815 to the conductive trace 1915. The via 1951 is disposed on the conductive trace 1911, and couples the conductive trace 1911 to the conductive trace 1919. The via 1952 is disposed on the conductive trace 1915, and couples the conductive trace 1915 to the conductive trace 1919.

The vias 1922-1924 are disposed on the conductive segments 1811-1813, respectively, and couple the conductive segments 1811-1813, respectively, to the conductive trace 1914. Alternatively stated, the conductive segments 1811-1813 are coupled to each other through the conductive trace 1914, which corresponds to the source and drain terminals of each one of the PMOS transistors P6 and P7 being coupled together in a short-circuit configuration and thereby inoperative. The vias 1926-1928 are disposed on the conductive segments 1824-1826, respectively, and couple the conductive segments 1824-1826, respectively, to the conductive trace 1918. Alternatively stated, the conductive segments 1824-1826 are coupled to each other through the conductive trace 1918, which corresponds to the source and drain terminals of each one of the NMOS transistors N6 and N7 being coupled together in a short-circuit configuration and thereby inoperative.

The vias 1921 and 1926-1928 correspond to different NVD portions. The vias 1922-1925 correspond to different PVD portions. The vias 1951-1952 correspond to different VIA1 portions. With reference to FIG. 18B and FIG. 19A, the conductive segments 1811-1816 correspond to different PMD portions, and the conductive segments 1821-1826 correspond to different NMD portions. The gates 1810 and 1820 correspond to the Poly portions.

To implement the connection ZC of the PMOS transistor P3 and the NMOS transistor N4 in FIGS. 18A and 18B, with reference to FIG. 18B and FIG. 19A, the conductive segment 1815 corresponding to the source of the PMOS transistor P3 is coupled, through the via 1925, the conductive trace 1915, the via 1952, the conductive trace 1919, the via 1951, the conductive trace 1911, and the via 1921, to the conductive segment 1822 corresponding to the source of the NMOS transistor N4. Alternatively stated, the conductive traces 1915 and 1911 in the M0 layer and the conductive trace 1919 in the M1 layer are arranged to couple the conductive segment 1815 to the conductive segment 1822, which corresponds to the connection ZC in FIGS. 18A and 18B.

In the above embodiment, the layout diagram 1900A in FIG. 19A includes eight M0 portions extending across and above the Poly portions. The number of the M0 portions illustrated in FIG. 19A is given for illustrative purposes. Various numbers of the M0 portions illustrated in FIG. 19A are within the contemplated scope of the present disclosure.

FIG. 19B depicts a layout diagram 1900B corresponding to the IC 1800 in FIG. 18A based on the layout diagram 1800B depicted in FIG. 18B, in accordance with some embodiments of the present disclosure. In the layout diagram 1900B of FIG. 19B, the number of the M0 portions is reduced to six, in which, compared to the embodiments of FIG. 19A, the conductive traces 1913 and 1916 are omitted.

Figure 19C:
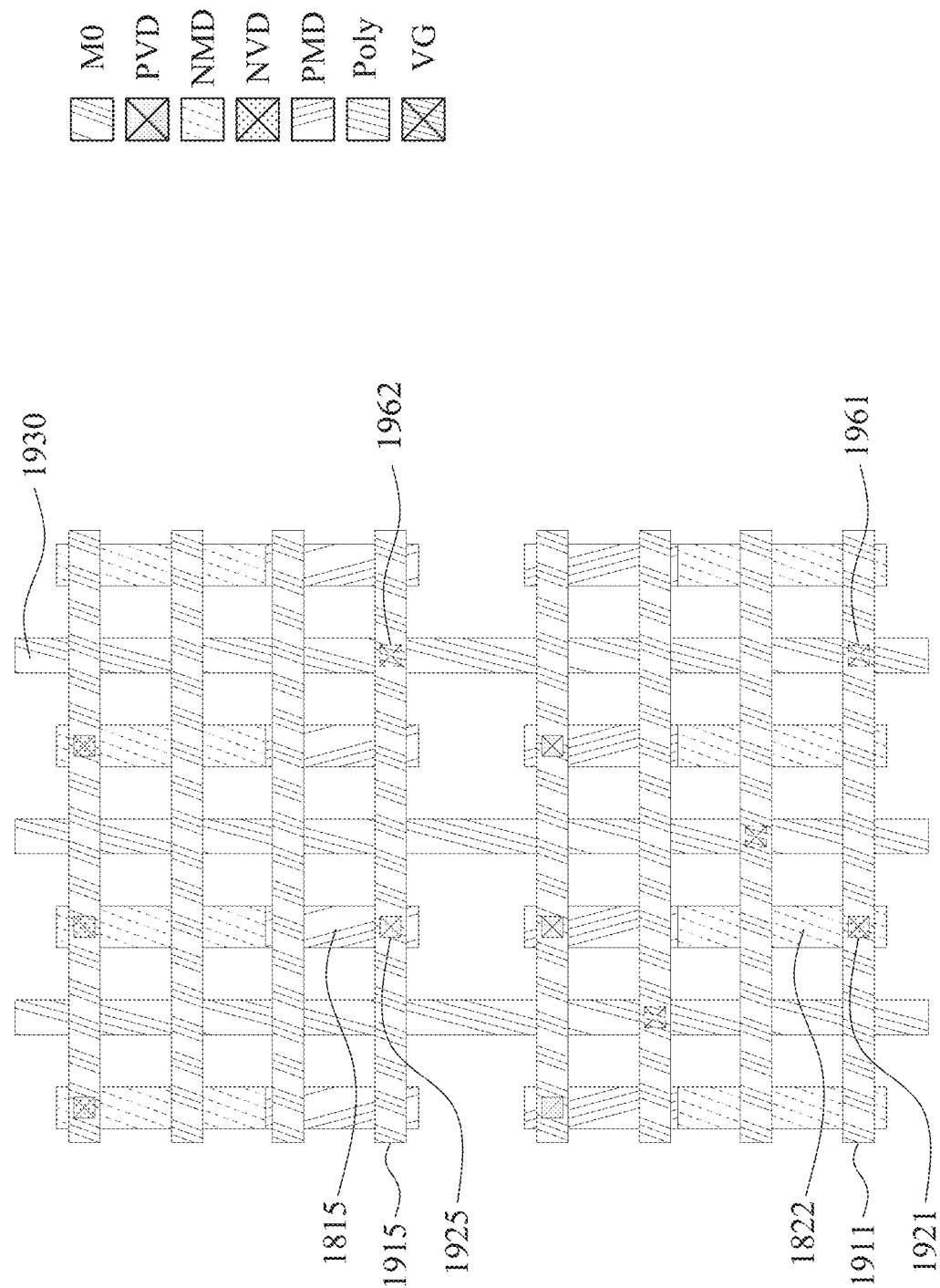

FIG. 19C depicts a layout diagram 1900C corresponding to the IC 1800 in FIG. 18A based on the layout diagram 1800B depicted in FIG. 18B, in accordance with some embodiments of the present disclosure. As illustrated in FIG. 19C, the layout diagram 1900C includes the corresponding portions as discussed above with respect to FIG. 19A, and thus the corresponding portions are not further detailed herein.

In the illustration of FIG. 19C with reference to FIG. 18B, compared to that illustrated in FIG. 19A, the layout diagram 1900C further includes a gate 1930 and vias 1961 and 1962. The gate 1930 is arranged to extend in the predetermined direction, for illustration, along which the gates 1810 and 1820 are arranged. In some embodiments, the gate 1930 is referred to as a dummy gate, in which in some embodiments, the "dummy" gate is referred to as being not electrically connected as the gate for MOS devices, having no function in the circuit. The vias 1961 and 1962 are disposed on the gate 1930, and couple the gate 1930 to the conductive traces 1911 and 1915, respectively.

As illustrated in FIG. 19C, the M0 portions, e.g., corresponding to conductive traces 1911 and 1915, the PMD and NMD portions, e.g., corresponding to conductive segments 1815 and 1822, the PVD and NVD portions, e.g., corresponding to vias 1921 and 1925, the VG portions, and the Poly portions correspond to those as discussed above with respect to the layout diagram 1900A illustrated in FIG. 19A. In the layout diagram 1900C, the gate 1930 also corresponds to one Poly portion, and vias 1961 and 1962 also correspond to different VG portions.

To implement the connection ZC of the PMOS transistor P3 and the NMOS transistor N4 in FIGS. 18A and 18B, with reference to FIG. 18B and FIG. 19C, the conductive segment 1815 corresponding to the source of the PMOS transistor P3 is coupled, through the via 1925, the conductive trace 1915, the via 1962, the gate 1930, the via 1961, the conductive trace 1911, and the via 1921, to the conductive segment 1822 corresponding to the source of the NMOS transistor N4. Alternatively stated, the gate 1930 is arranged to couple the conductive segment 1815 to the conductive segment 1822, which corresponds to the connection ZC in FIGS. 18A and 18B.

Figure 19D:
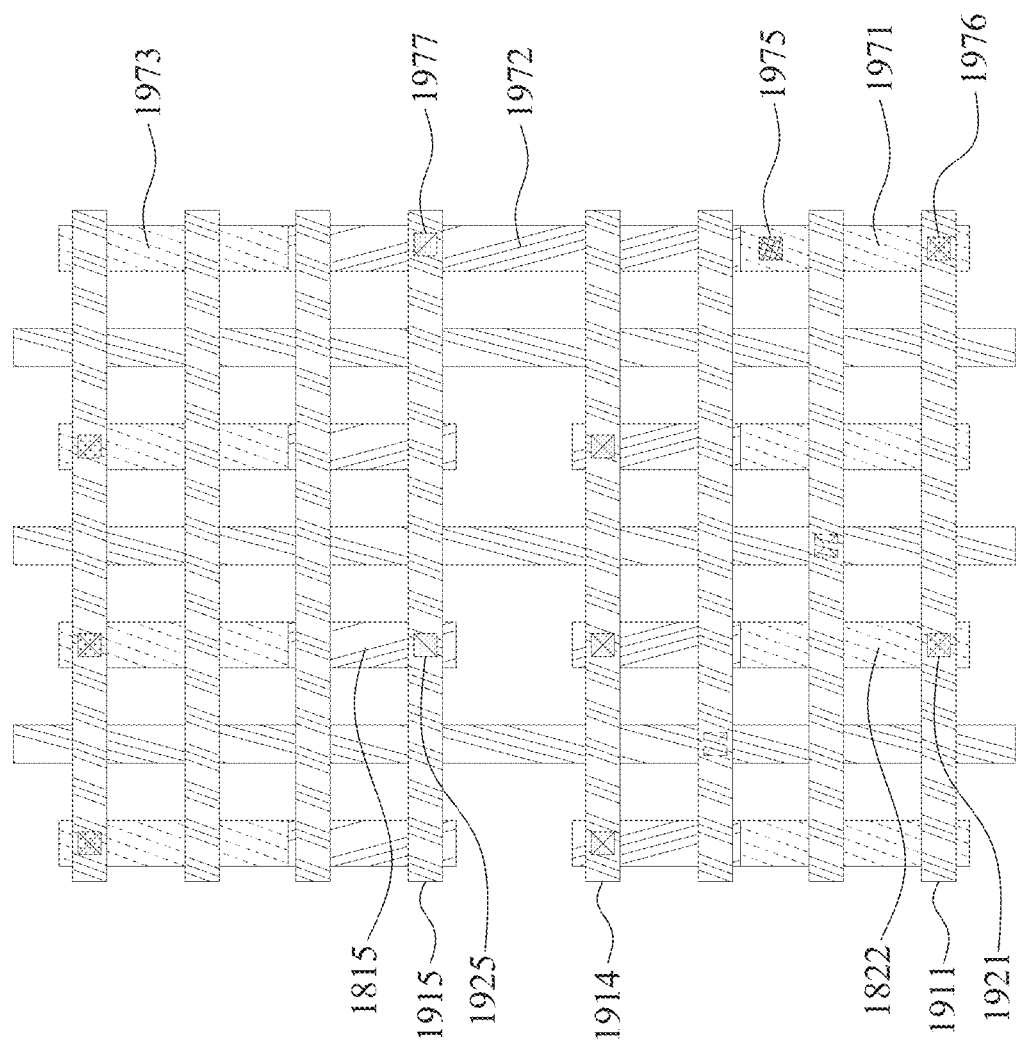

FIG. 19D depicts a layout diagram 1900D corresponding to the IC 1800 in FIG. 18A based on the layout diagram 1800B depicted in FIG. 18B, in accordance with some embodiments of the present disclosure. As illustrated in FIG. 19D, the layout diagram 1900D includes the corresponding portions as discussed above with respect to FIG. 19A, and thus the corresponding portions are not further detailed herein.

In the illustration of FIG. 19D with reference to FIG. 18B, compared to the layout diagram 1900C in FIG. 19C, the layout diagram 1900D does not include the vias 1961 and 1962, but includes a conductive local interconnect 1975. Moreover, conductive segments 1971 and 1973 are arranged in the same layer in which the conductive segment 1822 is arranged, and a conductive segment 1972 is arranged in the same layer in which the conductive segment 1815 is arranged and extends to intersect with the conductive traces 1914 and 1915 in a top view. The conductive segment 1971 is coupled through a via 1976 to the conductive trace 1911, and is coupled through the conductive local interconnect 1975 to the conductive segment 1972. The conductive segment 1972 is coupled through via 1977 to the conductive trace 1915.

As illustrated in FIG. 19D, the M0 portions, e.g., corresponding to conductive traces 1911, 1914, and 1915, the PMD and NMD portions, e.g., corresponding to conductive segments 1815 and 1822, the PVD and NVD portions, e.g., corresponding to vias 1921 and 1925, the VG portions, and the Poly portions correspond to those as discussed above with respect to the layout diagram 1900A illustrated in FIG. 19A. In the layout diagram 1900D, the conductive segment 1971 and 1972 correspond to the NMD and PMD portions, respectively, and the vias 1976 and 1977 correspond to the NVD and PVD portions, respectively. The conductive local interconnect 1975 corresponds to the MDLI portion.

To implement the connection ZC of the PMOS transistor P3 and the NMOS transistor N4 in FIGS. 18A and 18B, with reference to FIG. 18B and FIG. 19D, the conductive segment 1815 corresponding to the source of the PMOS transistor P3 is coupled, through the via 1925, the conductive trace 1915, the via 1977, the conductive segment 1972, the conductive local interconnect 1975, the conductive segment 1971, the via 1976, the conductive trace 1911, and the via 1921, to the conductive segment 1822 corresponding to the source of the NMOS transistor N4. Alternatively stated, the conductive local interconnect 1975 is arranged to couple the conductive segment 1815 to the conductive segment 1822, which corresponds to the connection ZC in FIGS. 18A and 18B.

Figure 19E:
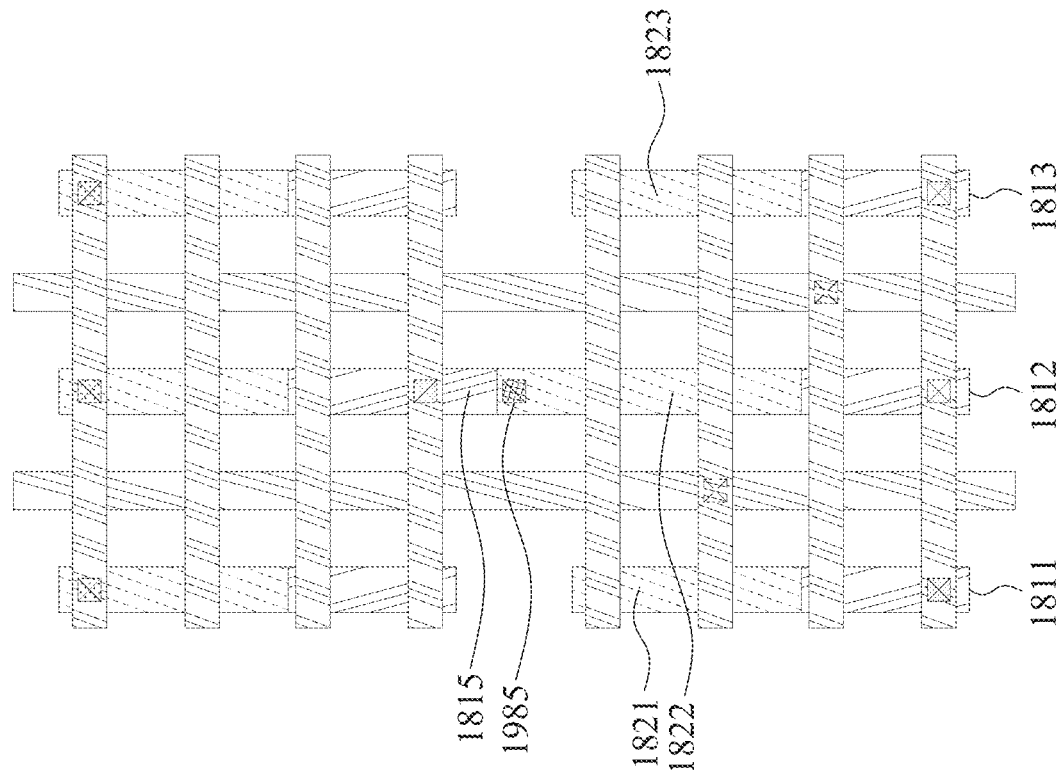

FIG. 19E depicts a layout diagram 1900E corresponding to the IC 1800 in FIG. 18A based on the layout diagram 1800B depicted in FIG. 18B, in accordance with some embodiments of the present disclosure. As illustrated in FIG. 19E, the layout diagram 1900E includes the corresponding portions as discussed above with respect to FIG. 19A, and thus the corresponding portions are not further detailed herein.

In the illustration of FIG. 19E with reference to FIG. 18B, compared to the layout diagram 1900A in FIG. 19A, the layout diagram 1900E does not include the conductive trace 1919 and the vias 1951 and 1952, but includes a conductive local interconnect 1985. Moreover, in the top view of the layout diagram 1900E, the locations of the conductive segments 1811-1813 are interchanged with the locations of the conductive segments 1821-1823, in order for the conductive segment 1822 to be coupled to the conductive segment 1815 through the conductive local interconnect 1985.

As illustrated in FIG. 19E, the M0 portions, the PMD and NMD portions, e.g., corresponding to conductive segments 1811-1813, 1815, and 1821-1823, the PVD and NVD portions, the VG portions, and the Poly portions correspond to those as discussed above with respect to the layout diagram 1900A illustrated in FIG. 19A. In the layout diagram 1900E, the conductive local interconnect 1985 corresponds to the MDLI portion.

To implement the connection ZC of the PMOS transistor P3 and the NMOS transistor N4 in FIGS. 18A and 18B, with reference to FIG. 18B and FIG. 19E, the conductive segment 1815 corresponding to the source of the PMOS transistor P3 is coupled, through the conductive local interconnect 1985, to the conductive segment 1822 corresponding to the source of the NMOS transistor N4. Alternatively stated, the conductive local interconnect 1985 is arranged to couple the conductive segment 1815 to the conductive segment 1822, which corresponds to the connection ZC in FIGS. 18A and 18B.

Figure 20A:
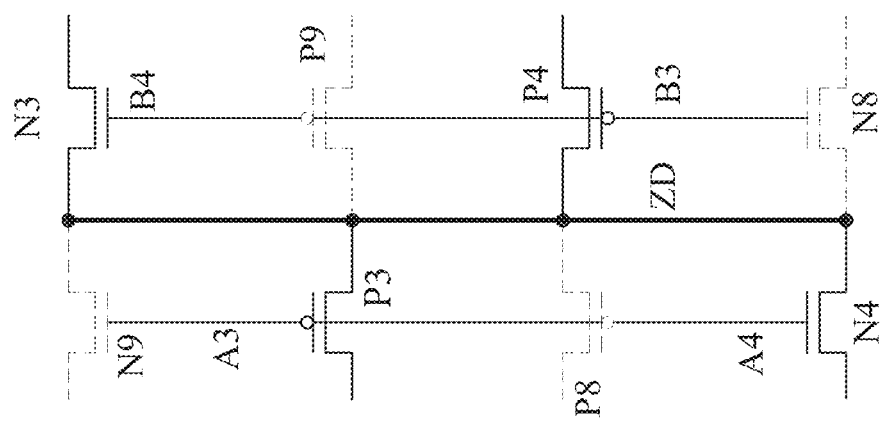
FIG. 20A is a circuit diagram of an IC equivalent to the transmission gate circuit of FIG. 10, in accordance with various embodiments of the present disclosure.

FIG. 20A is a circuit diagram of an IC 2000 equivalent to the transmission gate circuit 1000 in FIG. 10, in accordance with various embodiments of the present disclosure. Compared to the IC 1800 of FIG. 18A, in the illustration of FIG. 20A, the IC 2000 includes PMOS transistors P8 and P9 and NMOS transistors N8 and N9, and does not include PMOS transistors P6 and P7 and NMOS transistors N6 and N7. Compared to the IC 1800, in the illustration of FIG. 20A, the source terminal of the PMOS transistor P3 is coupled to a source terminal of the PMOS transistor P9, and the drain terminal of the PMOS transistor P4 is coupled to a drain terminal of the PMOS transistor P8. The drain terminal of the NMOS transistor N3 is coupled to a source terminal of the NMOS transistor N9, and the source terminal of the NMOS transistor N4 is coupled to a drain terminal of the NMOS transistor N8. For illustration, the PMOS transistors P3 and P4 and the NMOS transistor N3 and N4 are coupled together as illustrated in FIG. 20A, which corresponds to a connection ZD shown in FIG. 20A.

To be equivalent to the transmission gate circuit 1000 in FIG. 10, the source or drain terminals of each one of the PMOS transistors P8 and P9 and the NMOS transistors N8 and N9 are coupled together in a short-circuit configuration such that the PMOS transistors P8 and P9 and the NMOS transistors N8 and N9 are inoperative, as illustratively shown in FIG. 20A.

FIG. 20B depicts a layout design 2000B corresponding to the IC 2000 in FIG. 20A, in accordance with some embodiments of the present disclosure. As illustrated in FIG. 20B, the layout diagram 2000B includes the corresponding portions as discussed above with respect to FIG. 19A, and thus the corresponding portions are not further detailed herein. In the illustration of FIG. 20B, the NMOS transistor N9 includes the portions similar to those corresponding to the NMOS transistor N6 as illustrated in FIG. 19A, and the NMOS transistor N3 includes the portions similar to those corresponding to the NMOS transistor N7 as illustrated in FIG. 19A. The PMOS transistor P3 includes the portions similar to those corresponding to the PMOS transistor P4 as illustrated in FIG. 19A, and the PMOS transistor P9 includes the portions similar to those corresponding to the PMOS transistor P3 as illustrated in FIG. 19A. The PMOS transistor P8 includes the portions similar to those corresponding to the PMOS transistor P7 as illustrated in FIG. 19A, and the PMOS transistor P4 includes the portions similar to those corresponding to the PMOS transistor P6 as illustrated in FIG. 19A. The NMOS transistor N4 includes the portions similar to those corresponding to the NMOS transistor N3 as illustrated in FIG. 19A, and the NMOS transistor N8 includes the portions similar to those corresponding to the NMOS transistor N4 as illustrated in FIG. 19A.

With reference to FIG. 20B and FIG. 19A, a conductive trace 2010 in the layout diagram 2000B extends along the predetermined direction perpendicular to the direction along which the conductive traces 1911-1918 extend. In some embodiments, the conductive trace 2010 is disposed in the M1 layer. Accordingly, the conductive trace 2010 is referred to as the M1 portion, in some embodiments. Vias 2012-2015 are disposed on the conductive traces 1911, 1914, 1915, and 1918, respectively, and couple the conductive traces 1911, 1914, 1915, and 1918, respectively, to the conductive trace 2010. The vias 2012-2015 correspond to the VIA1 portions.

To implement the connection ZD shown in FIG. 20A, in the illustration of FIG. 20B, the conductive segment 1815 corresponding to the source of the PMOS transistor P3 is coupled through the via 1925, the conductive trace 1915, and the via 2014, to the conductive trace 2010. The conductive segment 1812 corresponding to the drain terminal of the PMOS transistor P4 is coupled through the via 1923, the conductive trace 1914, and the via 2013 to the conductive trace 2010. The conductive segment 1825 corresponding to the drain of the NMOS transistor N3 is coupled through the via 1927, the conductive trace 1918, and the via 2015 to the conductive trace 2010. The conductive segment 1822 corresponding to the source of the NMOS transistor N4 is coupled through the via 1921, the conductive trace 1911, and the via 2012 to the conductive trace 2010. Accordingly, the PMOS transistors P3 and P4 and the NMOS transistor N3 and N4 are coupled together corresponding to the connection ZD shown in FIG. 20A.

In the above embodiment, the layout diagram 2000B in FIG. 20B includes eight M0 portions extending across and above the Poly portions. The number of the M0 portions illustrated in FIG. 20B is given for illustrative purposes. Various numbers of the M0 portions illustrated in FIG. 20B are within the contemplated scope of the present disclosure.

Figure 20C:
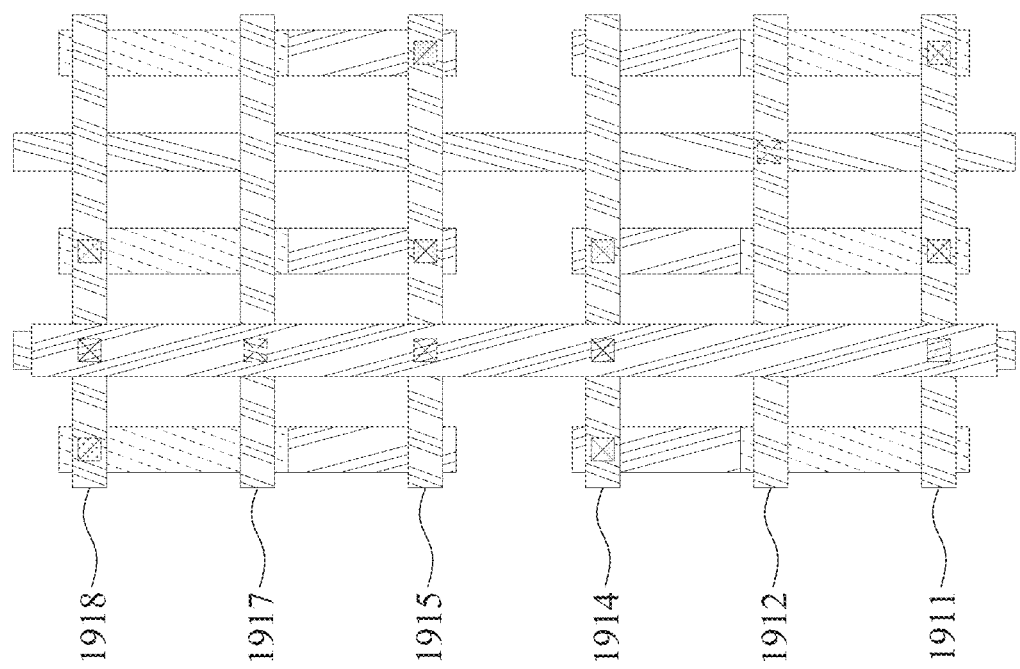

FIG. 20C depicts a layout diagram 2000C corresponding to the IC 2000 in FIG. 20A, in accordance with some embodiments of the present disclosure. In the layout diagram 2000C of FIG. 20C, the number of the M0 portions is reduced to six, compared to the embodiments of FIG. 20B, by including the conductive traces 1911, 1912, 1914, 1915, 1917, and 1918, and removing the conductive traces 1913 and 1916.

Figure 20D:
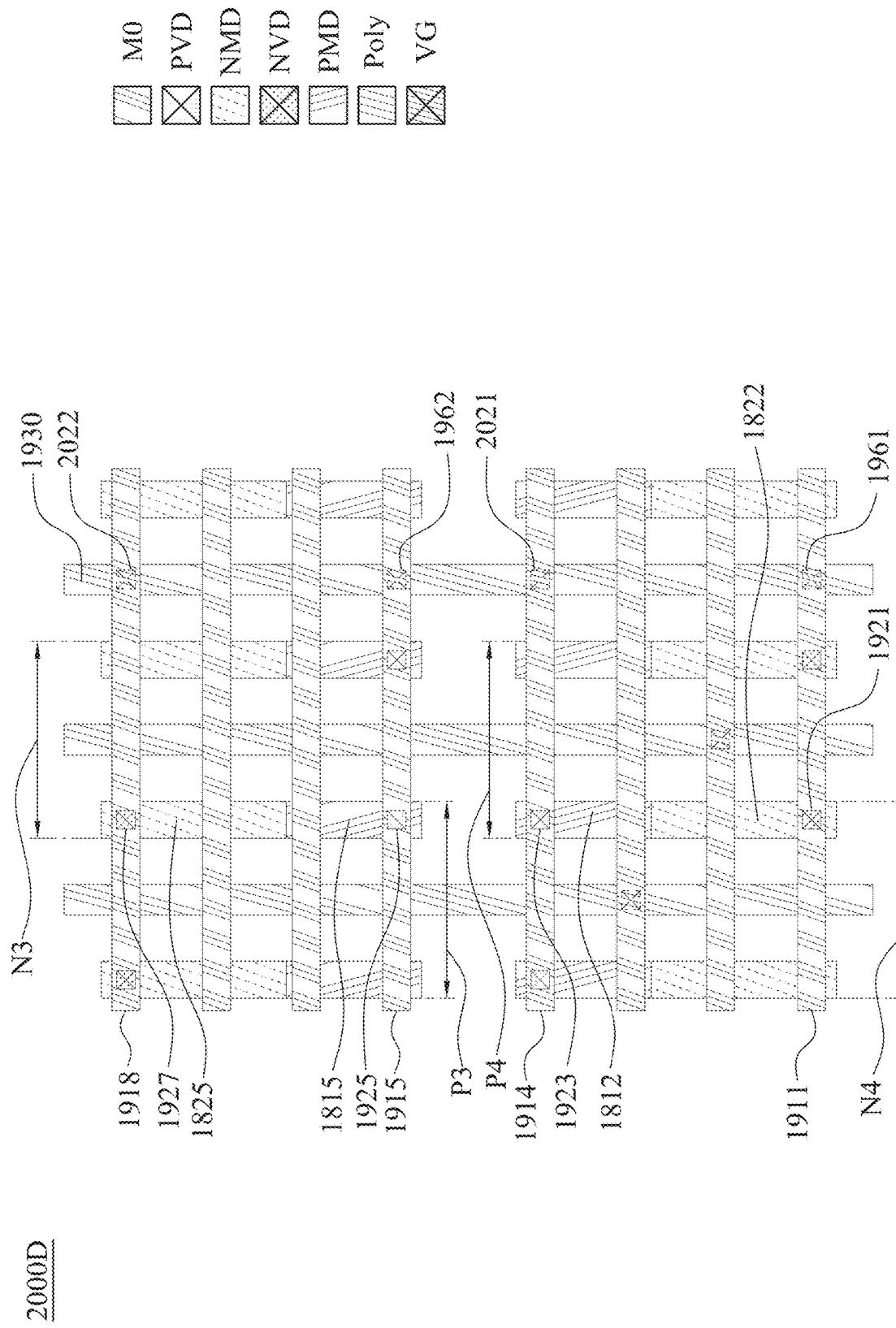

FIG. 20D depicts a layout diagram 2000D corresponding to the IC 2000 in FIG. 20A, in accordance with various embodiments of the present disclosure. As illustrated in FIG. 20D, the layout diagram 2000D includes the corresponding portions as discussed above with respect to FIG. 19C and FIG. 20B, and thus the corresponding portions are not further detailed herein. In the illustration of FIG. 20D with reference to FIG. 19C, the layout diagram 2000D further includes vias 2021 and 2022 which correspond to the VG portions. The vias 2021 and 2022 are disposed on the gate 1930, and couple the gate 1930 to the conductive traces 1914 and 1918, respectively.

To implement the connection ZD shown in FIG. 20A, in the illustration of FIG. 20D, the conductive segment 1815 corresponding to the source of the PMOS transistor P3 is coupled through the via 1925, the conductive trace 1915, and the via 1962, to the gate 1930. The conductive segment 1812 corresponding to the drain terminal of the PMOS transistor P4 is coupled through the via 1923, the conductive trace 1914, and the via 2021, to the gate 1930. The conductive segment 1825 corresponding to the drain of the NMOS transistor N3 is coupled through the via 1927, the conductive trace 1918, and the via 2022, to the gate 1930. The conductive segment 1822 corresponding to the source of the NMOS transistor N4 is coupled through the via 1921, the conductive trace 1911, and the via 1961, to the gate 1930. Accordingly, the PMOS transistors P3 and P4 and the NMOS transistor N3 and N4 are coupled together corresponding to the connection ZD shown in FIG. 20A.

FIG. 20E depicts a layout diagram 2000E corresponding to the IC 2000 in FIG. 20A, in accordance with some embodiments of the present disclosure. As illustrated in FIG. 20E, the layout diagram 2000E includes the corresponding portions as discussed above with respect to FIG. 19D and FIG. 20D, and thus the corresponding portions are not further detailed herein. In the illustration of FIG. 20E with reference to FIG. 19D and FIG. 20D, the layout diagram 2000E further includes vias 2031 and 2032 and a conductive local interconnect 2035. The via 2031 corresponds to the NVD portion, and couples the conductive segment 1973 to the conductive trace 1918. The via 2032 corresponds to the PVD portion, and couples the conductive segment 1972 to the conductive trace 1914. The conductive local interconnect 2035 corresponds to the MDLI portion, and couples the conductive segment 1973 to the conductive segment 1972.

To implement the connection ZD shown in FIG. 20A, in the illustration of FIG. 20E, the conductive segment 1815 corresponding to the source of the PMOS transistor P3 is coupled through the via 1925, the conductive trace 1915, and the via 1977, to the conductive segment 1972. The conductive segment 1812 corresponding to the drain terminal of the PMOS transistor P4 is coupled through the via 1923, the conductive trace 1914, and the via 2032, to the conductive segment 1972. The conductive segment 1825 corresponding to the drain of the NMOS transistor N3 is coupled through the via 1927, the conductive trace 1918, and the via 2031, the conductive segment 1973, the conductive local interconnect 2035, to the conductive segment 1972. The conductive segment 1822 corresponding to the source of the NMOS transistor N4 is coupled through the via 1921, the conductive trace 1911, the via 1976, the conductive segment 1971, the conductive local interconnect 1975, to the conductive segment 1972. Accordingly, the PMOS transistors P3 and P4 and the NMOS transistor N3 and N4 are coupled together as corresponding to the connection ZD shown in FIG. 20A.

FIG. 20F depicts a layout diagram 2000F corresponding to the IC 2000 in FIG. 20A, in accordance with some embodiments of the present disclosure. As illustrated in FIG. 20F, the layout diagram 2000F includes the corresponding portions as discussed above with respect to FIG. 19E and FIG. 20E, and thus the corresponding portions are not further detailed herein. Compared to the layout diagrams 1900E in FIG. 19E and 2000E in FIG. 20E, the layout diagram 2000F includes a conductive segment 2041. By the arrangement in the ROW1 of FIG. 20F, the conductive segment 2041 is coupled through a conductive local interconnect 2052 which corresponds to an additional MDLI portion, to the conductive segment 1971.

To implement the connection ZD shown in FIG. 20A, in the illustration of FIG. 20F, the conductive segment 1815 corresponding to the source of the PMOS transistor P3 is coupled through the via 1925, the conductive trace 1915, the via 1977, the conductive segment 2041, to the conductive local interconnect 2052. The conductive segment 1812 corresponding to the drain terminal of the PMOS transistor P4 is coupled through the via 1923, the conductive trace 1914, the via 2032, the conductive segment 1972, the conductive local interconnect 1975, and the conductive segment 1971, to the conductive local interconnect 2052. The conductive segment 1825 corresponding to the drain of the NMOS transistor N3 is coupled through the via 1927, the conductive trace 1918, the via 2031, the conductive segment 1973, the conductive local interconnect 2035, and the conductive segment 2041, to the conductive local interconnect 2052. The conductive segment 1822 corresponding to the source of the NMOS transistor N4 is coupled through the via 1921, the conductive trace 1911, the via 1976, and the conductive segment 1971, to the conductive local interconnect 2052. Accordingly, the PMOS transistors P3 and P4 and the NMOS transistor N3 and N4 are coupled together as corresponding to the connection ZD shown in FIG. 20A.

Figure 21A:
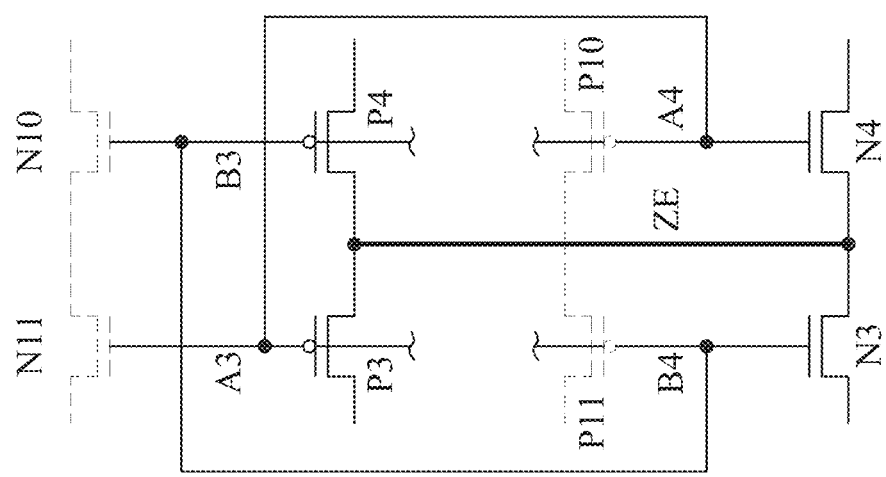
FIG. 21A is a circuit diagram of an IC equivalent to the transmission gate circuit of FIG. 10, in accordance with some embodiments of the present disclosure.

FIG. 21A is a circuit diagram of an IC 2100 equivalent to the transmission gate circuit 1000 in FIG. 10, in accordance with some embodiments of the present disclosure. The transistors in the IC 2100 are arranged at locations different from those illustrated in FIG. 18A, but have connections similar to those illustrated in FIG. 18A, and thus the connections are not further detailed herein. For illustration, the PMOS transistors P3 and P4 and the NMOS transistor N3 and N4 are coupled as illustrated in FIG. 21A, which corresponds to a connection ZE as shown in FIG. 21A.

Compared to the IC 1800 of FIG. 18A, in the illustration of FIG. 21A, the IC 2100 does not include PMOS transistors P6 and P7 and NMOS transistors N6 and N7 and instead includes PMOS transistors P10 and P11 and NMOS transistors N10 and N11, configured as discussed below with respect to FIG. 21B. To be equivalent to the transmission gate circuit 1000 in FIG. 10, the source or drain terminals of each one of the PMOS transistors P10 and P11 and the NMOS transistors N10 and N11 are coupled together in a short-circuit configuration such that the PMOS transistors P10 and P11 and the NMOS transistors N10 and N11 are inoperative, as illustratively shown in FIG. 21A.

Figure 21B:
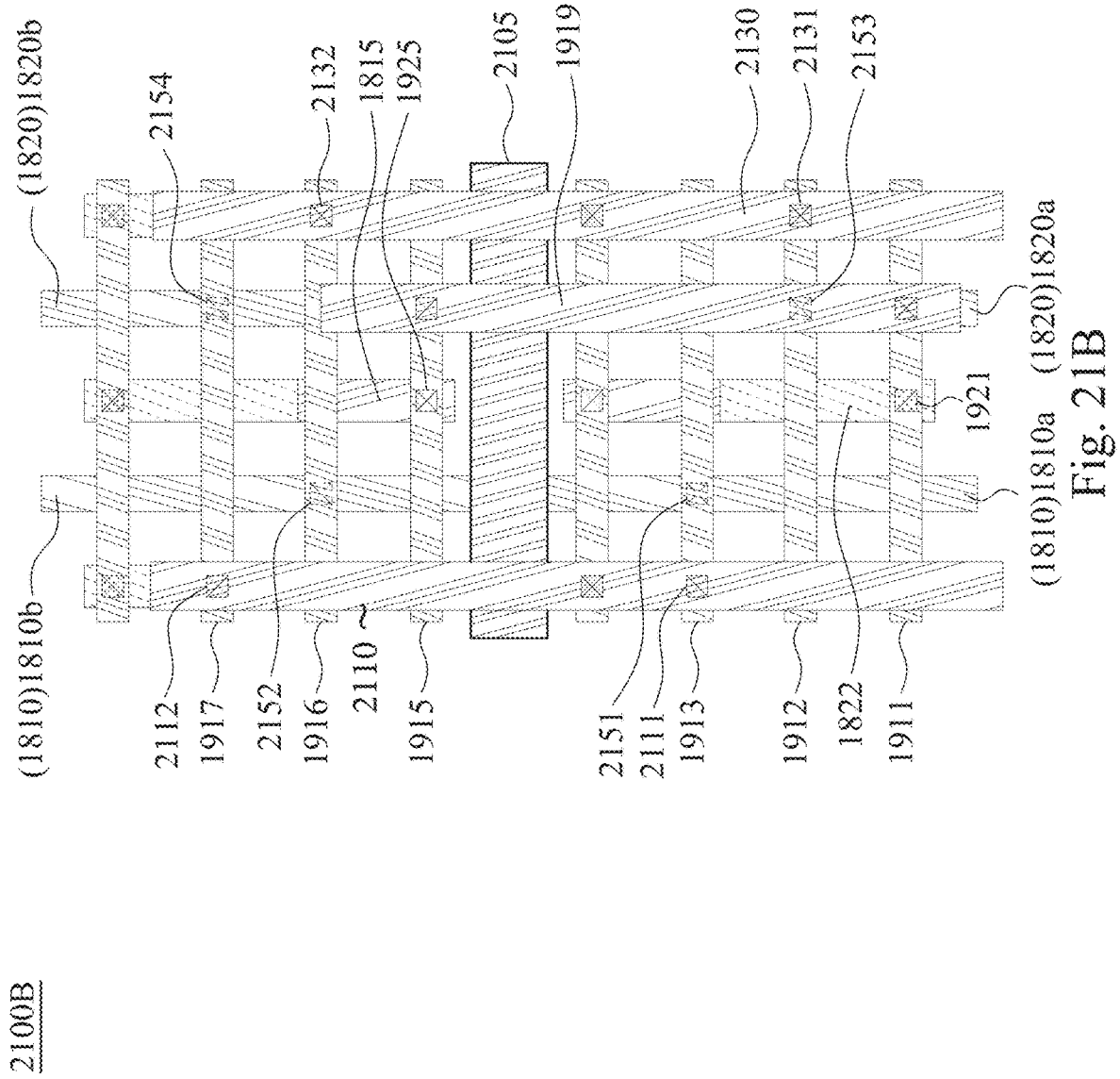
FIG. 21B depicts a layout diagram corresponding to the IC of FIG. 21A, in accordance with some embodiments of the present disclosure.

FIG. 21B depicts a layout diagram 2100B corresponding to the IC 2000 in FIG. 21A, in accordance with some embodiments of the present disclosure. As illustrated in FIG. 21B, the layout diagram 2100B includes the corresponding portions as discussed above with respect to FIG. 19A, and thus the corresponding portions are not further detailed herein. In the illustration of FIG. 21B, the PMOS transistor P3 includes the portions similar to those corresponding to the PMOS transistor P4 as illustrated in FIG. 19A, and the PMOS transistor P4 includes the portions similar to those corresponding to the PMOS transistor P3 as illustrated in FIG. 19A. The NMOS transistor N11 includes the portions similar to those corresponding to the NMOS transistor N6 as illustrated in FIG. 19A, and the NMOS transistor N10 includes the portions similar to those corresponding to the NMOS transistor N7 as illustrated in FIG. 19A.

With reference to FIG. 21B compared to FIG. 19A, a cut conductive segment 2105 is further arranged to cut the gate 1810 into separate portions 1810a and 1810b, and to cut the gate 1820 into separate gate portions 1820a and 1820b. In some embodiments, the cut conductive segment 2105 is referred to as a cut metal gate, and accordingly, the cut conductive segment 2105 is referred to as a CMG portion in some embodiments. With the gate 1820 being separated into the gate portions 1820a and 1820b, the conductive trace 1919 also couples the gate portion 1820a to the gate portion 1820b, as discussed above with respect to FIG. 19A. To implement the connection ZE in FIG. 21A, in the illustration of FIG. 21B, the conductive segment 1815 corresponding to the source of the PMOS transistor P3 is also coupled to the conductive segment 1822 corresponding to the source of the NMOS transistor N4, through the corresponding portions as discussed above with respect to FIG. 19A.

In the illustration of FIG. 21B, conductive traces 2110 and 2130 are further arranged in the layout diagram 2100B to extend along the predetermined direction perpendicular to the direction along which the conductive traces 1911-1918 extend. In some embodiments, the conductive traces 2110 and 2130 are disposed in the M1 layer. Accordingly, the conductive traces 2110 and 2130 are also referred to as the M1 portion, in some embodiments. Vias 2111 and 2112 are disposed on the conductive traces 1913 and 1917, respectively, and couple the conductive traces 1913 and 1917, respectively, to the conductive trace 2110. Vias 2131 and 2132 are disposed on the conductive traces 1912 and 1916, respectively, and couple the conductive traces 1912 and 1916, respectively, to the conductive trace 2130. The vias 2111, 2112, 2131, and 2132 correspond to the VIA1 portions.

As illustrated in FIGS. 21A and 21B, the NMOS transistor N3 and the PMOS transistor P11 share the gate portion 1810a, which corresponds to the gate terminal of the NMOS transistor N3 and the PMOS transistor P11 being coupled together. The NMOS transistor N10 and the PMOS transistor P4 share the gate portion 1820b, which corresponds to the gate terminal of the NMOS transistor N10 and the PMOS transistor P4 being coupled together. To implement the gate terminals of the NMOS transistors N3 and N10 and the PMOS transistors P11 and P4 being coupled together, the gate portion 1810a is coupled, through the via 2151 which corresponds to the VG portion, the conductive trace 1913, the via 2111, the conductive trace 2110, the via 2112, the conductive trace 1917, and the via 2154 which corresponds to the VG portion, to the gate portion 1820b.

As further illustrated in FIGS. 21A and 21B, the NMOS transistors N4 and the PMOS transistor P10 share the gate portion 1820a, which corresponds to the gate terminal of the NMOS transistor N4 and the PMOS transistor P10 being coupled together. The NMOS transistors N11 and the PMOS transistor P3 share the gate portion 1810b, which corresponds to the gate terminal of the NMOS transistor N11 and the PMOS transistor P3 being coupled together. To implement the gate terminals of the NMOS transistors N4 and N11 and the PMOS transistors P3 and P10 being coupled together, the gate portion 1820a is coupled, through the via 2153 which corresponds to the VG portion, the conductive trace 1912, the via 2131, the conductive trace 2130, the via 2132, the conductive trace 1916, and the via 2152 which corresponds to the VG portion, to the gate portion 1810b.

Figure 22A:
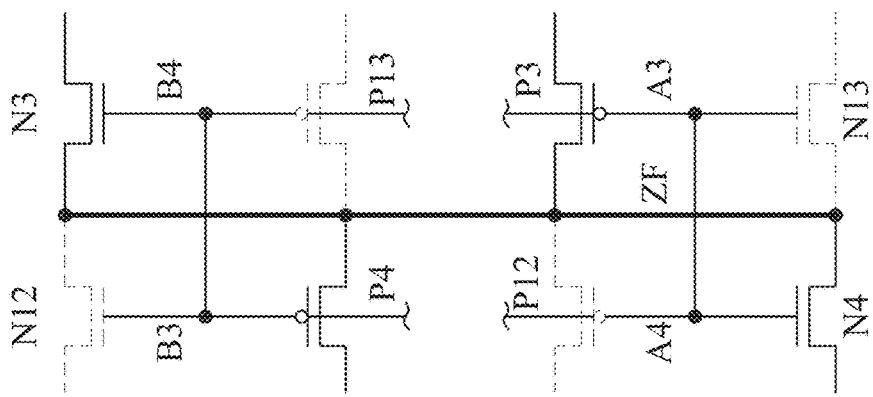
FIG. 22A is a circuit diagram of an IC equivalent to the transmission gate circuit of FIG. 10, in accordance with some embodiments of the present disclosure.

FIG. 22A is a circuit diagram of an IC 2200 equivalent to the transmission gate circuit 1000 in FIG. 10, in accordance with some embodiments of the present disclosure. The transistors in the IC 2200 are arranged at locations different from those as illustrated in FIG. 20A, but have connections similar to those as illustrated in FIG. 20A, and thus the connections are not further detailed herein. For illustration, the PMOS transistors P3 and P4 and the NMOS transistor N3 and N4 are coupled as illustrated in FIG. 22A, which corresponds to a connection ZF as shown in FIG. 22A.

Compared to the IC 2000 of FIG. 20A, in the illustration of FIG. 22A, the IC 2200 does not include PMOS transistors P8 and P9 and NMOS transistors N8 and N9 and instead includes PMOS transistors P12 and P13 and NMOS transistors N12 and N13, configured as discussed below with respect to FIG. 22B. To be equivalent to the transmission gate circuit 1000 in FIG. 10, the source or drain terminals of each one of the PMOS transistors P12 and P13 and the NMOS transistors N12 and N13 are coupled together in a short-circuit configuration such that the PMOS transistors P12 and P13 and the NMOS transistors N12 and N13 are inoperative, as illustratively shown in FIG. 22A.

FIG. 22B depicts a layout diagram 2200B corresponding to the IC 2200 in FIG. 22A, in accordance with some embodiments of the present disclosure. As illustrated in FIG. 22B, the layout diagram 2200B includes the corresponding portions as discussed above with respect to FIG. 20B, and thus the corresponding portions are not further detailed herein. In the illustration of FIG. 22B, the PMOS transistor P3 includes the portions similar to those corresponding to the PMOS transistor P4 as illustrated in FIG. 20B, and the PMOS transistor P4 includes the portions similar to those corresponding to the PMOS transistor P3 as illustrated in FIG. 20B. The NMOS transistor N13 includes the portions similar to those corresponding to the NMOS transistor N8 as illustrated in FIG. 20B, and the NMOS transistor N12 includes the portions similar to those corresponding to the NMOS transistor N9 as illustrated in FIG. 20B.

With reference to FIG. 22B compared to FIG. 20B, a cut conductive segment 2205 is further arranged to cut the gate 1810 into separate portions 1810a and 1810b, and to cut the gate 1820 into separate gate portions 1820a and 1820b. In some embodiments, the cut conductive segment 2205 is referred to as a cut metal gate, and accordingly, the cut conductive segment 2205 is referred to as a CMG portion in some embodiments. With the gate 1810 being separated into the gate portions 1810a and 1810b, the conductive trace 2010 also couples the gate portion 1810a to the gate portion 1810b, as discussed above with respect to FIG. 20B. To implement the connection ZF in FIG. 22A, in the illustration of FIG. 22B, the conductive segment 1815 corresponding to the source of the PMOS transistor P4, the conductive segment 1812 corresponding to the drain terminal of the PMOS transistor P3, the conductive segment 1825 corresponding to the drain of the NMOS transistor N3, and the conductive segment 1822 corresponding to the source of the NMOS transistor N4 are coupled together, through the corresponding portions as discussed above with respect to FIG. 20B.

In the illustration of FIG. 22B, the layout diagram 2200B further includes vias 2211-2214 disposed on the gate portions 1810a, 1820a, 1810b, and 1820b, respectively. Accordingly, the vias 2211-2214 are also referred to as the VG portions, in some embodiments.

As illustrated in FIG. 22B, the NMOS transistors N4 and the PMOS transistor P12 share the gate portion 1810a, which corresponds to the gate terminal of the NMOS transistor N4 and the PMOS transistor P12 being coupled together. The NMOS transistors N13 and the PMOS transistor P3 share the gate portion 1820a, which corresponds to the gate terminal of the NMOS transistor N13 and the PMOS transistor P3 being coupled together. To implement the gate terminals of the NMOS transistors N4 and N13 and the PMOS transistors P3 and P12 being coupled together, the gate portion 1810a is coupled, through the via 2211, the conductive trace 1913, and the via 2212, to the gate portion 1820a.

The NMOS transistor N12 and the PMOS transistor P4 share the gate portion 1810b, which corresponds to the gate terminal of the NMOS transistor N12 and the PMOS transistor P4 being coupled together. The NMOS transistors N3 and the PMOS transistor P13 share the gate portion 1820b, which corresponds to the gate terminal of the NMOS transistor N3 and the PMOS transistor P13 being coupled together. To implement the gate terminals of the NMOS transistors N3 and N12 and the PMOS transistors P13 and P4 being coupled together, the gate portion 1810b is coupled, through the via 2213, the conductive trace 1916, and the via 2214, to the gate portion 1820b.

Figure 23:
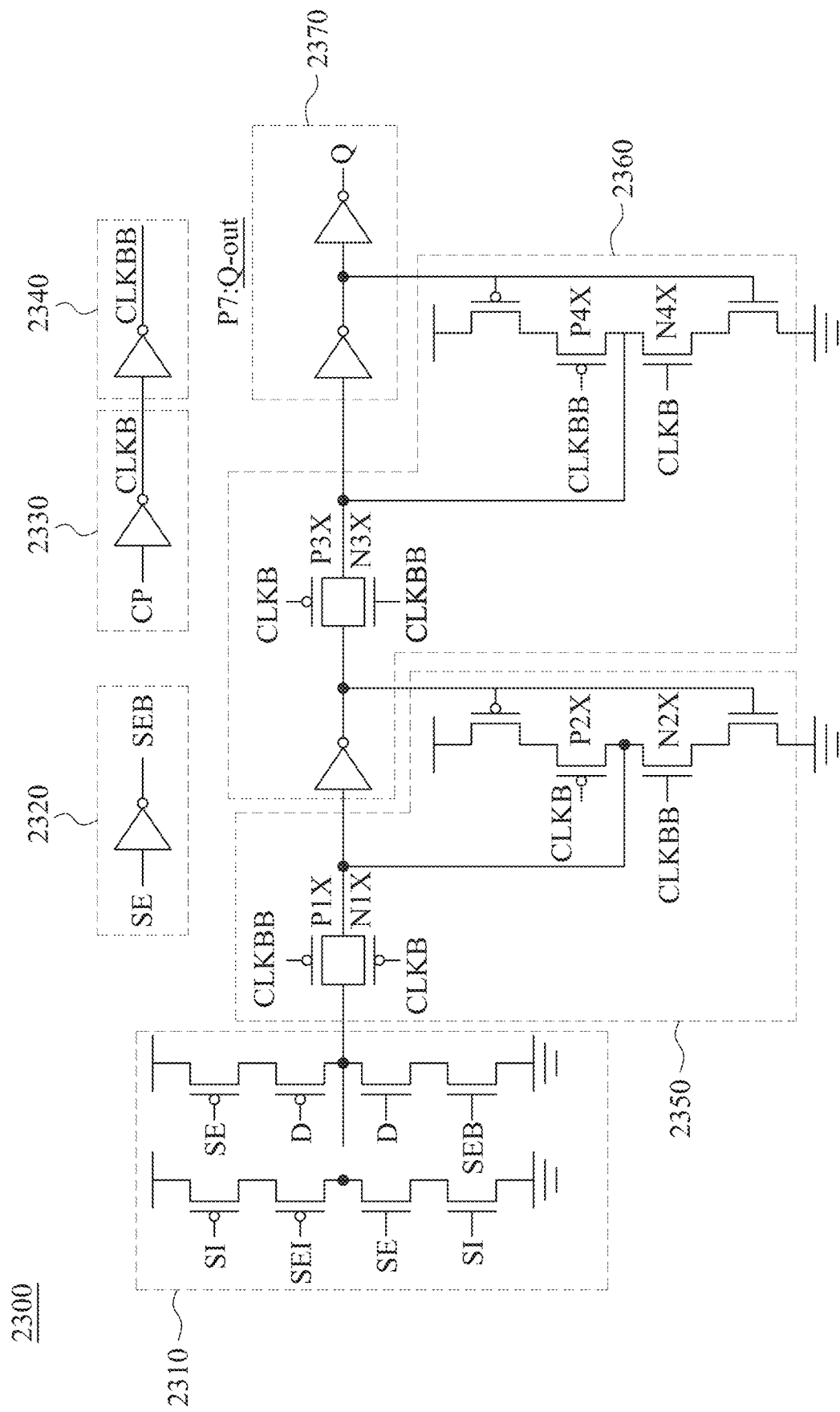
FIG. 23 is a circuit diagram of a flip-flop circuit in accordance with some embodiments of the present disclosure.

FIG. 23 is a circuit diagram of a flip-flop circuit 2300 in accordance with some embodiments of the present disclosure. The flip-flop circuit 2300 includes a multiplexer unit 2310, a first inverter unit 2320, a second inverter unit 2330, a third inverter unit 2340, a master latch unit 2350, a slave latch unit 2360, and an output unit 2370. The multiplexer unit 2310 is configured as a data path that operates at least in response to an enable signal SE. The first inverter unit 2320 is configured to invert the enable signal SE to generate an enable bar signal SEB. The second inverter unit 2330 is configured to invert a clock pulse signal CP to generate a clock signal CLKB. The third inverter unit 2340 is configured to invert the clock signal CLKB to generate a clock bar signal CLKBB. The master latch unit 2350 operates in response to the clock signal CLKB and the clock bar signal CLKBB. The slave latch unit 2360 also operates in response to the clock signal CLKB and the clock bar signal CLKBB. The output unit 2370 is configured to buffer and output a signal (not labeled) passing the master latch unit 2350 and the slave latch unit 2360.

In the embodiment illustrated in FIG. 23, the master latch unit 2350 includes PMOS transistors P1X and P2X and NMOS transistors N1X and N2X that correspond to the transmission gate circuit 1000 in FIG. 10. The slave latch unit 2360 includes PMOS transistors P3X and P4X and NMOS transistors N3X and N4X that correspond to the transmission gate circuit 1000 in FIG. 10. In the illustration of FIG. 23, the PMOS transistors P1X and P4X and the NMOS transistors N2X and N3X are coupled together to receive the clock bar signal CLKBB, and the PMOS transistors P2X and P3X and the NMOS transistors N1X and N4X are coupled together to receive the clock signal CLKB.

Figure 24:
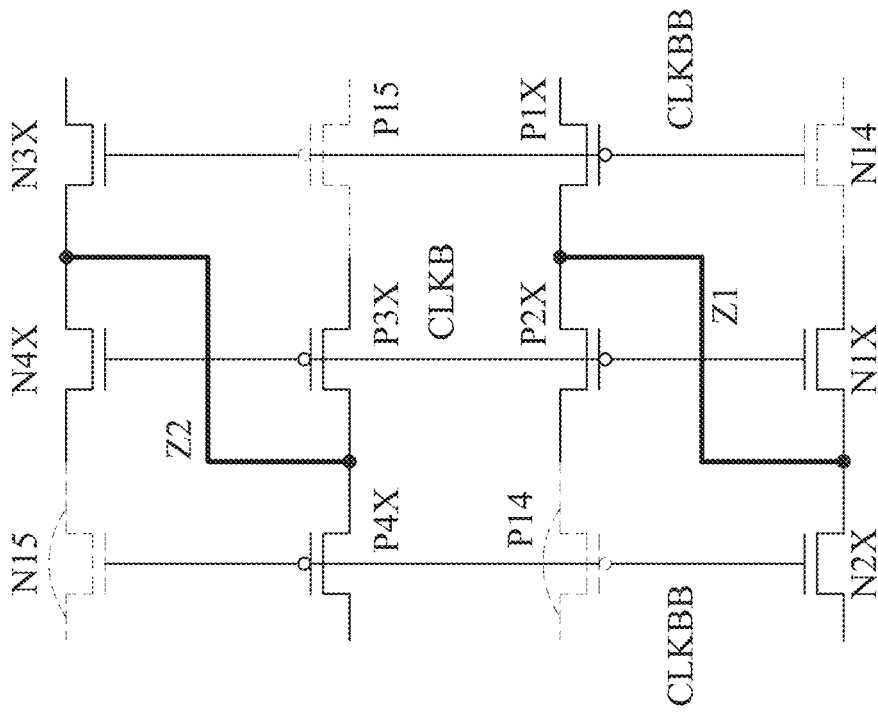
FIG. 24 is a circuit diagram of an IC equivalent to a circuit including two transmission gate circuits of FIG. 23, in accordance with some embodiments of the present disclosure.

FIG. 24 is a circuit diagram of an IC 2400 equivalent to a circuit including the two transmission gate circuits in FIG. 23, in accordance with some embodiments of the present disclosure. In the illustration of FIG. 24, the PMOS transistors P1X, P2X, and P14, and the NMOS transistors N1X, N2X, and N14 correspond to the IC 1100 illustrated in FIG. 11A, in which a source terminal of the PMOS transistor P1X and a drain terminal of the NMOS transistor N1X are coupled to a drain terminal of the PMOS transistor P2X and a source terminal of the NMOS transistor N2X, to indicate a connection Z1 as shown in FIG. 24. The PMOS transistors P3X, P4X, and P15, and the NMOS transistors N3X, N4X, and N15 also correspond to the IC 1100 as illustrated in FIG. 11A, in which a source terminal of the PMOS transistor P4X and a drain terminal of the NMOS transistor N4X are coupled to a drain terminal of the PMOS transistor P3X and a source terminal of the NMOS transistor N3X, to indicate a connection Z2 as shown in FIG. 24.

In the illustration of FIG. 24, the source and drain terminals of each one of the PMOS transistor P14 and the NMOS transistor N14 are coupled together in a short-circuit configuration such that the PMOS transistor P14 and the NMOS transistor N14 are inoperative. The source and drain terminals of each one of the PMOS transistor P15 and the NMOS transistor N15 are coupled together in a short-circuit configuration such that the PMOS transistor P15 and the NMOS transistor N15 are inoperative. By the connections of the PMOS transistors P1X-P4X and the NMOS transistors N1X-N4X, as illustrated in FIG. 24, the IC 2400 is able to operate as a circuit equivalent to the two transmission gate circuits illustrated in FIG. 23.

Figure 25:
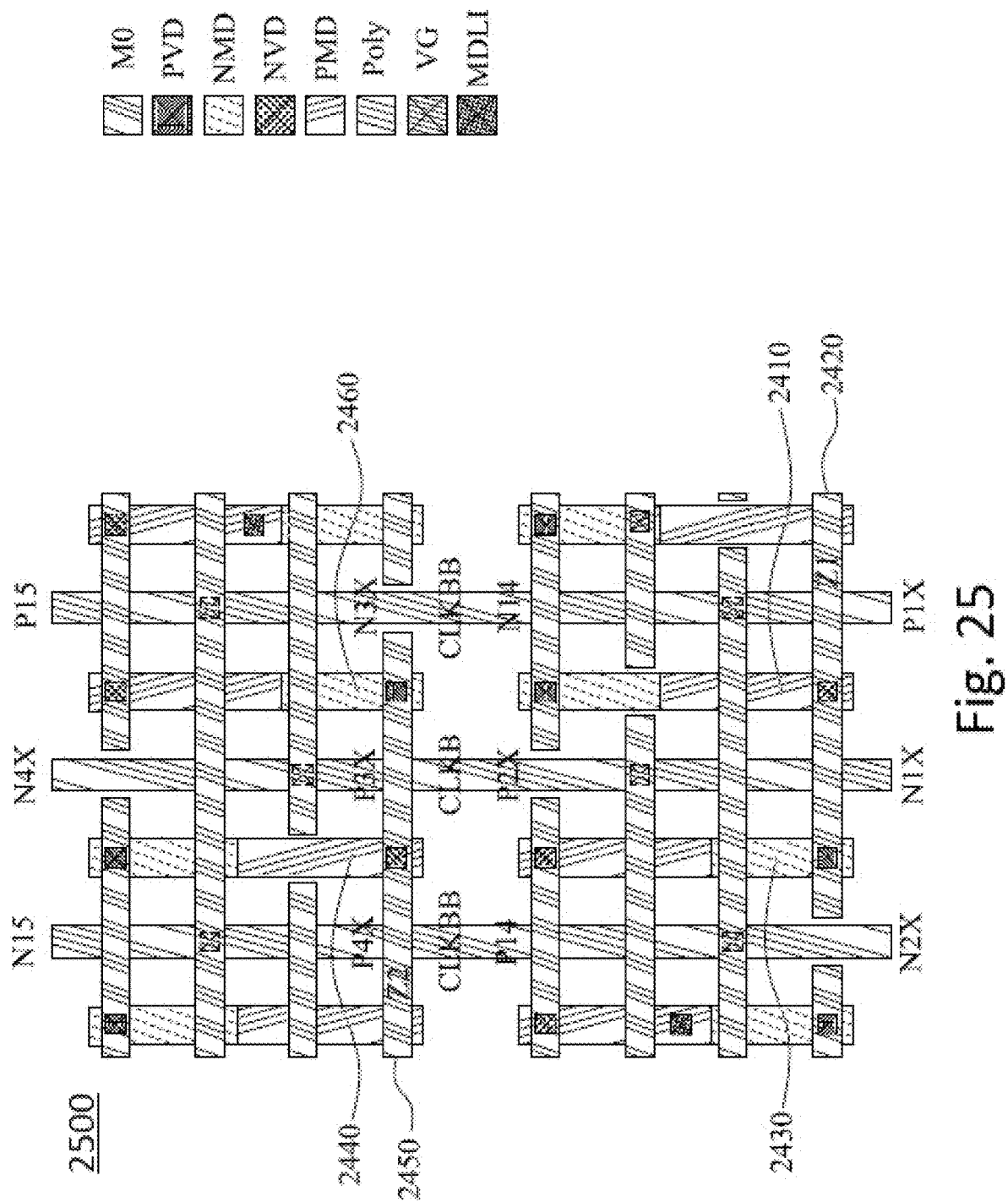
FIG. 25 depicts a layout diagram corresponding to the IC of FIG. 24, in accordance with some embodiments of the present disclosure.

FIG. 25 depicts a layout diagram 2500 corresponding to the IC 2400 of FIG. 24, in accordance with some embodiments of the present disclosure. In the embodiment depicted in FIG. 25, the PMOS transistors P1X-P4X, P14, and P15 are stacked on the NMOS transistors N1X-N4X, N14, and N15. In some embodiments, the NMOS transistors N1X-N4X, N14, and N15 are stacked on the PMOS transistors P1X-P4X, P14, and P15.

As illustrated in FIG. 25, to implement the connection Z1, the conductive segment 2410 corresponding to the source terminal of the PMOS transistor P1X is coupled, through the conductive trace 2420 corresponding to the M0 portion, to the conductive segment 2430 corresponding to the drain terminal of the NMOS transistor N1X, which is similar to the implementation illustrated with reference to FIGS. 12A and 12B. To implement the connection Z2, the conductive segment 2440 corresponding to the source terminal of the PMOS transistor P4X is coupled, through the conductive trace 2450 corresponding to the M0 portion, to the conductive segment 2460 corresponding to the drain terminal of the NMOS transistor N4X, which is similar to the implementation illustrated with reference to FIGS. 12A and 12B.

As illustrated by the non-limiting examples depicted in FIGS. 1-25 and discussed above, the various embodiments include stacked transistors with source/drains offset along a gate direction, thereby improving access to the source/drains and increasing routing flexibility compared to approaches in which source/drains are not offset along a gate direction.

FIG. 26 is a flowchart of a method 2600 of generating an IC layout diagram, in accordance with some embodiments of the present disclosure. In some embodiments, generating an IC layout diagram includes generating one of layout diagrams 300B, 400B, 400C, 500B-500D, 600B-600D, 700B-700D, 800B-800D, 900B, 1100B-1800B, 1900A-1900E, 2000A-2000F, 2100B, 2200B, or 2500, corresponding to an IC structure, e.g., one of layout structures 300, 500, 600, 700, 800, 900, 1200, 1300, 1400, 1500, 1600, or 1700, discussed above with respect to FIGS. 2A-25, manufactured based on the generated IC layout diagram. In some embodiments, generating the IC layout diagram is part of operating an IC manufacturing system as part of manufacturing an IC device, e.g., a memory circuit, logic device, processing device, signal processing circuit, or the like.

In some embodiments, some or all of method 2600 is executed by a processor of a computer. In some embodiments, some or all of method 2600 is executed by a processor 2702 of an IC device design system 2700, discussed below with respect to FIG. 27.

Some or all of the operations of method 2600 are capable of being performed as part of a design procedure performed in a design house, e.g., design house 2820 discussed below with respect to FIG. 28.

In some embodiments, the operations of method 2600 are performed in the order depicted in FIG. 26. In some embodiments, the operations of method 2600 are performed simultaneously and/or in an order other than the order depicted in FIG. 26. In some embodiments, one or more operations are performed before, between, during, and/or after performing one or more operations of method 2600.

At operation 2610, conductive portions of a first conductive layer are arranged on first and second sides of a gate. Arranging the conductive portions of the first conductive layer includes arranging first and second conductive portions of the first conductive layer as first and second source/drains of a first transistor of a first type, the first transistor comprising the gate.

In some embodiments, arranging the conductive portions of the first conductive layer includes arranging conductive portions corresponding to source/drains 112 and 114 discussed above with respect to FIGS. 1-3B. In various embodiments, arranging the conductive portions of the first conductive layer includes arranging two or more of conductive portions 411-425 discussed above with respect to FIGS. 4A-5D, conductive portions 631-643 discussed above with respect to FIGS. 6A-8D, conductive portions 921-935 discussed above with respect to FIGS. 9A and 9B, conductive portions 1111-1127 discussed above with respect to FIGS. 11B-17B, conductive portion 1413 discussed above with respect to FIGS. 14A-15B, conductive portions 1821-1826 discussed above with respect to FIGS. 18B-22B, conductive portion 1972 discussed above with respect to FIGS. 19D, 20E, and 20F, conductive portion 2041 discussed above with respect to FIG. 20F, or conductive portions, e.g., conductive portions 2430 or 2460 discussed above with respect to FIG. 25.

In some embodiments, arranging the conductive portions on first and second sides of the gate includes arranging conductive portions on first and second sides of a gate or poly portion corresponding to gate 150 discussed above with respect to FIGS. 1-3B. In various embodiments, arranging the conductive portions on first and second sides of the gate includes arranging the conductive portions on first and second sides of one of gates 410-430 discussed above with respect to FIGS. 4A-5D, gates 610 or 620 discussed above with respect to FIGS. 6A-8D, gates 911-914 discussed above with respect to FIGS. 9A and 9B, gates 1110-1130 discussed above with respect to FIGS. 11B-17B, gate 1410 discussed above with respect to FIGS. 14A-15B, gates 1810 or 1820 discussed above with respect to FIGS. 18B-22B, gate 1930 discussed above with respect to FIGS. 19C, 19D, and 20D-20F, or gates discussed above with respect to FIG. 25.

At operation 2620, conductive portions of a second conductive layer are arranged on the first and second sides of the gate, the second layer overlying the first conductive layer. Arranging the conductive portions of the second conductive layer includes arranging third and fourth conductive segments of the second conductive layer as first and second source/drains of a second transistor of a second type, the second transistor comprising the gate.

In some embodiments, arranging the conductive portions of the second conductive layer includes arranging conductive portions corresponding to source/drains 122 and 124 discussed above with respect to FIGS. 1-3B. In various embodiments, arranging the conductive portions of the second conductive layer includes arranging two or more of conductive portions 411-425 discussed above with respect to FIGS. 4A-5D, conductive portions 631-643 discussed above with respect to FIGS. 6A-8D, conductive portions 921-935 discussed above with respect to FIGS. 9A and 9B, conductive portions 1111-1127 discussed above with respect to FIGS. 11B-17B, conductive portion 1411 discussed above with respect to FIGS. 14A-15B, conductive portions 1821-1826 discussed above with respect to FIGS. 18B-22B, conductive portions 1971 or 1973 discussed above with respect to FIGS. 19D, 20E, and 20F, or conductive portions, e.g., conductive portions 2410 or 2440 discussed above with respect to FIG. 25.

Arranging the conductive portions of the second conductive layer on first and second sides of the gate is performed in accordance with arranging the conductive portions of the first conductive layer on first and second sides of the gate as discussed above with respect to operation 2610.

Arranging the conductive portions of the second conductive layer includes partially overlapping the first and third conductive portions on the first side of the gate and partially overlapping the second and fourth conductive portions on the second side of the gate. Partially overlapping the conductive portions corresponds to source/drain 122 partially overlying source/drain 112 by being offset along the Y direction, and source/drain 124 partially overlying source/drain 114 by being offset along the Y direction, as discussed above with respect to FIGS. 1-3B.

In some embodiments, partially overlapping the first and third conductive portions includes offsetting the first portion from the third portion in a first direction, and overlapping the second and fourth conductive portions includes offsetting the second portion from the fourth portion in the first direction, corresponding to the embodiment depicted in FIGS. 2B and 2D and implemented in the various embodiments discussed above with respect to FIGS. 4A-25.

In some embodiments, partially overlapping the first and third conductive portions includes offsetting the first portion from the third portion in a first direction, and overlapping the second and fourth conductive portions includes offsetting the second portion from the fourth portion in in a second direction opposite the first direction, corresponding to the embodiments depicted in FIGS. 2A and 2C and implemented in the various embodiments discussed above with respect to FIGS. 3A-25.

In some embodiments, partially overlapping the first and third conductive portions includes overlapping each of the first and third conductive portions with a MDLI. In various embodiments, overlapping each of the first and third conductive portions with a MDLI includes overlapping conductive portions with one of MDLI 350 discussed above with respect to FIGS. 3A and 3B, MDLI 685 discussed above with respect to FIGS. 6A-6D, MDLI 1450 discussed above with respect to FIGS. 14A and 14B, MDLI 1975 discussed above with respect to FIGS. 19D, 20E, and 20F, MDLI 1985 discussed above with respect to FIG. 19E, MDLI 2035 discussed above with respect to FIGS. 20E and 20F, or MDLI 2052 discussed above with respect to FIG. 20F.

At operation 2630, in some embodiments, a conductive feature is arranged as part of a conductive path between a conductive portion of the first conductive layer and a conductive portion of the second conductive layer. Arranging the conductive feature includes arranging one or more IC layout features in accordance with the embodiments discussed above with respect to FIGS. 3A-25.

In some embodiments, arranging the conductive feature as part of a conductive path includes arranging the conductive feature corresponding to a conductive segment of a transmission gate circuit connection. In various embodiments, arranging the conductive feature corresponds to connection ZA discussed above with respect to FIGS. 4A-9B, connection ZB discussed above with respect to FIGS. 10-17B, connection BX discussed above with respect to FIGS. 11A-17B, connection ZC discussed above with respect to FIGS. 18A-19E, connection ZD discussed above with respect to FIGS. 20A-20F, connection ZE discussed above with respect to FIGS. 21A and 21B, connection ZF discussed above with respect to FIGS. 22A and 22B, or connection Z1 or Z2 discussed above with respect to FIGS. 24 and 25.

At operation 2640, in some embodiments, an IC layout diagram is generated. The IC layout diagram includes the first, second, third, and fourth conductive portions arranged as discussed above with respect to operations 2610-2630.

In some embodiment, generating the IC layout diagram includes storing the IC layout diagram in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 2714 of IC device design system 2700, discussed below with respect to FIG. 27.

At operation 2650, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 28.

At operation 2660, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 28.

By executing some or all of the operations of method 2600, an IC layout diagram and corresponding IC device, e.g., as discussed above with respect to FIGS. 1-25, are generated in which the various embodiments include stacked transistors with source/drains offset along a gate direction, thereby improving access to the source/drains and increasing routing flexibility compared to approaches in which source/drains are not offset along a gate direction.

Figure 27:
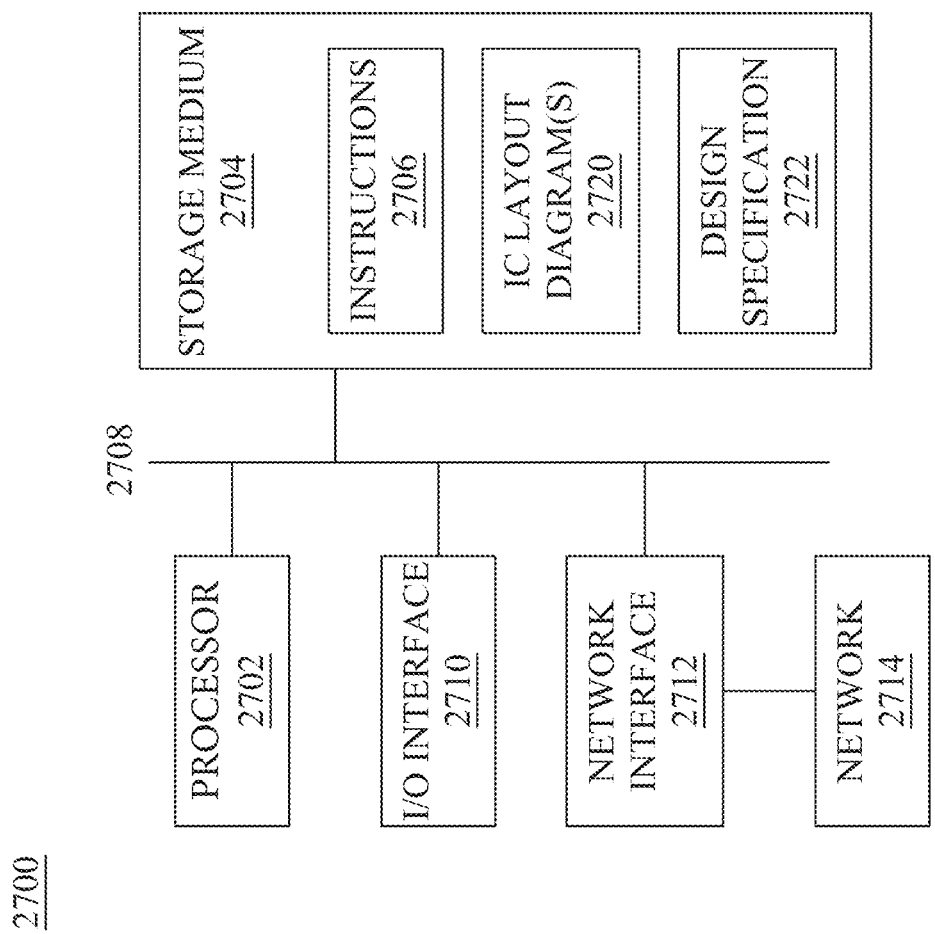
FIG. 27 is a block diagram of an IC device design system, in accordance with some embodiments of the present disclosure.

FIG. 27 is a block diagram of an IC device design system 2700, in accordance with some embodiments of the present disclosure. One or more operations of method 2600 as discussed above with respect to FIG. 26, are implementable using the IC device design system 2700, in accordance with some embodiments.

In some embodiments, IC device design system 2700 is a computing device including a hardware processor 2702 and a non-transitory computer-readable storage medium 2704. Non-transitory computer-readable storage medium 2704, amongst other things, is encoded with, i.e., stores, computer program codes, i.e., a set of executable instructions 2706. Execution of instructions 2706 by the hardware processor 2702 represents (at least in part) an IC device design system which implements a portion or all of, e.g., method 2600 discussed above with respect to FIG. 26 (hereinafter, the noted processes and/or methods).

Processor 2702 is electrically coupled to non-transitory computer-readable storage medium 2704 via a bus 2708. Processor 2702 is also electrically coupled to an I/O interface 2710 by bus 2708. A network interface 2712 is also electrically connected to processor 2702 via bus 2708. Network interface 2712 is connected to a network 2714, so that processor 2702 and non-transitory, computer-readable storage medium 2704 are capable of being connected to external elements via network 2714. Processor 2702 is configured to execute the instructions 2706 encoded in non-transitory computer-readable storage medium 2704 in order to cause IC device design system 2700 to be usable for performing a portion or all of the noted processes and/or methods. In one or more embodiments, processor 2702 is a central processing unit (CPU), a multi-processor, a distributed processing system, an application specific IC (ASIC), and/or a suitable processing unit.

In one or more embodiments, non-transitory computer-readable storage medium 2704 is an electronic, magnetic, optical, electromagnetic, infrared, and/or a semiconductor system (or apparatus or device). For example, non-transitory computer-readable storage medium 2704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 2704 includes a compact disk-read only memory (CD-ROM), a compact disk-read/write (CD-R/W), and/or a digital video disc (DVD).

In one or more embodiments, non-transitory computer-readable storage medium 2704 stores the instructions 2706 configured to cause IC device design system 2700 to be usable for performing a portion or all of the noted processes and/or methods. In one or more embodiments, non-transitory computer-readable storage medium 2704 also stores information which facilitates performing a portion or all of the noted processes and/or methods. In various embodiments, non-transitory computer-readable storage medium 2704 stores one or a combination of at least one IC layout design diagram 2720 or at least one design specification 2722, each discussed above with respect to FIGS. 2A-26.

IC device design system 2700 includes I/O interface 2710. I/O interface 2710 is coupled to external circuitry. In various embodiments, I/O interface 2710 includes one or a combination of a keyboard, keypad, mouse, trackball, trackpad, display, touchscreen, and/or cursor direction keys for communicating information and commands to and/or from processor 2702.

IC device design system 2700 also includes network interface 2712 coupled to processor 2702. Network interface 2712 allows IC device design system 2700 to communicate with network 2714, to which one or more other computer systems are connected. Network interface 2712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 2700.

IC device design system 2700 is configured to receive information through I/O interface 2710. The information received through I/O interface 2710 includes one or a combination of at least one design rule instructions, at least one set of criteria, at least one design rule, at least one DRM, and/or other parameters for processing by processor 2702. The information is transferred to processor 2702 via bus 2708. IC device design system 2700 is configured to transmit and/or receive information related to a user interface through I/O interface 2710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 2600 of FIG. 26, IC device design system 2700 and a non-transitory computer-readable storage medium, e.g., non-transitory computer-readable storage medium 2704, enable the benefits discussed above with respect to method 2600 and FIG. 26.

Figure 28:
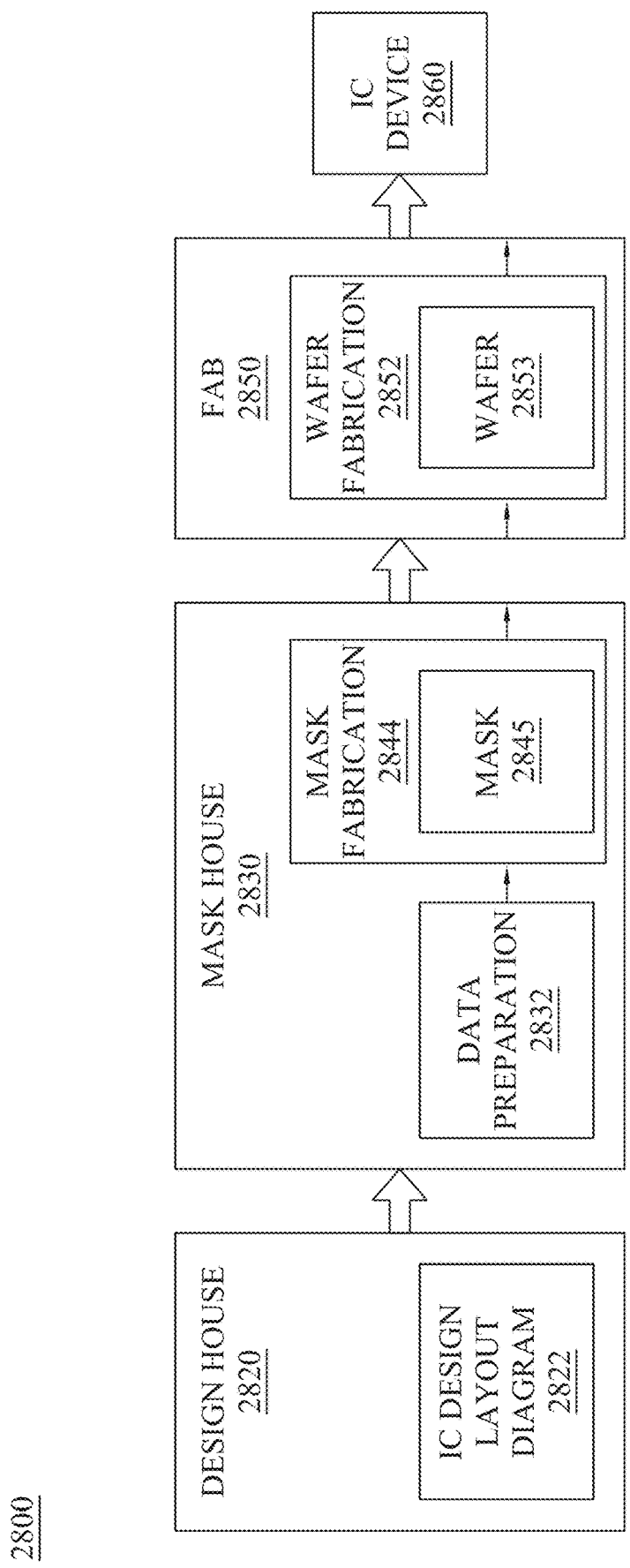
FIG. 28 is a block diagram of an IC manufacturing system, and an IC manufacturing flow associated therewith, in accordance with some embodiments of the present disclosure.

FIG. 28 is a block diagram of IC manufacturing system 2800, and an IC manufacturing flow associated therewith, in accordance with some embodiments of the present disclosure. In some embodiments, based on a layout design, at least one of (A) one or more semiconductor masks or (B) at least one component in a layer of a semiconductor IC is fabricated using the IC manufacturing system 2800.

In FIG. 28, the IC manufacturing system 2800 includes entities, such as a design house 2820, a mask house 2830, and an IC manufacturer/fabricator ("fab") 2850, that interact with one another in the design, development, and manufacturing cycles and/or services related to manufacturing an IC device 2860. The entities in system 2800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2820, mask house 2830, and IC fab 2850 is owned by a single larger company. In some embodiments, two or more of design house 2820, mask house 2830, and IC fab 2850 coexist in a common facility and use common resources.

Design house (or design team) 2820 generates an IC design layout diagram (or design) 2822 based on method 2600 of FIG. 26 and discussed above with respect to FIGS. 2A-25. IC design layout diagram 2822 includes various geometrical patterns that correspond to patterns of metal, oxide, or semiconductor layers that make up the various components of IC device 2860 to be fabricated. The various layers combine to form various IC features. For example, a portion of IC design layout diagram 2822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2820 implements a proper design procedure including method 2600 of FIG. 26 and discussed above with respect to FIGS. 2A-25, to form IC design layout diagram 2822. The design procedure includes one or more of logic design, physical design or place and route. IC design layout diagram 2822 is presented in one or more data files having information of the geometrical patterns. For example, IC design layout diagram 2822 can be expressed in a GDSII file format or DFII file format.

Mask house 2830 includes data preparation 2832 and mask fabrication 2844. Mask house 2830 uses IC design layout diagram 2822 to manufacture one or more masks 2845 to be used for fabricating the various layers of IC device 2860 according to IC design layout diagram 2822. Mask house 2830 performs mask data preparation 2832, where IC design layout diagram 2822 is translated into a representative data file ("RDF"). Mask data preparation 2832 provides the RDF to mask fabrication 2844. Mask fabrication 2844 includes a mask writer. A mask writer converts the RDF to an image on a substrate, such as a mask (reticle) 2845 or a semiconductor wafer 2853. The design layout diagram 2822 is manipulated by mask data preparation 2832 to comply with particular characteristics of the mask writer and/or requirements of IC fab 2850. In FIG. 28, mask data preparation 2832 and mask fabrication 2844 are illustrated as separate elements. In some embodiments, mask data preparation 2832 and mask fabrication 2844 are collectively referred to as mask data preparation.

In some embodiments, mask data preparation 2832 includes optical proximity correction (OPC) which uses lithography enhancement techniques to compensate for image errors, such as those that can arise from diffraction, interference, other process effects and the like. OPC adjusts IC design layout diagram 2822. In some embodiments, mask data preparation 2832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2832 includes a mask rule checker (MRC) that checks the IC design layout diagram 2822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2822 to compensate for limitations during mask fabrication 2844, which may undo part of the modifications performed by OPC in order to meet mask creation rules.

In some embodiments, mask data preparation 2832 includes lithography process checking (LPC) that simulates processing that will be implemented by IC fab 2850 to fabricate IC device 2860. LPC simulates this processing based on IC design layout diagram 2822 to create a simulated manufactured device, such as IC device 2860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2822.

It should be understood that the above description of mask data preparation 2832 has been simplified for the purposes of clarity. In some embodiments, data preparation 2832 includes additional features such as a logic operation (LOP) to modify the IC design layout diagram 2822 according to manufacturing rules. Additionally, the processes applied to IC design layout diagram 2822 during data preparation 2832 may be executed in a variety of different orders.

After mask data preparation 2832 and during mask fabrication 2844, a mask 2845 or a group of masks 2845 are fabricated based on the modified IC design layout diagram 2822. In some embodiments, mask fabrication 2844 includes performing one or more lithographic exposures based on IC design layout diagram 2822. In some embodiments, an electron-beam (e-beam) or a mechanism of multiple e-beams is used to form a pattern on a mask (photomask or reticle) 2845 based on the modified IC design layout diagram 2822. Mask 2845 can be formed in various technologies. In some embodiments, mask 2845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2845 includes a transparent substrate (e.g., fused quartz) and an opaque material (e.g., chromium) coated in the opaque regions of the binary mask. In another example, mask 2845 is formed using a phase shift technology. In a phase shift mask (PSM) version of mask 2845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2844 is used in a variety of processes. For example, such a mask(s) is used in an ion implantation process to form various doped regions in semiconductor wafer 2853, in an etching process to form various etching regions in semiconductor wafer 2853, and/or in other suitable processes.

IC fab 2850 includes wafer fabrication 2852. IC fab 2850 is an IC fabrication business that includes one or more manufacturing facilities for the fabrication of a variety of different IC products. In some embodiments, IC Fab 2850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2850 uses mask(s) 2845 fabricated by mask house 2830 to fabricate IC device 2860. Thus, IC fab 2850 at least indirectly uses IC design layout diagram 2822 to fabricate IC device 2860. In some embodiments, semiconductor wafer 2853 is fabricated by IC fab 2850 using mask(s) 2845 to form IC device 2860. In some embodiments, the IC fabrication includes performing one or more lithographic exposures based at least indirectly on IC design layout diagram 2822. Semiconductor wafer 2853 includes a silicon substrate or other proper substrate having material layers formed thereon. Semiconductor wafer 2853 further includes one or more of various doped regions, dielectric features, multi-level interconnects, and the like (formed at subsequent manufacturing steps).

Details regarding an IC manufacturing system (e.g., system 2800 of FIG. 28), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a CFET structure includes a vertical stack of first and second transistors, wherein the first transistor includes a first channel extending in a first direction from a first S/D region to a second S/D region through a gate extending in a second direction perpendicular to the first direction and the second transistor includes a second channel extending in the first direction from a third S/D region to a fourth S/D region through the gate, a first conductive trace extending in the first direction over the gate, a first via extending from the first S/D region to the first conductive trace and aligned with the third S/D region along the second direction, and a second via extending from the fourth S/D region to the first conductive trace, wherein the first via has a first height greater than a second height of the second via. In some embodiments, the CFET structure includes a plurality of conductive traces extending over the gate in the first direction in a same metal layer, wherein the plurality of conductive traces includes the first conductive trace overlying each of the first and fourth S/D regions and separated from each of the second and third S/D regions along the second direction, and a second conductive trace overlying each of the second and third S/D regions and separated from each of the first and fourth S/D regions along the second direction. In some embodiments, the plurality of conductive traces includes a third conductive trace overlying each of the first through fourth S/D regions. In some embodiments, the plurality of conductive traces includes a fourth conductive trace positioned between the first and third conductive traces, overlying each of the first and fourth S/D regions, and separated from each of the second and third S/D regions along the second direction; and a fifth conductive trace positioned between the second and third conductive traces, overlying each of the second and third S/D regions, and separated from each of the first and fourth S/D regions along the second direction. In some embodiments, the plurality of conductive traces includes a third conductive trace positioned between the first and second conductive traces, overlying each of the first and fourth S/D regions, and separated from each of the second and third S/D regions along the second direction, and a fourth conductive trace positioned between the second and third conductive traces, overlying each of the second and third S/D regions, and separated from each of the first and fourth S/D regions along the second direction. In some embodiments, the same metal layer includes a metal zero layer. In some embodiments, each of the first through fourth S/D regions includes a nanosheet stack. In some embodiments, each of the first and second S/D regions includes a p-type S/D region, and each of the third and fourth S/D regions includes an n-type S/D region. In some embodiments, the CFET structure includes a plurality of gates extending in the second, wherein the plurality of gates includes the gate being a first gate positioned between second and third gates, and the first conductive trace extends in the first direction over each of the first through third gates.

In some embodiments, a CFET device includes a first vertical stack of first and second transistors, wherein the first transistor includes a first channel extending in a first direction from a first S/D region to a second S/D region through a first gate extending in a second direction perpendicular to the first direction and the second transistor includes a second channel extending in the first direction from a third S/D region to a fourth S/D region through the first gate, a second vertical stack of third and fourth transistors, wherein the third transistor includes a third channel extending in the first direction from the second S/D region to a fifth S/D region through a second gate extending in the second direction and the fourth transistor includes a fourth channel extending in the first direction from the fourth S/D region to a sixth S/D region through the second gate, first and second conductive traces extending in the first direction over each of the first and second gates, a first via extending from the first S/D region to the first conductive trace and aligned with the third S/D region along the second direction, and a second via extending from the fourth S/D region to the second conductive trace, wherein the first via has a first height greater than a second height of the second via, and an electrical connection between the first and fourth S/D regions includes each of the first and second vias and the first and second conductive traces. In some embodiments, the electrical connection includes the fifth and sixth S/D regions, a third via extending from the fifth S/D region to the first conductive trace, aligned with the sixth S/D region along the second direction, and having the first height, a fourth via extending from the sixth S/D region to the second conductive trace and having the second height, and a conductive local interconnect extending from the fifth S/D region to the sixth S/D region. In some embodiments, the electrical connection includes the second gate, a third via extending from the second gate to the first conductive trace, and a fourth via extending from the second gate to the second conductive trace. In some embodiments, the electrical connection includes a third conductive trace extending in the second direction, a third via extending from the first conductive trace to the third conductive trace, and a fourth via extending from the second conductive trace to the third conductive trace. In some embodiments, the CFET device includes a third conductive trace positioned between the first and second conductive traces and overlying each of the first through sixth S/D regions. In some embodiments, the CFET device includes a fourth conductive trace positioned between the first and third conductive traces, overlying each of the first, second, and fifth S/D regions, and separated from each of the third, fourth, and sixth S/D regions along the second direction, and a fifth conductive trace positioned between the second and third conductive traces, overlying each of the third, fourth, and sixth S/D regions, and separated from each of the first, second, and fifth S/D regions along the second direction. In some embodiments, the CFET device includes a fourth conductive trace positioned between the first and second conductive traces, overlying each of the first, second, and fifth S/D regions, and separated from each of the third, fourth, and sixth S/D regions along the second direction, and a fifth conductive trace positioned between the second and third conductive traces, overlying each of the third, fourth, and sixth S/D regions, and separated from each of the first, second, and fifth S/D regions along the second direction.

In some embodiments, a method of manufacturing a CFET structure includes constructing a vertical stack of first transistor and a second transistor overlying the first transistor, wherein constructing the first transistor includes forming a first channel extending in a first direction from a first S/D region to a second S/D region through a gate extending in a second direction perpendicular to the first direction, and constructing the second transistor includes forming a second channel extending in the first direction from a third S/D region to a fourth S/D region through the gate, forming a first via extending from the first S/D region to a first layer and aligned with the third S/D region along the second direction, forming a second via extending from the fourth S/D region to the first layer, wherein the first via has a first height greater than a second height of the second via, and forming a first conductive trace in the first layer and electrically connected to each of the first and second vias. In some embodiments, each of constructing the first transistor and constructing the second transistor includes forming each of the corresponding first and second S/D regions or third and fourth S/D regions as a nanosheet stack. In some embodiments, forming the first conductive trace in the first layer includes forming a plurality of conductive traces in the first layer, and forming the plurality of conductive traces in the first layer includes forming the first conductive trace overlying each of the first and fourth S/D regions and separated from each of the second and third S/D regions along the second direction, and forming a second conductive trace overlying each of the second and third S/D regions and separated from each of the first and fourth S/D regions along the second direction. In some embodiments, forming the plurality of conductive traces includes forming a third conductive trace between the first and second conductive traces and overlying the gate and each of the first through fourth S/D regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A complementary field effect transistor (CFET) structure comprising:
    a vertical stack of first and second transistors, wherein
        the first transistor comprises a first channel extending in a first direction from a first source/drain (S/D) region to a second S/D region through a gate extending in a second direction perpendicular to the first direction, and
        the second transistor comprises a second channel extending in the first direction from a third S/D region to a fourth S/D region through the gate;
    a first conductive trace extending in the first direction over the gate;
    a first via extending from the first S/D region to the first conductive trace and aligned with the third S/D region along the second direction; and a second via extending from the fourth S/D region to the first conductive trace,
wherein the first via has a first height greater than a second height of the second via.

2. The CFET structure of claim 1, further comprising:
a plurality of conductive traces extending over the gate in the first direction in a same metal layer, wherein the plurality of conductive traces comprises:
the first conductive trace overlying each of the first and fourth S/D regions and separated from each of the second and third S/D regions along the second direction, and
a second conductive trace overlying each of the second and third S/D regions and separated from each of the first and fourth S/D regions along the second direction.

3. The CFET structure of claim 2, wherein the plurality of conductive traces further comprises:
a third conductive trace overlying each of the first through fourth S/D regions.

4. The CFET structure of claim 3, wherein the plurality of conductive traces further comprises:
a fourth conductive trace positioned between the first and third conductive traces, overlying each of the first and fourth S/D regions, and separated from each of the second and third S/D regions along the second direction; and
a fifth conductive trace positioned between the second and third conductive traces, overlying each of the second and third S/D regions, and separated from each of the first and fourth S/D regions along the second direction.

5. The CFET structure of claim 2, wherein the plurality of conductive traces further comprises:
a third conductive trace positioned between the first and second conductive traces, overlying each of the first and fourth S/D regions, and separated from each of the second and third S/D regions along the second direction; and
a fourth conductive trace positioned between the second and third conductive traces, overlying each of the second and third S/D regions, and separated from each of the first and fourth S/D regions along the second direction.

6. The CFET structure of claim 2, wherein the same metal layer comprises a metal zero layer.

7. The CFET structure of claim 1, wherein each of the first through fourth S/D regions comprises a nanosheet stack.

8. The CFET structure of claim 1, wherein
each of the first and second S/D regions comprises a p-type S/D region, and
each of the third and fourth S/D regions comprises an n-type S/D region.

9. The CFET structure of claim 1, further comprising:
a plurality of gates extending in the second, wherein
the plurality of gates comprises the gate being a first gate positioned between second and third gates, and
the first conductive trace extends in the first direction over each of the first through third gates.

10. A complementary field effect transistor (CFET) device comprising:
a first vertical stack of first and second transistors, wherein
the first transistor comprises a first channel extending in a first direction from a first source/drain (S/D) region to a second S/D region through a first gate extending in a second direction perpendicular to the first direction, and
the second transistor comprises a second channel extending in the first direction from a third S/D region to a fourth S/D region through the first gate;
a second vertical stack of third and fourth transistors, wherein
the third transistor comprises a third channel extending in the first direction from the second S/D region to a fifth S/D region through a second gate extending in the second direction, and
the fourth transistor comprises a fourth channel extending in the first direction from the fourth S/D region to a sixth S/D region through the second gate;
first and second conductive traces extending in the first direction over each of the first and second gates;
a first via extending from the first S/D region to the first conductive trace and aligned with the third S/D region along the second direction; and
a second via extending from the fourth S/D region to the second conductive trace,
wherein
the first via has a first height greater than a second height of the second via, and
an electrical connection between the first and fourth S/D regions comprises each of the first and second vias and the first and second conductive traces.

11. The CFET device of claim 10, wherein the electrical connection further comprises:
the fifth and sixth S/D regions;
a third via extending from the fifth S/D region to the first conductive trace, aligned with the sixth S/D region along the second direction, and having the first height;
a fourth via extending from the sixth S/D region to the second conductive trace and having the second height; and
a conductive local interconnect extending from the fifth S/D region to the sixth S/D region.

12. The CFET device of claim 10, wherein the electrical connection further comprises:
the second gate;
a third via extending from the second gate to the first conductive trace; and
a fourth via extending from the second gate to the second conductive trace.

13. The CFET device of claim 10, wherein the electrical connection further comprises:
a third conductive trace extending in the second direction;
a third via extending from the first conductive trace to the third conductive trace; and
a fourth via extending from the second conductive trace to the third conductive trace.

14. The CFET device of claim 10, further comprising:
a third conductive trace positioned between the first and second conductive traces and overlying each of the first through sixth S/D regions.

15. The CFET device of claim 14, further comprising:
a fourth conductive trace positioned between the first and third conductive traces, overlying each of the first, second, and fifth S/D regions, and separated from each of the third, fourth, and sixth S/D regions along the second direction; and
a fifth conductive trace positioned between the second and third conductive traces, overlying each of the third, fourth, and sixth S/D regions, and separated from each of the first, second, and fifth S/D regions along the second direction.

16. The CFET device of claim 10, further comprising:
a fourth conductive trace positioned between the first and second conductive traces, overlying each of the first, second, and fifth S/D regions, and separated from each of the third, fourth, and sixth S/D regions along the second direction; and
a fifth conductive trace positioned between the second and third conductive traces, overlying each of the third, fourth, and sixth S/D regions, and separated from each of the first, second, and fifth S/D regions along the second direction.

17. A method of manufacturing a complementary field effect transistor (CFET) structure, the method comprising:
constructing a vertical stack of first transistor and a second transistor overlying the first transistor, wherein
constructing the first transistor comprises forming a first channel extending in a first direction from a first source/drain (S/D) region to a second S/D region through a gate extending in a second direction perpendicular to the first direction, and
constructing the second transistor comprises forming a second channel extending in the first direction from a third S/D region to a fourth S/D region through the gate;
forming a first via extending from the first S/D region to a first layer and aligned with the third S/D region along the second direction;
forming a second via extending from the fourth S/D region to the first layer, wherein the first via has a first height greater than a second height of the second via; and
forming a first conductive trace in the first layer and electrically connected to each of the first and second vias.

18. The method of claim 17, wherein each of the constructing the first transistor and the constructing the second transistor comprises forming each of the corresponding first and second S/D regions or third and fourth S/D regions as a nanosheet stack.

19. The method of claim 17, wherein
the forming the first conductive trace in the first layer comprises forming a plurality of conductive traces in the first layer, and
the forming the plurality of conductive traces in the first layer comprises:
forming the first conductive trace overlying each of the first and fourth S/D regions and separated from each of the second and third S/D regions along the second direction, and
forming a second conductive trace overlying each of the second and third S/D regions and separated from each of the first and fourth S/D regions along the second direction.

20. The method of claim 19, wherein the forming the plurality of conductive traces further comprises:
forming a third conductive trace between the first and second conductive traces and overlying the gate and each of the first through fourth S/D regions.

* * * * *